(12) United States Patent
Yamazaki et al.

(10) Patent No.: US 9,612,499 B2
(45) Date of Patent: Apr. 4, 2017

(54) LIQUID CRYSTAL DISPLAY DEVICE AND ELECTRONIC DEVICE USING LIQUID CRYSTAL DISPLAY DEVICE

(71) Applicant: Semiconductor Energy Laboratory Co., LTD., Atsugi-shi, Kanagawa-ken (JP)

(72) Inventors: Shunpei Yamazaki, Tokyo (JP); Daisuke Kubota, Kanagawa (JP); Yusuke Kubota, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/072,645

(22) Filed: Mar. 17, 2016

(65) Prior Publication Data

US 2016/0274394 A1    Sep. 22, 2016

(30) Foreign Application Priority Data

Mar. 19, 2015  (JP) .................................. 2015-056766
Mar. 27, 2015  (JP) .................................. 2015-067084

(51) Int. Cl.
*H01L 29/12*   (2006.01)
*G02F 1/1368*  (2006.01)
(Continued)

(52) U.S. Cl.
CPC ...... *G02F 1/1368* (2013.01); *G02F 1/133345* (2013.01); *G02F 1/133514* (2013.01);
(Continued)

(58) Field of Classification Search
CPC . H01L 27/1218; H01L 27/1237; H01L 29/24; H01L 29/4908; H01L 29/513;
(Continued)

(56) References Cited

U.S. PATENT DOCUMENTS 5,725,915 A   3/1998   Ishitaka et al.
5,731,856 A   3/1998   Kim et al.
(Continued)

FOREIGN PATENT DOCUMENTS

EP   1737044 A   12/2006
EP   2226847 A    9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Benjamin Sandvik
*Assistant Examiner* — Herve Assouman
(74) *Attorney, Agent, or Firm* — Nixon Peabody LLP; Jeffrey L. Costellia

(57) ABSTRACT

A liquid crystal display device with an increased pixel aperture ratio is provided. A liquid crystal display device that displays an image with high contrast and high luminance is provided. The liquid crystal display device includes a first pixel electrode; a second pixel electrode; a transistor; a capacitor; a first insulating film; a second insulating film; and a third insulating film. The transistor includes a gate electrode; a gate insulating film; a first oxide semiconductor film; and a source electrode and a drain electrode. One of a pair of electrodes of the capacitor includes a second oxide semiconductor film. The first insulating film is provided over the first oxide semiconductor film. The second insulating film is provided over the second oxide semiconductor film such that the second oxide semiconductor film is sandwiched between the first insulating film and the second insulating film. The third insulating film overlaps with an
(Continued)

end of the first pixel electrode. The second pixel electrode is provided over the third insulating film.

21 Claims, 48 Drawing Sheets

(51) Int. Cl.
| | | |
|---|---|---|
| | *H01L 27/12* | (2006.01) |
| | *H01L 29/04* | (2006.01) |
| | *G02F 1/1343* | (2006.01) |
| | *G02F 1/1333* | (2006.01) |
| | *G02F 1/1362* | (2006.01) |
| | *G02F 1/1335* | (2006.01) |

(52) U.S. Cl.
CPC .. *G02F 1/134309* (2013.01); *G02F 1/136213* (2013.01); *H01L 27/1225* (2013.01); *H01L 27/1229* (2013.01); *H01L 27/1255* (2013.01); *H01L 29/045* (2013.01)

(58) Field of Classification Search
CPC ............ H01L 29/518; H01L 29/78606; H01L 29/7869; H01L 29/66969
See application file for complete search history.

(56) References Cited

U.S. PATENT DOCUMENTS

| | | |
|---|---|---|
| 5,744,864 A | 4/1998 | Cillessen et al. |
| 6,233,033 B1 | 5/2001 | Moore |
| 6,294,274 B1 | 9/2001 | Kawazoe et al. |
| 6,404,472 B1 | 6/2002 | Andreatta et al. |
| 6,563,174 B2 | 5/2003 | Kawasaki et al. |
| 6,727,522 B1 | 4/2004 | Kawasaki et al. |
| 6,839,108 B1 | 1/2005 | Hirakata et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,102,476 B2 | 1/2012 | Son et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0163614 A1 | 11/2002 | Hinata et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0290633 A1* | 12/2006 | Choi ...................... H01L 27/12 345/92 |
| 2006/0292777 A1 | 12/2006 | Dunbar |
| 2007/0013823 A1 | 1/2007 | Jung et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0065603 A1 | 3/2007 | Leu et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0068527 A1 | 3/2008 | Um et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0032435 A1 | 2/2011 | Kimura |
| 2011/0194059 A1* | 8/2011 | Yamazaki ........... G02F 1/13439 349/138 |
| 2012/0001170 A1* | 1/2012 | Yamazaki ........... H01L 27/1225 257/43 |
| 2012/0062811 A1 | 3/2012 | Miyake |
| 2013/0153890 A1* | 6/2013 | Yoneda ............... H01L 27/1225 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 06-160875 | 6/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-180583 A | 9/2011 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications": SID Digest '09 : SID International Symposium Digest of Technical Papers, May 31, 2009, pp. 578-581.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosiphical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission Am-Oled Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

* cited by examiner

FIG. 27A
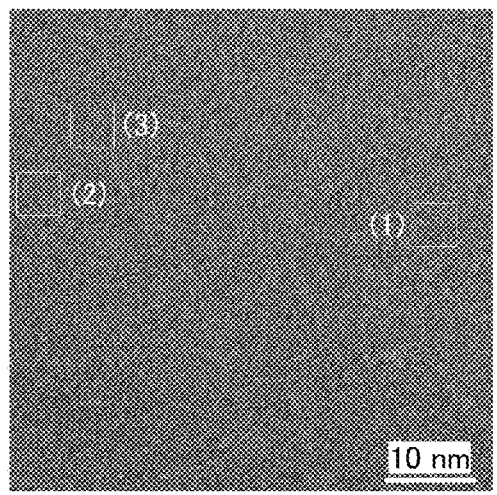
FIG. 27B  FIG. 27C  FIG. 27D
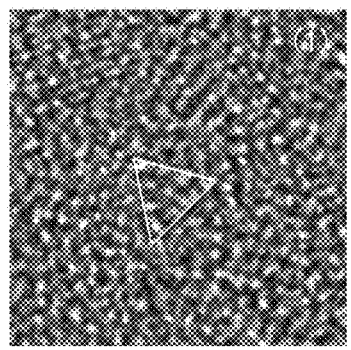 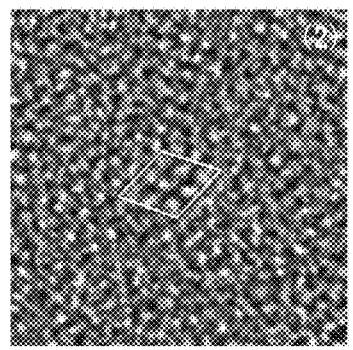 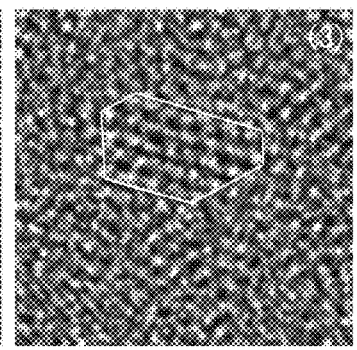

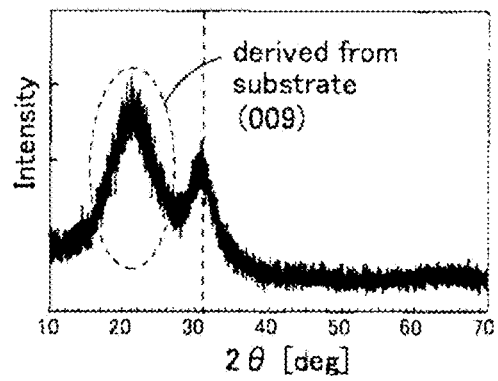
FIG. 28A out-of-plane method CAAC-OS
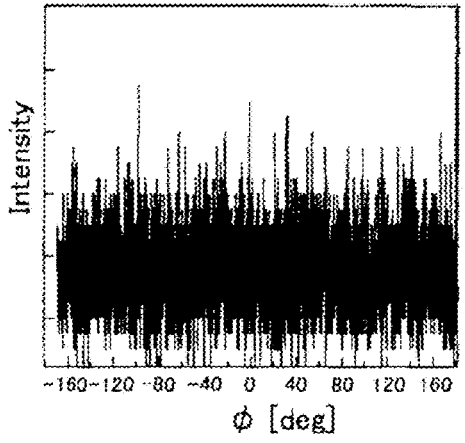
FIG. 28B in-plane method φ scan CAAC-OS
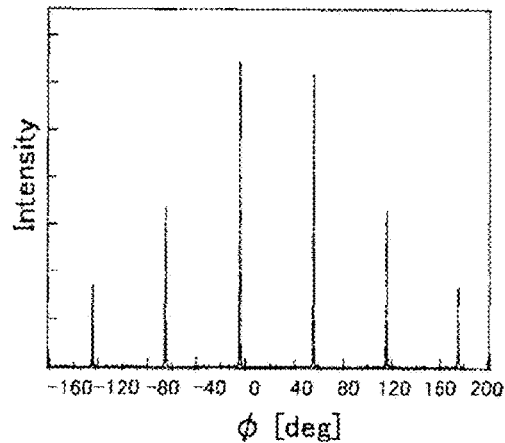
FIG. 28C in-plane method φ scan Single crystal OS FIG. 29A
FIG. 29B
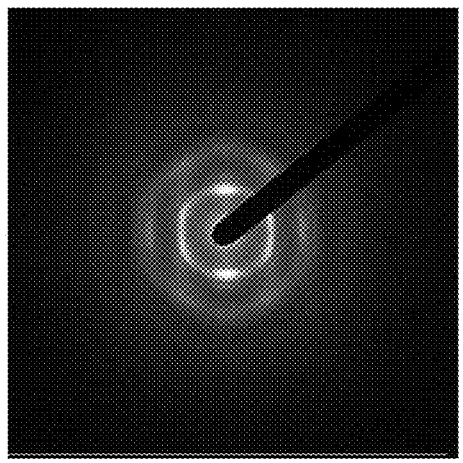
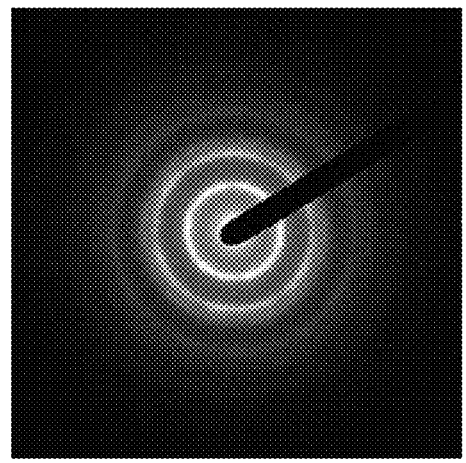

FIG. 32A
Crystal Structure of In$M$ZnO$_4$
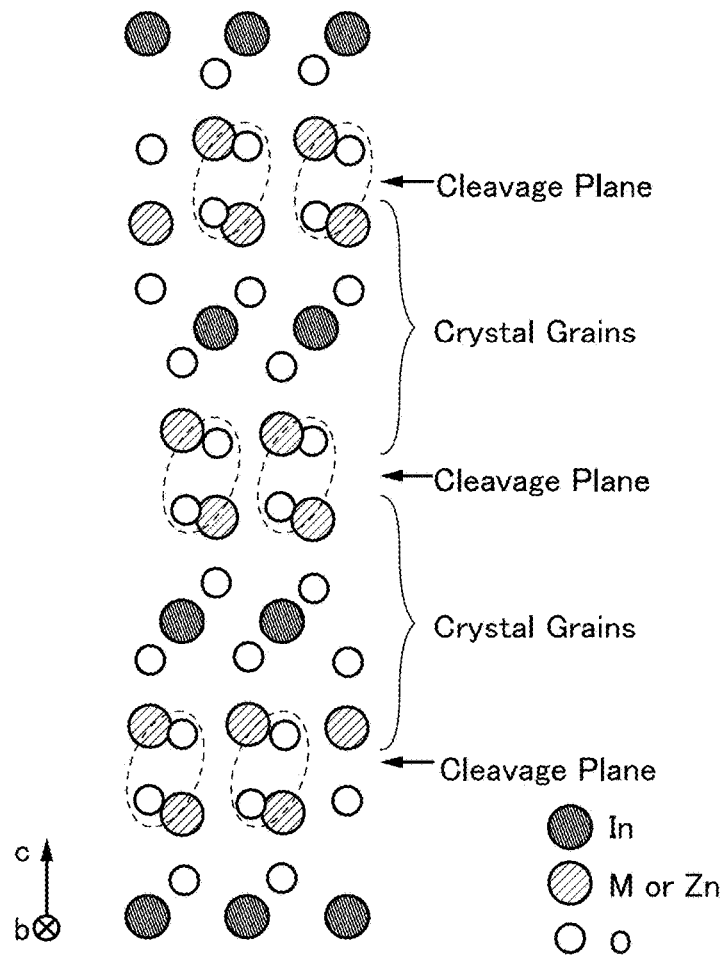
FIG. 32B                    FIG. 32C
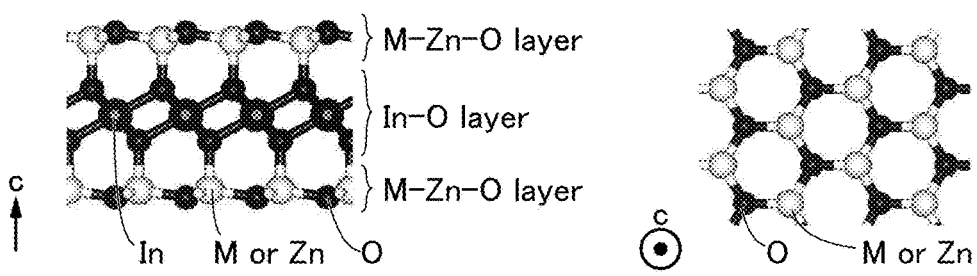

270A

270A

270B

270B

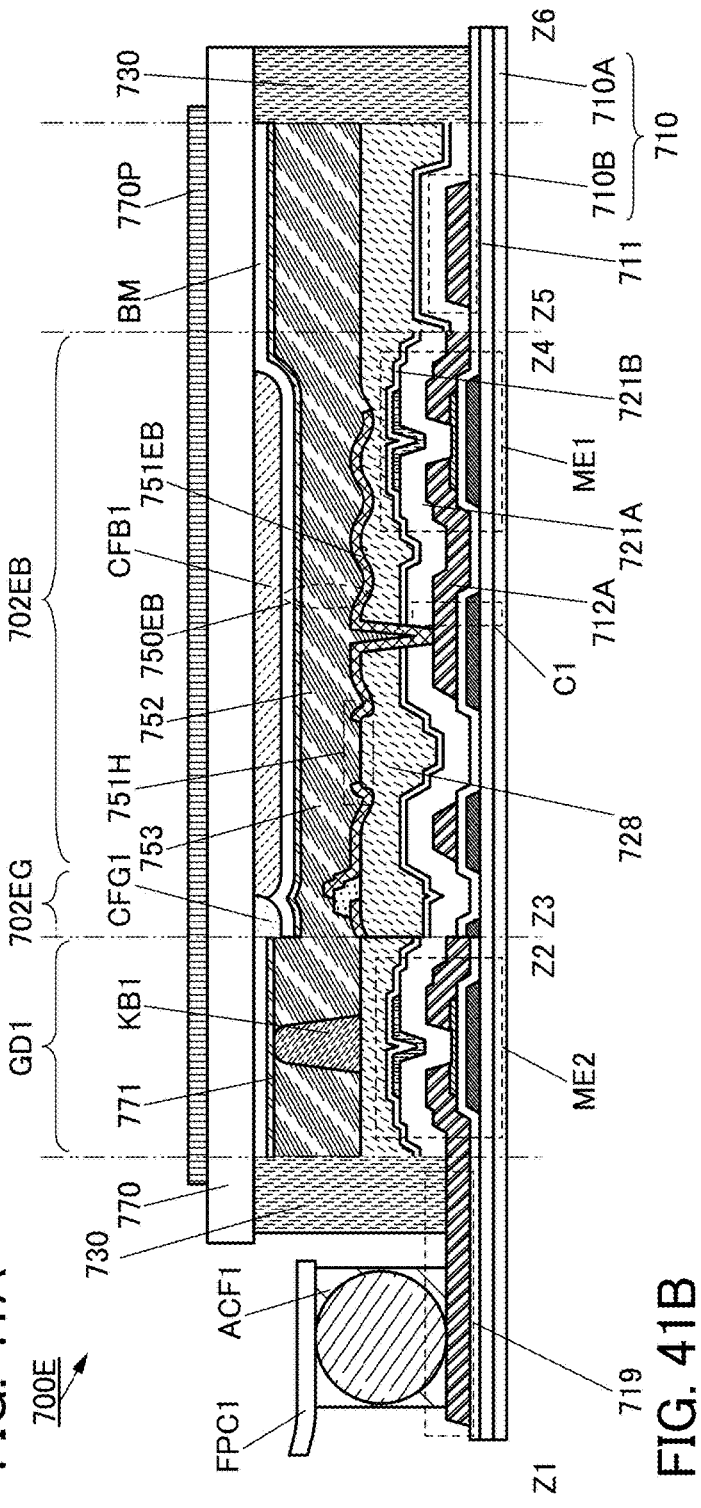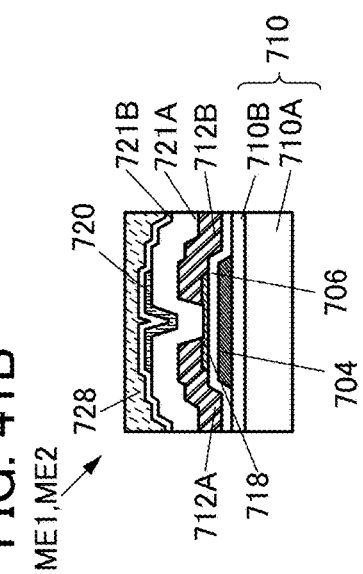

LIQUID CRYSTAL DISPLAY DEVICE AND ELECTRONIC DEVICE USING LIQUID CRYSTAL DISPLAY DEVICE

BACKGROUND OF THE INVENTION

1. Field of the Invention

One embodiment of the present invention relates to a liquid crystal display device or an electronic device using the liquid crystal display device. In particular, one embodiment of the present invention relates to a reflective liquid crystal display device. One embodiment of the present invention relates to an object, a method, or a manufacturing method. One embodiment of the present invention relates to a process, a machine, manufacture, or a composition of matter. One embodiment of the present invention relates to a semiconductor device, a display device, an electronic device, a manufacturing method thereof, or a driving method thereof.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. In addition, such transistors using such silicon semiconductors are used in integrated circuits (ICs) and the like.

In recent years, attention has been drawn to a technique of fabricating transistors in which a metal oxide exhibiting semiconductor characteristics is used instead of a silicon semiconductor. Note that in this specification, such a metal oxide exhibiting semiconductor characteristics is referred to as an oxide semiconductor. For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a liquid crystal display device including a conductive oxide semiconductor film. Another object of one embodiment of the present invention is to provide a liquid crystal display device with an increased pixel aperture ratio. Another object of one embodiment of the present invention is to provide a liquid crystal display device that displays an image with high contrast and high luminance. Another object of one embodiment of the present invention is to provide a novel liquid crystal display device or the like.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a liquid crystal display device including a first pixel electrode; a second pixel electrode; a transistor electrically connected to the first pixel electrode; a capacitor electrically connected to the transistor; a first insulating film; a second insulating film; and a third insulating film. The transistor includes a gate electrode; a gate insulating film provided in contact with the gate electrode; a first oxide semiconductor film that is provided in contact with the gate insulating film and overlaps with the gate electrode; and a source electrode and a drain electrode that are electrically connected to the first oxide semiconductor film. One of a pair of electrodes of the capacitor includes a second oxide semiconductor film. The first insulating film is provided over the first oxide semiconductor film. The second insulating film is provided over the second oxide semiconductor film such that the second oxide semiconductor film is sandwiched between the first insulating film and the second insulating film. The third insulating film overlaps with an end of the first pixel electrode. The second pixel electrode is provided over the third insulating film.

Another embodiment of the present invention is the liquid crystal display device in which an end of the third insulating film and an end of the second pixel electrode are substantially in alignment with each other.

Another embodiment of the present invention is the liquid crystal display device further including a first coloring film and a second coloring film. The first coloring film is provided over the first pixel electrode. The second coloring film is provided over the second pixel electrode.

Another embodiment of the present invention is a liquid crystal display device including a first pixel electrode; a second pixel electrode; a conductive film; a transistor electrically connected to the first pixel electrode; a capacitor electrically connected to the transistor; a first insulating film; a second insulating film; and a third insulating film. The transistor includes a gate electrode; a gate insulating film in contact with the gate electrode; a first oxide semiconductor film that is in contact with the gate insulating film and overlaps with the gate electrode; and a source electrode and a drain electrode that are electrically connected to the first oxide semiconductor film. One of a pair of electrodes of the capacitor includes a second oxide semiconductor film. The first insulating film is provided over the first oxide semiconductor film. The second insulating film is provided over the second oxide semiconductor film such that the second oxide semiconductor film is sandwiched between the first insulating film and the second insulating film. The third insulating film includes a region overlapping with the second pixel electrode and a region overlapping with the conductive film. The conductive film is electrically connected to the first pixel electrode.

Another embodiment of the present invention is the liquid crystal display device in which the third insulating film is positioned over the first pixel electrode and the second pixel electrode, and the conductive film is positioned over the third insulating film.

Another embodiment of the present invention is the liquid crystal display device in which the first pixel electrode and the third insulating film are positioned over the conductive film, and the second pixel electrode is positioned over the third insulating film.

Another embodiment of the present invention is the liquid crystal display device in which the conductive film includes a region overlapping with the second pixel electrode with the third insulating film therebetween.

Another embodiment of the present invention is the liquid crystal display device in which the other of the pair of electrodes of the capacitor includes the first pixel electrode.

Another embodiment of the present invention is the liquid crystal display device in which the transistor includes the first insulating film and the second oxide semiconductor film that overlaps with the first oxide semiconductor film.

In the liquid crystal display device, the first oxide semiconductor film and the second oxide semiconductor film are preferably In-M-Zn oxides (M represents Al, Ti, Ga, Y, Zr, La, Ce, Nd, Sn, or Hf).

In the liquid crystal display device, the first insulating film and the second insulating film preferably contain oxygen and hydrogen, respectively.

Another embodiment of the present invention is an electronic device including the above liquid crystal display device and a switch, a speaker, a display portion, or a housing.

One embodiment of the present invention can provide a liquid crystal display device including a conductive oxide semiconductor film. Alternatively, one embodiment of the present invention can provide a liquid crystal display device with an increased aperture ratio. Alternatively, one embodiment of the present invention can provide a liquid crystal display device that displays an image with high contrast and high luminance. Alternatively, one embodiment of the present invention can provide a novel liquid crystal display device or the like.

Note that the description of these effects does not disturb the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 27A to 27D are Cs-corrected high-resolution TEM images of a plane of a CAAC-OS.

FIGS. 28A to 28C show structural analysis of a CAAC-OS and a single crystal oxide semiconductor by XRD.

FIGS. 29A and 29B show electron diffraction patterns of a CAAC-OS.

FIGS. 32A to 32C illustrate a crystal of $InMZnO_4$.

FIGS. 41A and 41B are cross-sectional views illustrating a cross-sectional structure of a first display portion of a display device.

DETAILED DESCRIPTION OF THE INVENTION

Figure 1A:
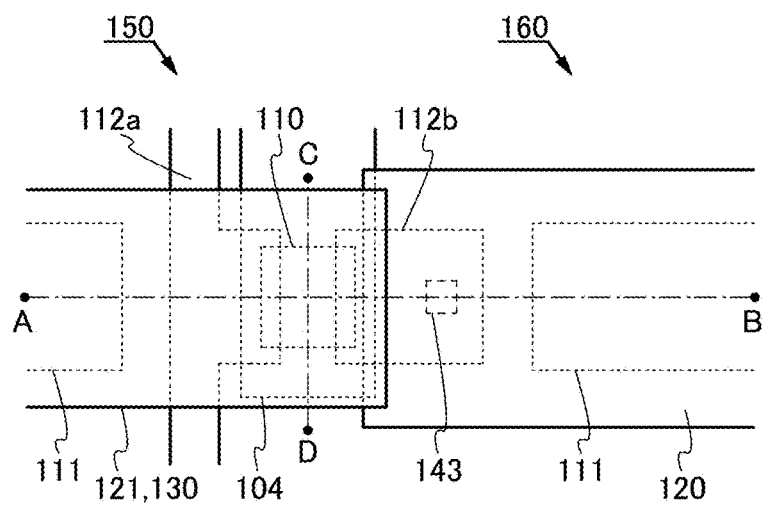
FIGS. 1A and 1B are a top view and a cross-sectional view illustrating one embodiment of a liquid crystal display device.

Embodiments and an example of the present invention will be described below in detail with reference to the drawings. Note that the present invention is not limited to the description below, and it is easily understood by those skilled in the art that various changes and modifications can be made without departing from the spirit and scope of the invention. Therefore, one embodiment of the present invention is not interpreted as being limited to the description of the embodiments and example described below. In addition, in the following embodiments and example, the same portions or portions having similar functions are denoted by the same reference numerals or the same hatching patterns in different drawings, and description thereof will not be repeated.

Note that in each drawing described in this specification, the size, the film thickness, or the region of each component may be exaggerated for clarity. Therefore, embodiments of the present invention are not limited to such a scale.

In this specification and the like, ordinal numbers such as "first" and "second" are used in order to avoid confusion among components, and the terms do not limit the components numerically. Therefore, for example, the term "first" can be replaced with the term "second", "third", or the like as appropriate.

In this specification and the like, the terms "film" and "layer" can be interchanged with each other depending on the case or circumstances. For example, the term "conductive layer" can be changed to the term "conductive film" in some cases. The term "insulating film" can be changed to the term "insulating layer" in some cases.

In this specification and the like, the expression that an end of a layer is "substantially in alignment" with an end of another layer includes the case where the ends of the layers do not completely overlap with each other; for example, an end of an upper layer may be located inward from an end of a lower layer, or may be located so as to extend beyond the end of the lower layer.

In addition, if a "semiconductor" in this specification and the like has a sufficiently low conductivity, for example, the "semiconductor" can have characteristics of an "insulator". A "semiconductor" and an "insulator" cannot be strictly distinguished from each other because the border therebetween is not clear. Thus, a "semiconductor" in this specification and the like can be called an "insulator". Similarly, an "insulator" in this specification and the like can be called a "semiconductor". An "insulator" in this specification and the like can be called a "semi-insulator" in some cases.

In addition, if a "semiconductor" in this specification and the like has a sufficiently high conductivity, for example, the "semiconductor" can have characteristics of a "conductor". A "semiconductor" and a "conductor" cannot be strictly distinguished from each other because the border therebetween is not clear. Thus, a "semiconductor" in this specification and the like can be called a "conductor". Similarly, a "conductor" in this specification and the like can be called a "semiconductor".

Note that functions of a "source" and a "drain" of a transistor can be replaced with each other when a transistor of opposite polarity is used or when the direction of current flow is changed in circuit operation, for example. Therefore, the terms "source" and "drain" can be used to denote the drain and the source, respectively, in this specification.

In this specification and the like, patterning is assumed to be performed by a photolithography process. Note that a photolithography process is not necessarily used for patterning and any of processes other than a photolithography process can be used. In addition, a mask formed in the photolithography process is assumed to be removed after etching treatment.

Note that in this specification and the like, a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively. Furthermore, a silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic % inclusive, 1 atomic % to 20 atomic % inclusive, 25 atomic % to 35 atomic % inclusive, and 0.1 atomic % to 10 atomic % inclusive, respectively.

(Embodiment 1)

In this embodiment, a liquid crystal display device of one embodiment of the present invention will be described with reference to FIGS. 1A and 1B to FIGS. 8A and 8B.

<Structure Example of Liquid Crystal Display Device>

Figure 1B:
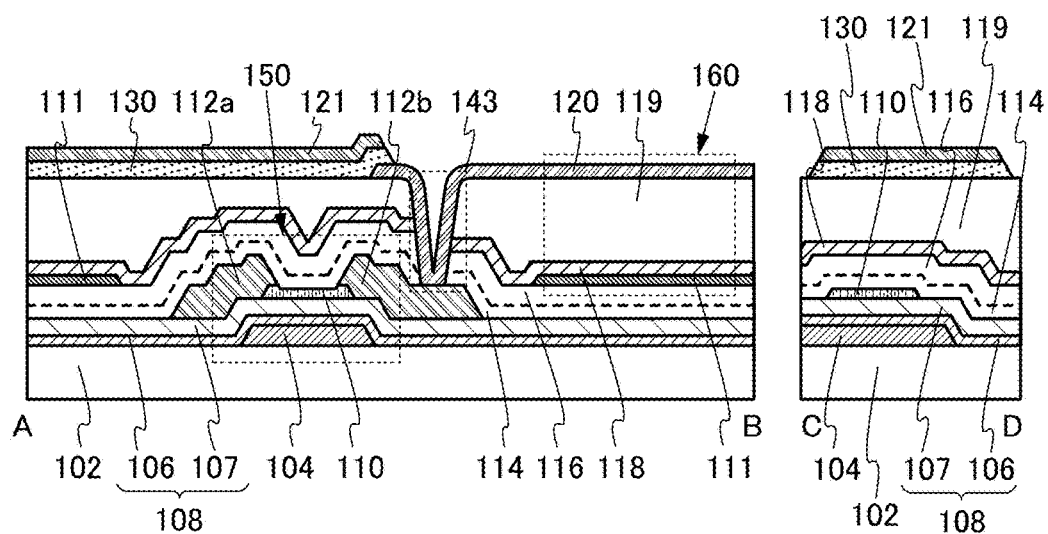

FIG. 1A is a top view of the liquid crystal display device of one embodiment of the present invention. FIG. 1B is a cross-sectional view taken along the dashed-dotted lines A-B and C-D in FIG. 1A. Note that in FIG. 1A, some components of the liquid crystal display device (e.g., a gate insulating film) are not illustrated to avoid complexity. Note that as in FIG. 1A, some components are not illustrated in some cases in top views of transistors described below.

The direction of the dashed-dotted line A-B in FIG. 1A is the channel length direction of a transistor 150. The direction of the dashed-dotted line C-D is the channel width direction of the transistor 150. Note that in this specification, the channel length direction of a transistor means the direction in which carriers move between a source (source region or source electrode) and a drain (drain region or drain electrode). The channel width direction means the direction perpendicular to the channel length direction in a plane parallel to a substrate.

The liquid crystal display device illustrated in FIGS. 1A and 1B includes the transistor 150 including a first oxide semiconductor film 110 and a capacitor 160 including an insulating film between a pair of electrodes. Note that in the capacitor 160, one of the pair of electrodes is a second oxide semiconductor film 111, and the other of the pair of electrodes is a conductive film 120.

The transistor 150 includes a gate electrode 104 over a substrate 102, an insulating film 108 serving as a gate insulating film over the gate electrode 104, the first oxide semiconductor film 110 overlapping with the gate electrode 104 over the insulating film 108, and a source electrode 112a and a drain electrode 112b over the first oxide semiconductor film 110. In other words, the transistor 150 includes the first oxide semiconductor film 110, the insulating film 108 serving as a gate insulating film in contact with the first oxide semiconductor film 110, the gate electrode 104 overlapping with the first oxide semiconductor film 110 and being in contact with the insulating film 108, and the source electrode 112a and the drain electrode 112b electrically connected to the first oxide semiconductor film 110. Note that the transistor 150 shown in FIGS. 1A and 1B has a bottom-gate structure.

In addition, over the transistor 150, specifically, over the first oxide semiconductor film 110, the source electrode 112a, and the drain electrode 112b, insulating films 114, 116, 118, and 119 are formed. The insulating films 114, 116, and 118 function as protective insulating films for the transistor 150. The insulating film 119 functions as a planarization film. In addition, an opening 143 reaching the drain electrode 112b is formed in the insulating films 114, 116, 118, and 119. The conductive film 120 is formed over the insulating film 119 so as to cover the opening 143. That is, the conductive film 120 is electrically connected to the transistor 150. The conductive film 120 functions as a pixel electrode of the liquid crystal display device.

The capacitor 160 includes the second oxide semiconductor film 111 serving as the one of the pair of electrodes over the insulating film 116, the insulating films 118 and 119 serving as dielectric films over the second oxide semiconductor film 111, and the conductive film 120 serving as the other of the pair of electrodes, which overlaps with the second oxide semiconductor film 111, with the insulating films 118 and 119 provided between the conductive film 120 and the second oxide semiconductor film 111. In other words, the conductive film 120 serves as the pixel electrode and the electrode of the capacitor.

The transistor 150, the capacitor 160, and the conductive film 120 in FIGS. 1A and 1B can constitute one pixel of the liquid crystal display device.

An insulating film 130 is provided so as to overlap with an end of the conductive film 120, and the conductive film 121 is provided over the insulating film 130. The conductive film 121 serves as a pixel electrode of a pixel adjacent to the pixel including the transistor 150, for example.

The conductive film 120 and the conductive film 121 are insulated from each other by the insulating film 130 positioned therebetween. Thus, in the top view, a gap does not need to be provided between the conductive films 120 and 121. Such a structure helps increase the aperture ratio of pixels in the liquid crystal display device of one embodiment of the present invention. Furthermore, the increase in the aperture ratio of the pixels enables the reflective liquid crystal display device to display images with high contrast and high luminance.

Since the conductive film 121 is provided over the insulating film 130, the distance between the conductive film 121 and a common electrode (not illustrated) (hereinafter also referred to as the distance between electrodes) can be shorter than the distance between the conductive film 120 and the common electrode. In the liquid crystal display device of one embodiment of the present invention, the pixel electrode, the common electrode, and a layer including liquid crystals (not illustrated) between the pixel electrode and the common electrode constitute a liquid crystal element, and a common potential is supplied to the common electrode in each pixel. In the case where in the liquid crystal display device, the pixel includes a plurality of coloring layers (e.g., red (R), green (G), and blue (B) or R, G, B, and yellow (Y)), the distance between electrodes of a pixel including a coloring layer for a specific color is set to be short (or long) so that the color tone of a display image can be adjusted.

Figure 2A:
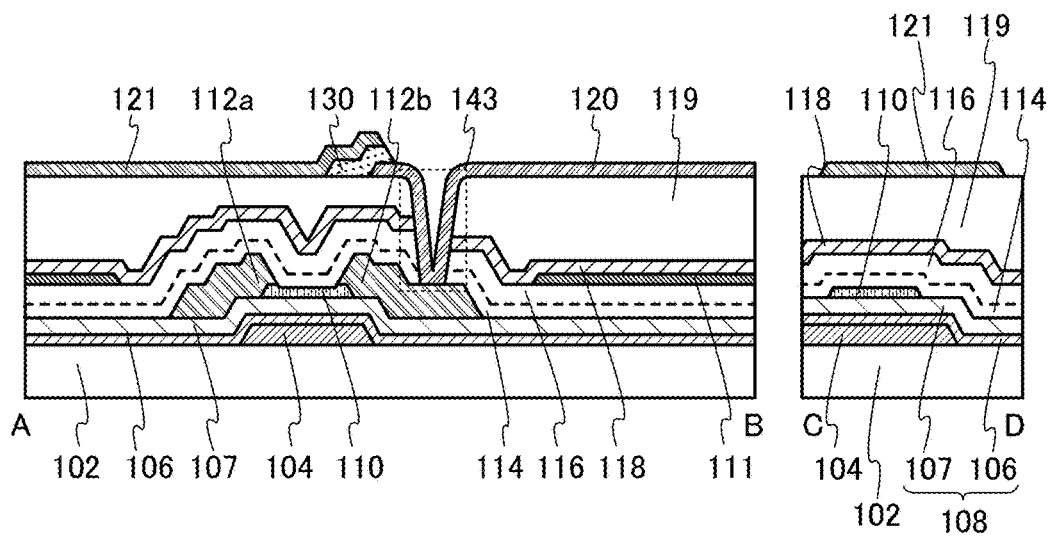
FIGS. 2A and 2B are cross-sectional views each illustrating one embodiment of a liquid crystal display device.

Although the insulating film 130 and the conductive film 121 overlap with each other such that their ends are substantially in alignment with each other in FIG. 1B, one embodiment of the present invention is not limited to this structure. As illustrated in FIG. 2A, the insulating film 130 may be provided only in the vicinity of the end of the conductive film 120 so as to cover the end of the conductive film 120. The liquid crystal display device illustrated in FIGS. 1A and 1B includes a region where the conductive film 120 and the conductive film 121 overlap with each other with the insulating film 130 therebetween; however, the conductive film 120 and the conductive film 121 do not necessarily overlap with each other.

Figure 2B:
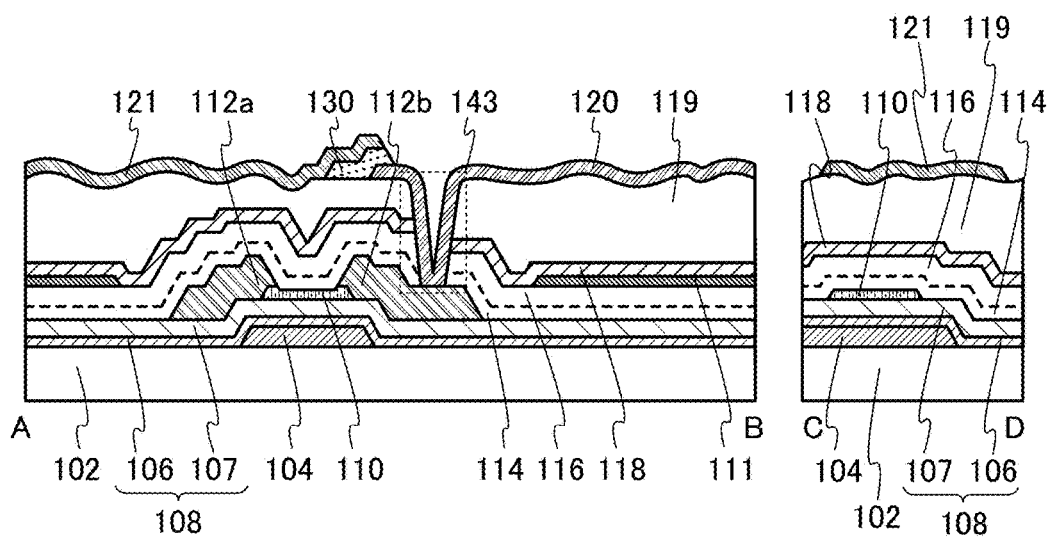

Furthermore, a surface of the insulating film 119 included in the liquid crystal display device of one embodiment of the present invention is preferably provided with projections and depressions. As the projections and depressions on the surface of the insulating film 119, an irregular uneven structure, what is called a texture structure is schematically shown in FIG. 2B. Since the conductive film 120 and the conductive film 121 are provided over the insulating film 119, the surfaces of the conductive film 120 and the conductive film 121 reflect the texture structure of the insulating film 119. Consequently, light incident on these conductive films is diffusely reflected, and the conductive films macroscopically look substantially white. Note that when alignment of liquid crystals is controlled using a pixel electrode that looks white, contrast of the reflective liquid crystal display device can be increased. Note that a surface of the insulating film 130 may be provided with a texture structure.

Figure 3A:
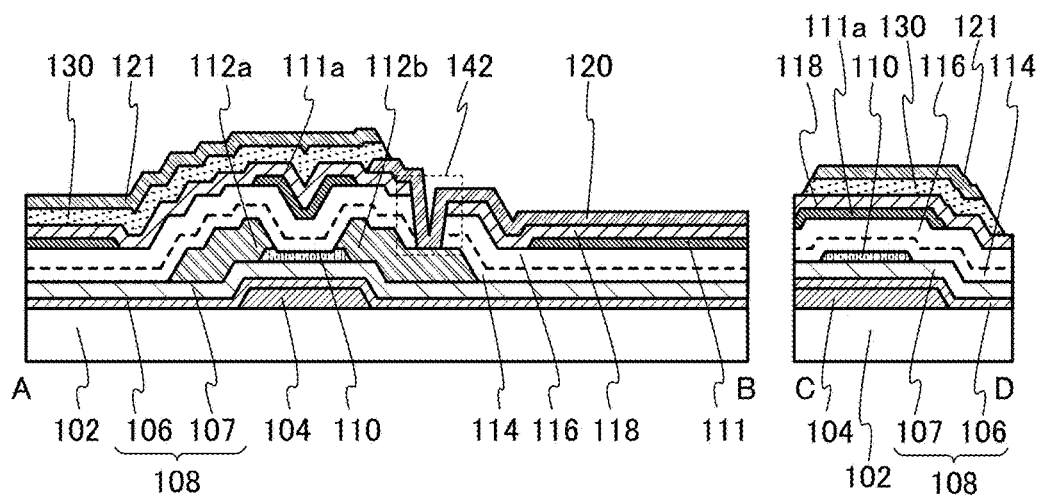
FIGS. 3A and 3B are cross-sectional views each illustrating one embodiment of a liquid crystal display device.

In the liquid crystal display device, the thickness of the insulating film 119 can be appropriately adjusted in accordance with the capacitance of the capacitor 160. Note that the insulating film 119 is not necessarily provided. FIG. 3A is an example of a cross-sectional view illustrating a liquid crystal display device not including the insulating film 119. In FIG. 3A, the insulating film 118 serves as a dielectric film of the capacitor 160.

Note that in the liquid crystal display device in FIG. 3A, a second oxide semiconductor film 111a is provided over the insulating film 116. The second oxide semiconductor film 111a may be formed and etched at the same time as the second oxide semiconductor film 111 so as to overlap with a channel region of the transistor. Since the second oxide semiconductor film 111a is formed and etched at the same time as the second oxide semiconductor film 111 for example, the oxide semiconductor films contain the same material. Thus, an increase in the number of steps in the process can be avoided. Note that one embodiment of the present invention is not limited to this example. The second oxide semiconductor film 111a may be formed through steps different from those of the second oxide semiconductor film 111.

The second oxide semiconductor film 111a includes a region overlapping with the first oxide semiconductor film 110 serving as the channel region of the transistor 150. Thus, the second oxide semiconductor film 111a has a function as a second gate electrode of the transistor 150, and may be connected to the gate electrode 104. Alternatively, the second oxide semiconductor film 111a may have the following structure: the second oxide semiconductor film 111a is not connected to the gate electrode 104 so that signals or potentials different from those supplied to the gate electrode 104 are supplied to the second oxide semiconductor film 111a. The transistor 150 illustrated in FIG. 3A has a double-gate structure. With such a structure, the current drive capability of the transistor 150 can be improved. In that case, the insulating films 114 and 116 serve as gate insulating films for the second gate electrode.

Figure 3B:
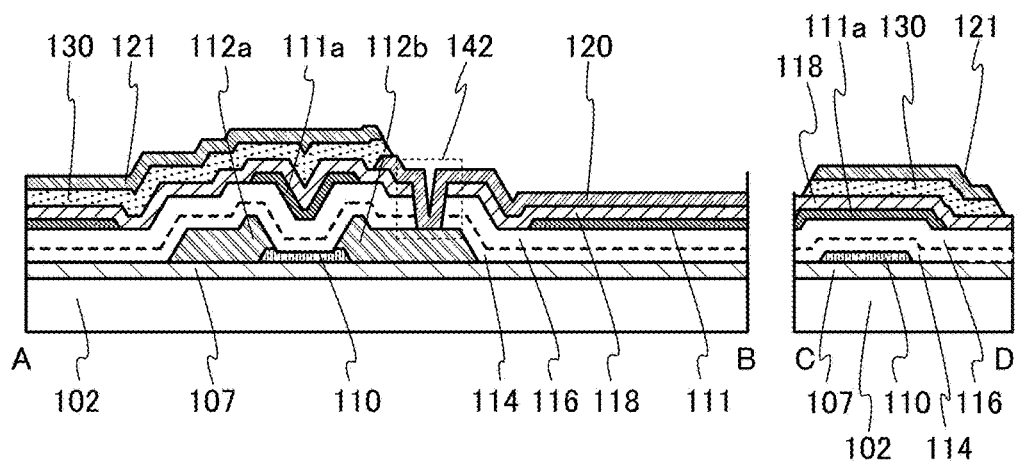

Alternatively, a structure may be employed in which the transistor 150 includes the second oxide semiconductor film 111a and does not include the gate electrode 104. The transistor 150 illustrated in FIG. 3B is different from the transistor 150 in FIG. 3A in not including the gate electrode 104. The transistor illustrated in FIG. 3B has a top-gate structure, and the second oxide semiconductor film 111a serves as a first gate electrode.

Note that the first oxide semiconductor film 110 serves as a channel region of the transistor 150. In addition, the second oxide semiconductor film 111 serves as the one of the pair of electrodes of the capacitor 160. Thus, the second oxide semiconductor film 111 has lower resistivity than the first oxide semiconductor film 110. In addition, the first oxide semiconductor film 110 and the second oxide semiconductor film 111 preferably contain the same metal element. When the first oxide semiconductor film 110 and the second oxide semiconductor film 111 contain the same metal element, a common manufacturing apparatus (e.g., a deposition apparatus or a processing apparatus) can be used and accordingly the manufacturing cost can be reduced.

In addition, the second oxide semiconductor film 111 may be connected to a wiring or the like formed of a metal film or the like. For example, when the liquid crystal display device shown in FIGS. 1A and 1B is used for a transistor and a capacitor in a pixel portion, a lead wiring, a gate wiring, or the like may be formed using the metal film to be connected to the second oxide semiconductor film 111. Since the lead wiring, the gate wiring, or the like is formed using the metal film, the wiring resistance can be reduced and accordingly signal delay or the like can be suppressed.

Note that as the insulating film 118 over the transistor 150 and included in the capacitor 160, an insulating film containing at least hydrogen is used. In addition, as the insulating film 107 included in the transistor 150 and the insulating films 114 and 116 over the transistor 150, insulating films containing at least oxygen are used. In this manner, these insulating films having the above composition are used as the insulating films included in the transistor 150 and the capacitor 160 and provided over the transistor 150 and the capacitor 160, so that the resistivity of the first oxide semiconductor film 110 included in the transistor 150 and the resistivity of the second oxide semiconductor film 111 included in the capacitor 160 can be controlled.

In addition, when the insulating films included in the capacitor 160 and provided over the transistor 150 and the capacitor 160 are provided as follows, the planarity of the conductive film 120 and/or the conductive film 121 can be increased. Specifically, the insulating films 114 and 116 are provided over the first oxide semiconductor film 110, and the insulating film 118 is provided over the second oxide semiconductor film 111 with the second oxide semiconductor film 111 provided between the insulating film 116 and the insulating film 118, whereby the resistivity of the second oxide semiconductor film 111 can be controlled without providing an opening in the insulating films 114 and 116 overlapping with the second oxide semiconductor film 111. With such a structure, the alignment of liquid crystals over the conductive films 120 and 121 in the liquid crystal display device illustrated in FIGS. 1A and 1B can be improved.

Note that the first oxide semiconductor film 110 has higher resistivity than the second oxide semiconductor film 111 because it is used as the channel region in the transistor 150. The second oxide semiconductor film 111 has lower resistivity than the first oxide semiconductor film 110 because it serves as an electrode.

A method for controlling the resistivity of the first oxide semiconductor film 110 and the second oxide semiconductor film 111 will be described below.

<Method for Controlling Resistivity of Oxide Semiconductor Film>

Oxide semiconductor films used as the first oxide semiconductor film 110 and the second oxide semiconductor film 111 are semiconductor materials capable of controlling the resistivity in accordance with oxygen vacancies in the films and/or the concentrations of an impurity such as hydrogen or water in the films. Thus, treatment to be performed on the first oxide semiconductor film 110 and the second oxide semiconductor film 111 is selected from the following to control the resistivity of each of the oxide semiconductor films: treatment for increasing oxygen vacancies and/or impurity concentration and treatment for reducing oxygen vacancies and/or impurity concentration.

Specifically, plasma treatment is performed on the oxide semiconductor film used as the second oxide semiconductor film 111 serving as the electrode of the capacitor 160 to increase oxygen vacancies and/or impurities such as hydrogen or water in the oxide semiconductor film, so that the oxide semiconductor film can have a high carrier density and low resistivity. Alternatively, an insulating film containing hydrogen is formed in contact with the oxide semiconductor film to diffuse hydrogen from the insulating film containing hydrogen, such as the insulating film 118, to the oxide semiconductor film, so that the oxide semiconductor film can have a high carrier density and low resistivity. As described above, the second oxide semiconductor film 111 serves as a semiconductor before the step for increasing oxygen vacancies or diffusing hydrogen in the films, whereas it serves as a conductor after the step.

In contrast, the first oxide semiconductor film 110 serving as a channel region of the transistor 150 is not in contact with the insulating films 106 and 118 containing hydrogen with the insulating film 107, 114, and 116 provided between the first oxide semiconductor film 110 and each of the insulating films 106 and 118. An insulating film containing oxygen, that is, an insulating film for releasing hydrogen is used as at least one of the insulating films 107, 114, and 116, so that oxygen can be supplied to the first oxide semiconductor film 110. The first oxide semiconductor film 110 supplied with oxygen becomes an oxide semiconductor film with high resistivity in which oxygen vacancies in the film or at the interface are filled. Note that as the insulating film for releasing oxygen, a silicon oxide film or a silicon oxynitride film can be used, for example.

To reduce the resistivity of the oxide semiconductor film, an ion implantation method, an ion doping method, a plasma immersion ion implantation method, or the like can be employed to inject hydrogen, boron, phosphorus, or nitrogen into the oxide semiconductor film.

To reduce the resistivity of the oxide semiconductor film, plasma treatment may be performed on the oxide semiconductor film. For the plasma treatment, for example, a gas containing at least one of a rare gas (He, Ne, Ar, Kr, or Xe), hydrogen, and nitrogen is typically used. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

By the plasma treatment, an oxygen vacancy is formed in a lattice from which oxygen is released (or in a portion from which oxygen is released) in the oxide semiconductor film. This oxygen vacancy can cause carrier generation. Furthermore, when hydrogen is supplied from an insulating film that is in the vicinity of the oxide semiconductor film, specifically, that is in contact with the lower surface or the upper surface of the oxide semiconductor film, and hydrogen is combined with the oxygen vacancy, an electron serving as a carrier might be generated.

The oxide semiconductor film in which oxygen vacancy is filled with oxygen and the concentration of hydrogen is reduced can be referred to as a highly purified intrinsic or substantially highly purified intrinsic oxide semiconductor film. The term "substantially intrinsic" refers to a state where an oxide semiconductor has a carrier density lower than $8 \times 10^{11}$ /cm$^3$, preferably lower than $1 \times 10^{11}$ /cm$^3$, more preferably lower than $1 \times 10^{10}$ /cm$^3$. A highly purified intrinsic or substantially highly purified intrinsic oxide semiconductor film has few carrier generation sources, and thus can have a low carrier density. The highly purified intrinsic or substantially highly purified intrinsic oxide semiconductor film has a low density of defect states and accordingly can have a low density of trap states.

Furthermore, the highly purified intrinsic or substantially highly purified intrinsic oxide semiconductor film has an extremely low off-state current; even when an element has a channel width of $1 \times 10^6$ μm and a channel length of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Accordingly, the transistor 150 in which the channel region is formed in the first oxide semiconductor film 110a that is a highly purified intrinsic or substantially highly purified intrinsic oxide semiconductor film, can have small variations in electrical characteristics and high reliability.

For example, an insulating film containing hydrogen, that is, an insulating film for releasing hydrogen, typically, a silicon nitride film, is used as the insulating film 118, whereby hydrogen can be supplied to the second oxide semiconductor film 111. The insulating film for releasing hydrogen preferably contains hydrogen at a concentration of $1 \times 10^{22}$ atoms/cm$^3$ or more. Such an insulating film in contact with the second oxide semiconductor film 111 allows the second oxide semiconductor film 111 to effectively contain hydrogen. In this manner, the resistivity of the oxide semiconductor films can be controlled according to the structures of the insulating films in contact with the first oxide semiconductor film 110 and the second oxide semiconductor film 111. Note that a material similar to that for the insulating film 118 may be used for the insulating film 106. The use of silicon nitride for the insulating film 106 prevents the gate electrode 104 from being supplied with oxygen diffused from the insulating film 107 and being oxidized.

Hydrogen contained in the oxide semiconductor film reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. In some cases, bonding of part of hydrogen to oxygen bonded to a metal atom causes generation of an electron serving as a carrier. Therefore, the second oxide semiconductor film 111 in contact with the insulating film containing hydrogen has a higher carrier density than the first oxide semiconductor film 110.

In the first oxide semiconductor film 110 where the channel region of the transistor 150 is formed, it is preferable to reduce hydrogen as much as possible. Specifically, in the first oxide semiconductor film 110, the hydrogen concentration which is measured by secondary ion mass spectrometry (SIMS) is set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, more preferably lower than $5 \times 10^{18}$ atoms/cm$^3$, more preferably lower than or equal to $1 \times 10^{18}$ atoms/cm$^3$, more preferably lower than or equal to $5 \times 10^{17}$ atoms/cm$^3$, more preferably lower than or equal to $1 \times 10^{16}$ atoms/cm$^3$.

The second oxide semiconductor film 111 that functions as the electrode of the capacitor 160 is an oxide semiconductor film that has a higher hydrogen concentration and/or a larger amount of oxygen vacancies than the first oxide semiconductor film 110. The hydrogen concentration in the second oxide semiconductor film 111 is greater than or equal to $8 \times 10^{19}$ atoms/cm$^3$, preferably greater than or equal to $1 \times 10^{20}$ atoms/cm$^3$, more preferably greater than or equal to $5 \times 10^{20}$ atoms/cm$^3$. The hydrogen concentration in the second oxide semiconductor film 111 is greater than or equal to 2 times, preferably greater than or equal to 10 times the hydrogen concentration in the first oxide semiconductor film 110. The resistivity of the second oxide semiconductor film 111 is preferably greater than or equal to $1 \times 10^{-8}$ times and less than $1 \times 10^{-1}$ times the resistivity of the first oxide semiconductor film 110, typically greater than or equal to $1 \times 10^{-3}$ Ωcm and less than $1 \times 10^4$ Ωm, preferably greater than or equal to $1 \times 10^{-3}$ Ωcm and less than $1 \times 10^{-1}$ Ωcm.

Details of other components included in the liquid crystal display device illustrated in FIGS. 1A and 1B will be described below.

<Substrate>

There is no particular limitation on the property of a material and the like of the substrate 102 as long as the material has heat resistance high enough to withstand at least heat treatment to be performed later. For example, a glass substrate, a ceramic substrate, a quartz substrate, or a sapphire substrate may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 101. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrate 102, and a transistor 150, a capacitor 160, and the like may be formed directly over the flexible substrate.

Other than the above, a transistor can be formed using any of various substrates as the substrate 102. There is no particular limitation on the type of a substrate. Examples of the substrate include a plastic substrate, a metal substrate, a stainless steel substrate, a substrate including stainless steel foil, a tungsten substrate, a substrate including tungsten foil, a flexible substrate, an attachment film, paper including a fibrous material, and a base film. Examples of the glass substrate include a barium borosilicate glass substrate, an aluminoborosilicate glass substrate, and a soda lime glass substrate. Examples of the flexible substrate include a flexible synthetic resin such as plastics typified by polyethylene terephthalate (PET), polyethylene naphthalate (PEN), and polyether sulfone (PES), and acrylic. Examples of the attachment film include polypropylene, polyester, polyvinyl fluoride, and polyvinyl chloride. Examples of the base film include polyamide, polyimide, an inorganic vapor deposition film, and paper. Specifically, the use of semiconductor substrates, single crystal substrates, SOI substrates, or the like enables the manufacture of small-sized transistors with small variations in characteristics, size, shape, or the like and with high current capability. A circuit using such transistors achieves lower power consumption of the circuit or higher integration of the circuit.

Note that a transistor may be formed using one substrate, and then the transistor may be transferred to another substrate. Examples of the substrate to which a transistor is transferred include, in addition to the above substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

<First Oxide Semiconductor Film and Second Oxide Semiconductor Film>

The first oxide semiconductor film 110 and the second oxide semiconductor film 111 preferably include a film represented by an In-M-Zn oxide that contains at least indium (In), zinc (Zn), and M (a metal such as Al, Ti, Ga, Y, Zr, La, Ce, Nd, Sn, or Hf). In order to reduce variations in electrical characteristics of the transistors including the oxide semiconductor, the oxide semiconductor preferably contains a stabilizer in addition to In, Zn and M.

Examples of the stabilizer, including the metals that can be used as M, are gallium (Ga), tin (Sn), hafnium (Hf), aluminum (Al), and zirconium (Zr). Other examples of the stabilizer are lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in the first oxide semiconductor film 110 and the second oxide semiconductor film 111, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

The first oxide semiconductor film 110 and the second oxide semiconductor film 111 may include the same metal element selected from metal elements contained in the above oxides. The use of the same metal element for the first oxide semiconductor film 110 and the second oxide semiconductor film 111 can reduce the manufacturing cost. For example, when metal oxide targets with the same metal composition are used, the manufacturing cost can be reduced, and the same etching gas or the same etchant can be used in processing the first oxide semiconductor film 110 and the second oxide semiconductor film 111. Note that even when the first oxide semiconductor film 110 and the second oxide semiconductor film 111 include the same metal element, they have different compositions in some cases. For example, a metal element in a film is released during the manufacturing process of the transistor and the capacitor, which might result in different metal compositions.

In the case where the first oxide semiconductor film 110 contains an In-M-Zn oxide, the proportions of In and M when the summation of In and M is assumed to be 100 atomic % are preferably as follows: the atomic percentage of In is greater than 25 atomic % and the atomic percentage of M is less than 75 atomic %, or more preferably, the atomic percentage of In is greater than 34 atomic % and the atomic percentage of M is less than 66 atomic %.

The energy gap of the first oxide semiconductor film 110 is 2 eV or more, preferably 2.5 eV or more, more preferably 3 eV or more. With the use of an oxide semiconductor having such a wide energy gap, the off-state current of the transistor 150 can be reduced.

The thickness of the first oxide semiconductor film 110 is greater than or equal to 3 nm and less than or equal to 200 nm, preferably greater than or equal to 3 nm and less than or equal to 100 nm, more preferably greater than or equal to 3 nm and less than or equal to 50 nm.

In the case where the first oxide semiconductor film 110 contains an In-M-Zn oxide (M represents Al, Ga, Y, Zr, La, Ce, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=1:3:4, and In:M:Zn=1:3:6 are given. Note that the atomic ratio of metal elements in the formed first oxide semiconductor film 110 varies from the above atomic ratio of metal elements of the sputtering target within a range of ±40% as an error.

An oxide semiconductor film with a low carrier density is used as the first oxide semiconductor film 110. For example, an oxide semiconductor film whose carrier density is $1\times10^{17}$ /cm$^3$ or lower, preferably $1\times10^{15}$ /cm$^3$ or lower, more preferably $1\times10^{13}$ /cm$^3$ or lower, much more preferably $1\times10^{11}$ /cm$^3$ or lower is used as the first oxide semiconductor film 110.

Note that, without limitation to those described above, a material with an appropriate composition may be used according to required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the first oxide semiconductor film 110 be set to appropriate values.

When silicon or carbon that is one of the elements belonging to Group 14 is contained in the first oxide semiconductor film 110, the amount of oxygen vacancies is increased in the first oxide semiconductor film 110, and the first oxide semiconductor film 110 becomes n-type. Thus, the concentration of silicon or carbon (the concentration is measured by SIMS) in the first oxide semiconductor film 110 is lower than or equal to $2\times10^{18}$ atoms/cm$^3$, preferably lower than or equal to $2\times10^{17}$ atoms/cm$^3$.

The concentration of alkali metal or alkaline earth metal in the first oxide semiconductor film 110, which is measured by SIMS, is set to lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, increasing the off-state current of the transistor. Thus, it is preferred that the concentration of alkali metal or alkaline earth metal in the first oxide semiconductor film 110 be reduced.

In addition, when nitrogen is contained in the first oxide semiconductor film 110, electrons serving as carriers are generated to increase the carrier density, so that the first oxide semiconductor film 110 easily becomes an n-type film. Thus, a transistor including an oxide semiconductor that contains nitrogen is likely to be normally on. For this reason, nitrogen in the oxide semiconductor film is preferably reduced as much as possible. The concentration of nitrogen measured by SIMS is preferably set to, for example, lower than or equal to $5\times10^{18}$ atoms/cm$^3$.

The first oxide semiconductor film 110 may have, for example, a non-single crystal structure. Examples of the non-single crystal structure include a c-axis aligned crystalline oxide semiconductor (CAAC-OS), a polycrystalline structure, a microcrystalline structure, and an amorphous structure. Among the non-single crystal structures, the amorphous structure has the highest density of defect states, whereas CAAC-OS has the lowest density of defect states.

The first oxide semiconductor film 110 may have an amorphous structure, for example. The oxide semiconductor film having the amorphous structure has disordered atomic arrangement and no crystalline component, for example. Alternatively, the oxide film having an amorphous structure has, for example, an absolutely amorphous structure and no crystal part.

Note that the first oxide semiconductor film 110 may be a mixed film including two or more of the following: a region having an amorphous structure, a region having a microcrystalline structure, a region having a polycrystalline structure, a region of CAAC-OS, and a region having a single-crystal structure. The mixed film may have include two or more of a region having an amorphous structure, a region having a microcrystalline structure, a region having a polycrystalline structure, a CAAC-OS region, and a region having a single-crystal structure. The mixed film has a layered structure of two or more of a region having an amorphous structure, a region having a microcrystalline structure, a region having a polycrystalline structure, a CAAC-OS region, and a region having a single-crystal structure in some cases.

<Insulating Film>

As each of the insulating films 106 and 107 functioning as a gate insulating film of the transistor 150, an insulating film including at least one of the following films formed by a plasma chemical vapor deposition (CVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the layered structure of the insulating films 106 and 107 is not necessarily employed, and an insulating film with a single-layer structure selected from the above films may be used.

The insulating film 106 has a function of a blocking film that inhibits penetration of oxygen. For example, in the case where excess oxygen is supplied to the insulating film 107, the insulating film 114, the insulating film 116, and/or the first oxide semiconductor film 110, the insulating film 106 can inhibit penetration of oxygen.

Note that the insulating film 107 that is in contact with the first oxide semiconductor film 110 functioning as a channel region of the transistor 150 is preferably an oxide insulating film and preferably includes a region including oxygen in excess of that in the stoichiometric composition (an oxygen-excess region). In other words, the insulating film 107 is an insulating film which is capable of releasing oxygen. In order to provide the oxygen-excess region in the insulating film 107, the insulating film 107 is formed in an oxygen atmosphere, for example. Alternatively, the oxygen-excess region may be formed by supplying oxygen to the formed insulating film 107. As a method for supplying oxygen, an ion implantation method, an ion doping method, a plasma immersion ion implantation method, plasma treatment, or the like can be employed.

In the case where hafnium oxide is used for the insulating films 106 and 107, the following effect is attained. Hafnium oxide has a higher dielectric constant than silicon oxide and silicon oxynitride. Therefore, the thicknesses of the insulating films 106 and 107 can be made large as compared with the case where silicon oxide is used; as a result, a leakage current due to a tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included as the insulating film 108 serving as the gate insulating film of the transistor 150, the physical thickness of the insulating film can be increased. Therefore, the electrostatic breakdown of the transistor 150 can be prevented by inhibiting a reduction in the withstand voltage of the transistor 150 and improving the withstand voltage of the transistor 150.

<Gate Electrode, Source Electrode, Drain Electrode>

The gate electrode 104 and the source and drain electrodes 112a and 112b can be formed to have a single-layer structure or a layered structure using any of metals such as aluminum, titanium, chromium, nickel, copper, yttrium, zirconium, molybdenum, silver, tantalum, and tungsten, or an alloy containing any of these metals as its main component. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which an aluminum film or a copper film is stacked over a titanium film or a titanium nitride film, and a titanium film or a titanium nitride film is formed thereover; a three-layer structure in which an aluminum film or a copper film is stacked over a molybdenum film or a molybdenum nitride film, and a molybdenum film or a molybdenum nitride film is formed thereover; and the like can be employed. In the case where the source and drain electrodes 112a and 112b have a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. A light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added may be used. The materials that can be used for the gate electrode 104 and the source and drain electrodes 112a and 112b can be formed by, for example, a sputtering method.

<Conductive Film>

The conductive films 120 and 121 serve as pixel electrodes. A material that reflects visible light is used for the conductive film 120, for example. Specifically, a metal material such as aluminum, gold, platinum, silver, nickel, tungsten, chromium, molybdenum, iron, cobalt, copper, or palladium, or an alloy containing any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. The conductive film can be formed to have a single-layer structure or a layered structure using any of the above materials. Moreover, a metal film or a metal oxide film is stacked on an aluminum alloy film, whereby oxidation of the aluminum alloy film can be suppressed. Examples of a material for the metal film or the metal oxide film are titanium and titanium oxide.

<Protective Insulating Film>

As each of the insulating films 114, 116, and 118 functioning as a protective insulating film of the transistor 150, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that the insulating film 114 that is in contact with the first oxide semiconductor film 110 functioning as a channel region of the transistor 150 is an insulating film capable of releasing oxygen, preferably an oxide insulating film. The insulating film capable of releasing oxygen is, in other words, an insulating film including a region including oxygen in excess of that in the stoichiometric composition (an oxygen-excess region). In order to provide the oxygen-excess region in the insulating film 114, the insulating film 114 is formed in an oxygen atmosphere, for example. Alternatively, the oxygen-excess region may be formed by supplying oxygen to the formed insulating film 114. As a method for supplying oxygen, an ion implantation method, an ion doping method, a plasma immersion ion implantation method, plasma treatment, or the like can be employed.

The use of the insulating film capable of releasing oxygen as the insulating film 114 can reduce the amount of oxygen vacancies in the first oxide semiconductor film 110 by transferring oxygen to the first oxide semiconductor film 110 functioning as the channel region of the transistor 150. For example, the amount of oxygen vacancies in the first oxide semiconductor film 110 can be reduced by using an insulating film having the following feature: the number of oxygen molecules released from the insulating film by heat treatment at a temperature higher than or equal to 100° C. and lower than or equal to 700° C., or higher than or equal to 100° C. and lower than or equal to 500° C. is greater than or equal to $1.0 \times 10^{18}$ molecules/cm$^3$ when measured by thermal desorption spectroscopy (hereinafter referred to as TDS).

It is preferable that the number of defects in the insulating film 114 be small, typically the spin density of a signal that appears at g=2.001 due to a dangling bond of silicon, be lower than or equal to $3 \times 10^{17}$ spins/cm$^3$ by ESR measurement. This is because if the density of defects in the insulating film 114 is high, oxygen is bonded to the defects and the amount of oxygen that passes through the insulating film 114 is decreased. Furthermore, it is preferable that the amount of defects at the interface between the insulating film 114 and the first oxide semiconductor film 110 be small and typically, the spin density of a signal that appears at g=1.89 or more and 1.96 or less due to the defect in the first oxide semiconductor film 110 be lower than or equal to $1 \times 10^{17}$ spins/cm$^3$, more preferably lower than or equal to the lower limit of detection by ESR measurement.

Note that all oxygen that enters the insulating film 114 from the outside moves to the outside of the insulating film 114 in some cases. Alternatively, some oxygen that enters the insulating film 114 from the outside remains in the insulating film 114 in some cases. Furthermore, movement of oxygen occurs in the insulating film 114 in some cases in such a manner that oxygen enters the insulating film 114 from the outside and oxygen contained in the insulating film 114 moves to the outside of the insulating film 114. When an oxide insulating film which is permeable to oxygen is formed as the insulating film 114, oxygen released from the insulating film 116 provided over the insulating film 114 can be moved to the first oxide semiconductor film 110 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

Note that a silicon oxynitride film that releases a small amount of nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. The amount of released ammonia corresponds to the released amount caused by heat treatment at a film surface temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The levels are positioned in the energy gap of the first oxide semiconductor film 110. Therefore, when nitrogen oxide is diffused to the interface between the insulating film 114 and the first oxide semiconductor film 110, an electron is trapped by the level on the insulating film 114 side. As a result, the trapped electron remains in the vicinity of the interface between the insulating film 114 and the first oxide semiconductor film 110; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the interface between the insulating film 114 and the first oxide semiconductor film 110.

In a transistor using the oxide insulating film as the insulating film 114, the shift in threshold voltage can be reduced, which leads to a smaller change in electrical characteristics of the transistor.

Note that in an ESR spectrum obtained at 100 K or lower of the insulating film 114, by heat treatment in a manufacturing process of the transistor, typically heat treatment at a temperature lower than 400° C. or lower than 375° C. (preferably higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals, which are obtained by ESR measurement using an X-band, are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is less than $1\times10^{18}$ spins/cm$^3$, typically greater than or equal to $1\times10^{17}$ spins/cm$^3$ and less than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the smaller the sum of the spin densities of the first signal that appears at a g-factor greater than or equal to 2.037 and less than or equal to 2.039, the second signal that appears at a g-factor greater than or equal to 2.001 and less than or equal to 2.003, and the third signal that appears at a g-factor greater than or equal to 1.964 and less than or equal to 1.966 is, the lower the content of nitrogen oxide in the oxide insulating film is.

The nitrogen concentration of the oxide insulating film measured by SIMS is lower than or equal to $6\times10^{20}$ atoms/cm$^3$.

The oxide insulating film is formed by a PECVD method at a substrate temperature higher than or equal to 220° C. and lower than or equal to 350° C. using silane and dinitrogen monoxide, whereby a dense and hard film can be formed.

The insulating film 116 in contact with the insulating film 114 is formed using an oxide insulating film whose oxygen content is in excess of that in the stoichiometric composition. Part of oxygen is released from the oxide insulating film whose oxygen content is in excess of that in the stoichiometric composition by heating. The oxide insulating film whose oxygen content is in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS. Note that the temperature of the film surface in the TDS is preferably higher than or equal to 100° C. and lower than or equal to 700° C., or higher than or equal to 100° C. and lower than or equal to 500° C.

Furthermore, it is preferable that the amount of defects in the insulating film 116 be small, typically the spin density of a signal that appears at g=2.001 due to a dangling bond of silicon, be less than $1.5\times10^{18}$ spins/cm$^3$, preferably less than or equal to $1\times10^{18}$ spins/cm$^3$ by ESR measurement. Note that the insulating film 116 is provided more apart from the first oxide semiconductor film 110 than the insulating film 114 is; thus, the insulating film 116 may have higher defect density than the insulating film 114.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

The insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, one embodiment of the present invention is not limited to this. For example, a single-layer structure of the insulating film 114, a single-layer structure of the insulating film 116, or a layered structure of three or more layers may be used.

The insulating film 118 functioning as a dielectric film of the capacitor 160 is preferably a nitride insulating film. The relative dielectric constant of a silicon nitride film is higher than that of a silicon oxide film, and the silicon nitride film needs to have a larger film thickness than the silicon oxide film to obtain a capacitance equivalent to that of the silicon oxide film. Thus, when the silicon nitride film is included as the insulating film 118 functioning as the dielectric film of the capacitor 160, the physical thickness of the insulating film can be increased. Accordingly, a reduction in the withstand voltage of the capacitor 160 can be inhibited. Furthermore, the electrostatic breakdown of the capacitor 160 can be prevented by improving the withstand voltage. Note that the insulating film 118 also has a function of decreasing the resistivity of the second oxide semiconductor film 111 that functions as the electrode of the capacitor 160.

The insulating film 118 has a function of blocking oxygen, hydrogen, water, an alkali metal, an alkaline earth metal, or the like. By providing the insulating film 118, it is possible to prevent outward diffusion of oxygen from the first oxide semiconductor film 110, outward diffusion of oxygen contained in the insulating films 114 and 116, and entry of hydrogen, water, or the like into the first oxide semiconductor film 110 from the outside. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The planarization insulating film 119 having a function as a planarization film can be formed using a heat-resistant organic material such as a polyimide resin, an acrylic resin, a polyimide amide resin, a benzocyclobutene resin, a polyamide resin, or an epoxy resin, for example.

The insulating film 130 can be formed using a material similar to that for the insulating film 119. Alternatively, the insulating film 130 may be formed using a material similar to that for the insulating film 106.

<Method for Manufacturing Display Device>

Next, an example of a method for manufacturing the liquid crystal display device illustrated in FIGS. 1A and 1B will be described with reference to FIGS. 4A to 4D to FIGS. 8A and 8B.

First, the gate electrode 104 is formed over the substrate 102. After that, the insulating film 108 including the insulating films 106 and 107 is formed over the substrate 102 and the gate electrode 104 (see FIG. 4A).

Note that the substrate 102, the gate electrode 104, and the insulating films 106 and 107 can be selected from the materials which are described above. In this embodiment, a glass substrate is used as the substrate 102; a tungsten film is used as a conductive film for the gate electrode 104; a silicon nitride film capable of releasing hydrogen is used as the insulating film 106; and a silicon oxynitride film capable of releasing oxygen is used as the insulating film 107.

To form the gate electrode 104, a conductive film is formed over the substrate 102, is patterned so that a desired region thereof remains, and unnecessary regions are etched.

Figure 4A:
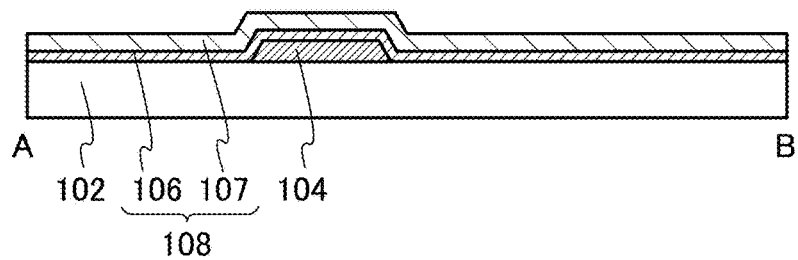
FIGS. 4A to 4D are cross-sectional views illustrating one embodiment of a method for manufacturing a liquid crystal display device.
Figure 4B:
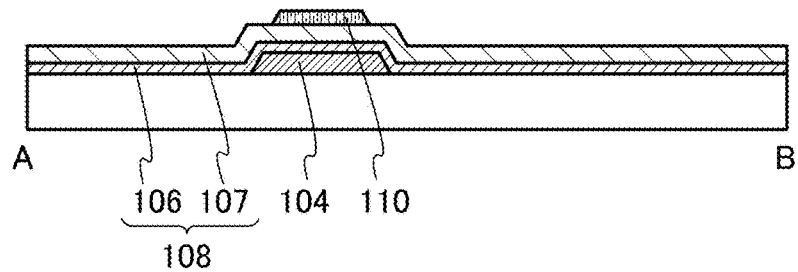

Next, the first oxide semiconductor film 110 is formed over the insulating film 108 so as to overlap with the gate electrode 104 (see FIG. 4B).

The first oxide semiconductor film 110 can be formed using any of the materials described above. In this embodiment, as the first oxide semiconductor film 110, an In—Ga—Zn oxide film formed using a metal oxide target with In:Ga:Zn=1:1:1.2 is used.

The first oxide semiconductor film 110 can be formed in such a manner that an oxide semiconductor film is formed over the insulating film 108, the oxide semiconductor film is patterned so that a desired region thereof remains, and then unnecessary regions are etched.

After formation of the first oxide semiconductor film 110, heat treatment is preferably performed. The heat treatment is preferably performed at a temperature of higher than or equal to 250° C. and lower than or equal to 650° C., preferably higher than or equal to 300° C. and lower than or equal to 500° C., more preferably higher than or equal to 350° C. and lower than or equal to 450° C., in an inert gas atmosphere, an atmosphere containing an oxidizing gas at 10 ppm or more, or a reduced pressure atmosphere. Alternatively, the heat treatment may be performed first in an inert gas atmosphere, and then another heat treatment may be performed in an atmosphere containing an oxidizing gas at 10 ppm or more in order to compensate oxygen released from the first oxide semiconductor film 110. By this heat treatment, impurities such as hydrogen and water can be removed from at least one of the insulating film 106, the insulating film 107, and the first oxide semiconductor film 110. Note that the above-described heat treatment may be performed before the first oxide semiconductor film 110 is processed into an island shape.

Note that stable electrical characteristics can be effectively imparted to the transistor 150 in which the first oxide semiconductor film 110 serves as a channel region by reducing the concentration of impurities in the first oxide semiconductor film 110 to make the first oxide semiconductor film 110 intrinsic or substantially intrinsic.

Figure 4C:
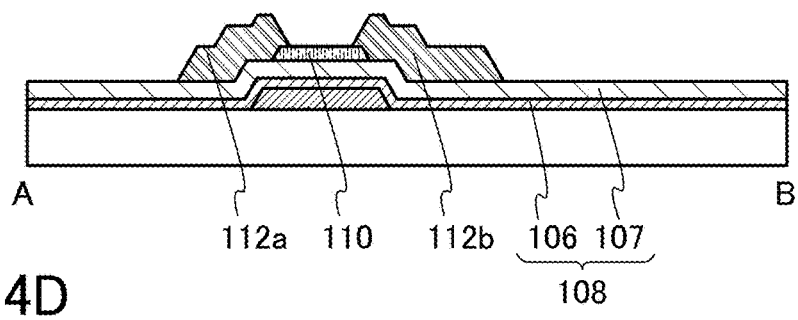
Figure 4D:
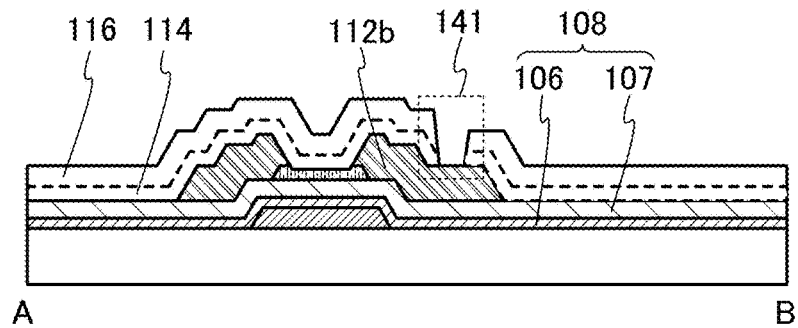

Next, a conductive film is formed over the insulating film 108 and the first oxide semiconductor film 110 and is patterned so that a desired region thereof remains and unnecessary regions are etched, whereby the source electrode 112a and the drain electrode 112b are formed over the insulating film 108 and the first oxide semiconductor film 110 (see FIG. 4C).

The source electrode 112a and the drain electrode 112b can be formed using a material selected from the above-described materials. Note that in this embodiment, a three-layer structure of a tungsten film, an aluminum film, and a titanium film can be used for the source electrode 112a and the drain electrode 112b.

After the source electrode 112a and the drain electrode 112b are formed, a surface of the first oxide semiconductor film 110 may be cleaned. The cleaning may be performed, for example, using a chemical solution such as a phosphoric acid. The cleaning using a chemical solution such as a phosphoric acid can remove impurities (e.g., elements contained in the source electrode 112a and the drain electrode 112b) attached to the surface of the first oxide semiconductor film 110. Note that the cleaning is not necessarily performed, and thus the cleaning may be unnecessary.

In addition, in the step of forming the source electrode 112a and the drain electrode 112b and/or the cleaning step, the thickness of a region of the first oxide semiconductor film 110 which is not covered by the source electrode 112a and the drain electrode 112b might be reduced.

Next, the insulating films 114 and 116 are formed over the insulating film 108, the first oxide semiconductor film 110, the source electrode 112a, and the drain electrode 112b. Then, the insulating films 114 and 116 are patterned so that a desired region thereof remains and unnecessary regions are etched, whereby an opening 141 is formed (see FIG. 4D).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the first oxide semiconductor film 110; accordingly, the amount of oxygen vacancies in the first oxide semiconductor film 110 can be reduced.

Note that the insulating film 114 functions as a protective film for the first oxide semiconductor film 110 in the step of forming the insulating film 116. Consequently, the insulating film 116 can be formed using the high-frequency power having a high power density while damage to the first oxide semiconductor film 110 is reduced.

The insulating films 114 and 116 can be formed using any of the materials described above. In this embodiment, a silicon oxynitride film capable of releasing oxygen is used as the insulating films 114 and 116.

Heat treatment (hereinafter referred to as first heat treatment) is preferably performed after the insulating films 114 and 116 are formed. The first heat treatment can reduce nitrogen oxide included in the insulating films 114 and 116. By the first heat treatment, part of oxygen included in the insulating films 114 and 116 can be moved to the first oxide semiconductor film 110, so that the amount of oxygen vacancies included in the first oxide semiconductor film 110 can be reduced.

The temperature of the first heat treatment is typically lower than 400° C., preferably lower than 375° C., more preferably higher than or equal to 150° C. and lower than or equal to 350° C. The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably contain none of hydrogen, water, and the like. An electric furnace, a rapid thermal annealing (RTA) apparatus, or the like can be used for the heat treatment.

The opening 141 is formed to expose part of the drain electrode 112b. The opening 141 can be formed by a dry etching method, for example. Alternatively, a wet etching method or a combination of a dry etching method and a wet etching method can be employed for formation of the opening 141. Note that the etching step for forming the opening 141 reduces the thickness of the drain electrode 112b in some cases.

Figure 5A:
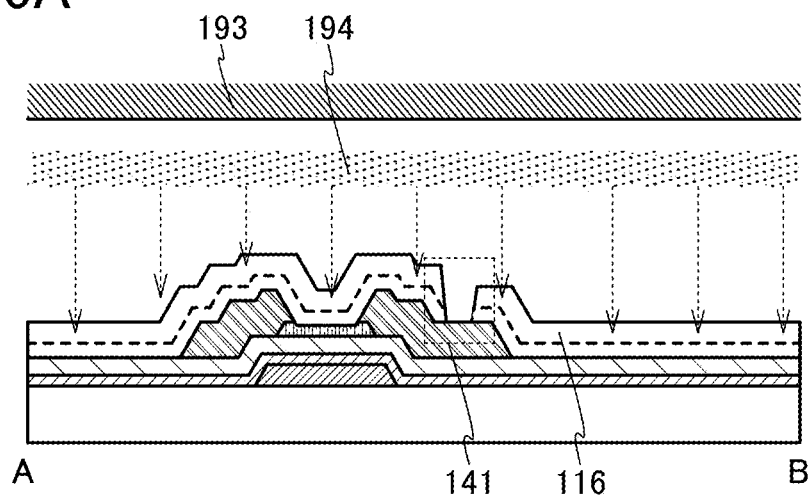
FIGS. 5A to 5C are cross-sectional views illustrating one embodiment of a method for manufacturing a liquid crystal display device.
Figure 5B:
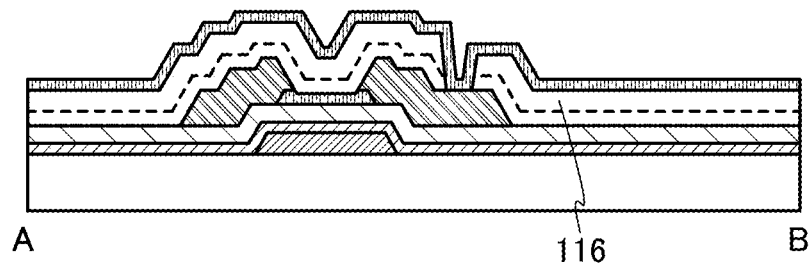

Next, an oxide semiconductor film to be the second oxide semiconductor film 111 is formed over the insulating film 116 to cover the opening 141 (see FIGS. 5A and 5B).

Note that FIG. 5A is a schematic cross-sectional view of the inside of a deposition apparatus when the oxide semiconductor film is formed over the insulating film 116. In FIG. 5A, a sputtering apparatus is used as the deposition apparatus, and a target 193 placed inside the sputtering apparatus and plasma 194 formed under the target 193 are schematically shown.

When the oxide semiconductor film is formed, plasma discharge is performed in an atmosphere containing an oxygen gas. At this time, oxygen is added to the insulating film 116 over which the oxide semiconductor film is to be formed. When the oxide semiconductor film is formed, an inert gas (e.g., a helium gas, an argon gas, or a xenon gas) and the oxygen gas may be mixed. For example, it is preferable to use the argon gas and the oxygen gas with the flow rate higher than the flow rate of the argon gas. When the flow rate of the oxygen gas is set higher, oxygen can be favorably added to the insulating film 116. As an example of the formation conditions of the oxide semiconductor film, the proportion of the oxygen gas in a whole deposition gas is higher than or equal to 50% and lower than or equal to 100%, preferably higher than or equal to 80% and lower than or equal to 100%.

In FIG. 5A, oxygen or excess oxygen added to the insulating film 116 is schematically shown by arrows of broken lines.

The oxide semiconductor film is formed at a substrate temperature higher than or equal to room temperature and lower than 340° C., preferably higher than or equal to room temperature and lower than or equal to 300° C., more preferably higher than or equal to 100° C. and lower than or equal to 250° C., still more preferably higher than or equal to 100° C. and lower than or equal to 200° C. The oxide semiconductor film is formed while being heated, so that the crystallinity of the oxide semiconductor film can be increased. On the other hand, in the case where a large-sized glass substrate (e.g., the 6th generation to the 10th generation) is used as the substrate 102 and the oxide semiconductor film is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film at a substrate temperature higher than or equal to 100° C. and lower than 150° C.

The oxide semiconductor film can be formed using any of the materials described above. In this embodiment, the oxide semiconductor film is formed by a sputtering method using an In—Ga—Zn metal oxide target (with an atomic ratio of In:Ga:Zn=1:3:6).

Figure 5C:
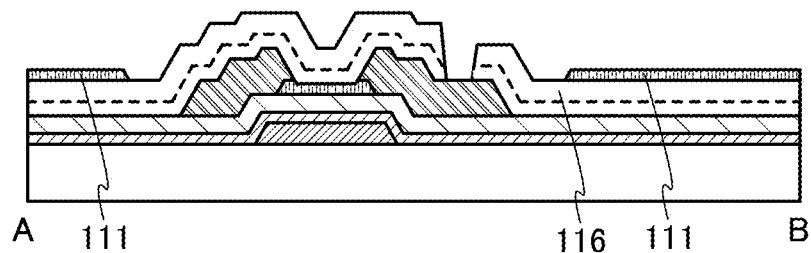

Next, the oxide semiconductor film is processed into a desired shape to form the island-shaped second oxide semiconductor film 111 (see FIG. 5C).

The second oxide semiconductor film 111 can be formed in such a manner that an oxide semiconductor film is formed over the insulating film 116, the oxide semiconductor film is patterned so that a desired region thereof remains, and then unnecessary regions are etched.

Figure 6A:
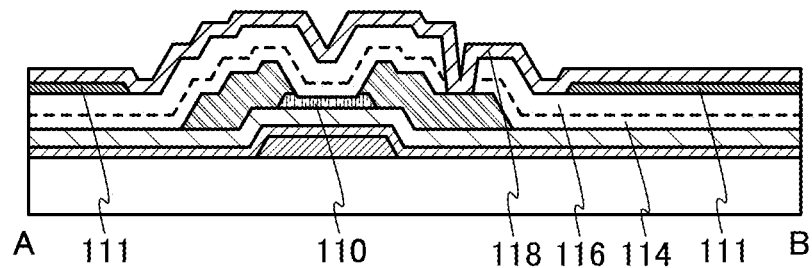
FIGS. 6A to 6C are cross-sectional views illustrating one embodiment of a method for manufacturing a liquid crystal display device.

Next, the insulating film 118 is formed over the insulating film 116 and the second oxide semiconductor film 111 (see FIG. 6A).

The insulating film 118 includes one or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., more preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the first oxide semiconductor film 110.

After the insulating film 118 is formed, heat treatment similar to the first heat treatment (hereinafter referred to as second heat treatment) may be performed. Through such heat treatment at lower than 400° C., preferably lower than 375° C., more preferably higher than or equal to 180° C. and lower than or equal to 350° C. after the addition of oxygen to the insulating film 116 when the oxide semiconductor film to be the second oxide semiconductor film 111 is formed, oxygen or excess oxygen in the insulating film 116 can be moved into the first oxide semiconductor film 110 to compensate oxygen vacancies in the first oxide semiconductor film 110.

Figure 7A:
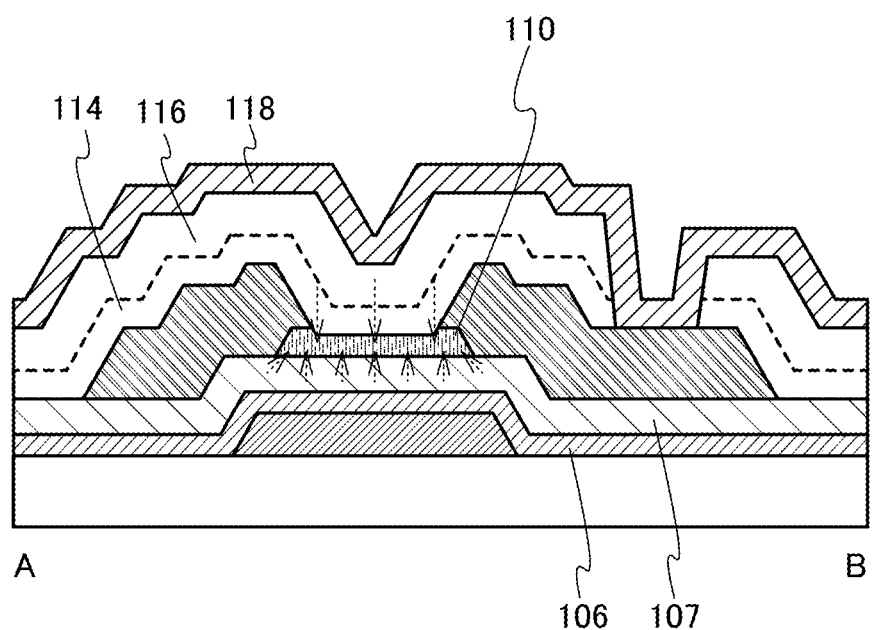
FIGS. 7A and 7B are cross-sectional views illustrating one embodiment of a method for manufacturing a liquid crystal display device.
Figure 7B:
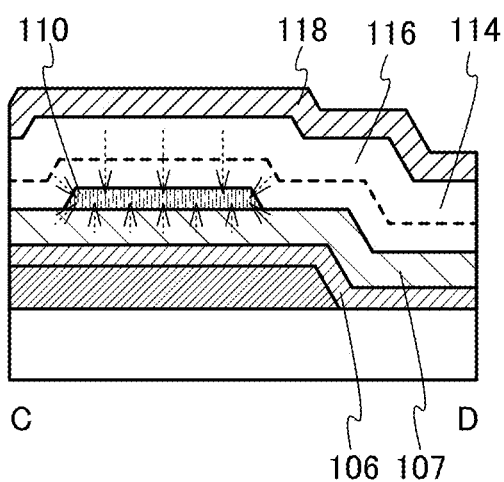

Oxygen moved to the first oxide semiconductor film 110 will be described with reference to FIGS. 7A and 7B. FIGS. 7A and 7B are model diagrams illustrating oxygen moved to the first oxide semiconductor film 110 due to the substrate temperature at the time of forming the insulating film 118 (typically, lower than 375° C.) or the second heat treatment after the formation of the insulating film 118 (typically, lower than 375° C.). In FIGS. 7A and 7B, oxygen (oxygen radicals, oxygen atoms, or oxygen molecules) in the first oxide semiconductor film 110 are shown by arrows of broken lines. Note that FIGS. 7A and 7B are cross-sectional views respectively taken along the dashed-dotted lines A-B and C-D in FIG. 1A, showing the state after the insulating film 118 is formed.

In the first oxide semiconductor film 110 in FIGS. 7A and 7B, oxygen vacancies are compensated with oxygen moved from films in contact with the first oxide semiconductor film 110 (here, the insulating film 107 and the insulating film 114). Specifically, in the liquid crystal display device of one embodiment of the present invention, the insulating film 107 includes an excess oxygen region because an oxygen gas is used at the time of forming the oxide semiconductor film to be the first oxide semiconductor film 110 by sputtering and oxygen is added to the insulating film 107. Furthermore, the insulating film 116 includes an excess oxygen region because an oxygen gas is used at the time of forming the oxide semiconductor film to be the second oxide semiconductor film 111 by sputtering and oxygen is added to the insulating film 116. In the first oxide semiconductor film 110 between the insulating films including the excess oxygen regions, oxygen vacancies can be favorably compensated.

Furthermore, the insulating film 106 is provided under the insulating film 107, and the insulating film 118 is provided over the insulating films 114 and 116. When the insulating films 106 and 118 are formed using a material having low oxygen permeability, e.g., silicon nitride, oxygen contained in the insulating films 107, 114, and 116 can be confined to the first oxide semiconductor film 110 side; thus, oxygen can be favorably moved to the first oxide semiconductor film 110. Note that the insulating film 118 also has an advantageous effect of preventing an external impurity such as water, an alkali metal, or an alkaline earth metal, from diffusing into the first oxide semiconductor film 110 included in the transistor 150.

The insulating film 118 contains one or both of hydrogen and nitrogen. Thus, one or both of hydrogen and nitrogen is added to the second oxide semiconductor film 111 in contact with the formed insulating film 118, so that the carrier density of the second oxide semiconductor film 111 is increased and the second oxide semiconductor film 111 can function as an oxide conductive film.

Note that since the resistivity of the second oxide semiconductor film 111 is decreased, the second oxide semiconductor film 111 in FIG. 6A is indicated by a different hatching pattern from that in FIG. 5C.

The resistivity of the second oxide semiconductor film 111 is lower than at least the resistivity of the first oxide semiconductor film 110 and is preferably higher than or equal to $1 \times 10^{-3}$ Ωcm and lower than $1 \times 10^{4}$ Ωm, more preferably higher than or equal to $1 \times 10^{-3}$ Ωcm and lower than $1 \times 10^{-1}$ Ωcm.

Figure 6B:
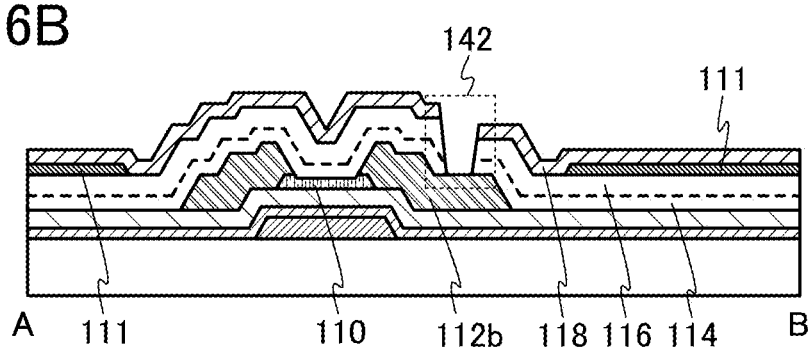
Figure 6C:
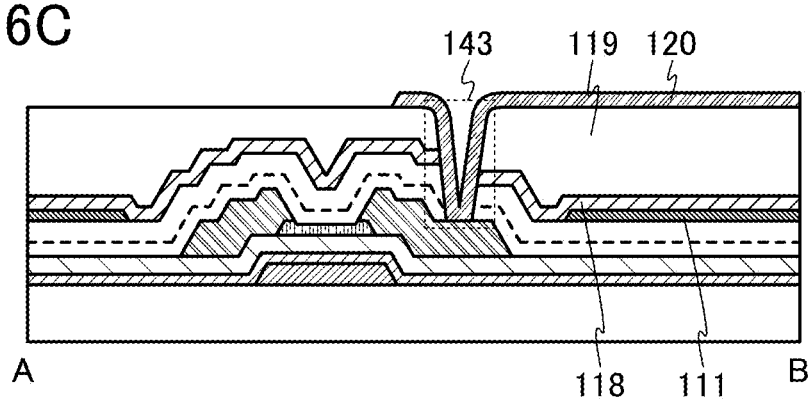

Then, the opening 142 is formed as follows: the insulating film 118 is patterned so that a desired region thereof remains and unnecessary regions are etched (see FIG. 6B).

The opening 142 is formed to expose part of the drain electrode 112b. The opening 142 can be formed by a dry etching method, for example. Alternatively, a wet etching method or a combination of a dry etching method and a wet etching method can be employed for formation of the opening 142. Note that the etching step for forming the opening 142 reduces the thickness of the drain electrode 112b in some cases.

Note that the opening may be formed in the insulating films 114, 116, and 118 at one time in the step of forming the opening 142 without performing the step of forming the opening 141. In that case, the number of steps of manufacturing the liquid crystal display device of one embodiment of the present invention can be reduced, resulting in a reduction in the manufacturing cost.

Next, the insulating film 119 is formed over the insulating film 118 and patterned such that a desired region of the insulating film 119 is left, and then, an unnecessary region is etched to form an opening 143. After that, a conductive film is formed over the insulating film 119 so as to cover the opening 143 and patterned such that a desired region of the conductive film is left, and then, an unnecessary region is etched to form the conductive film 120 (see FIG. 6C).

Note that the opening may be formed in the insulating films 114, 116, 118, and 119 at one time in the step of forming the opening 143 without performing the step of forming the openings 141 and 142. In that case, the number of steps of manufacturing the liquid crystal display device of one embodiment of the present invention can be reduced, resulting in a reduction in the manufacturing cost.

The insulating films 119 and 120 can be formed using any of the materials described above. In this embodiment, an acrylic resin is used for the insulating film 119, and an Ag—Pd—Cu alloy is used for the conductive film 120.

The capacitor 160 is formed at the same time as the conductive film 120 is formed. The capacitor 160 includes a dielectric layer between a pair of electrodes. One of the pair of electrodes corresponds to the second oxide semiconductor film 111, and the other electrode corresponds to the conductive film 120. In addition, the insulating films 118 and 119 serve as dielectric layers of the capacitor 160.

Figure 8A:
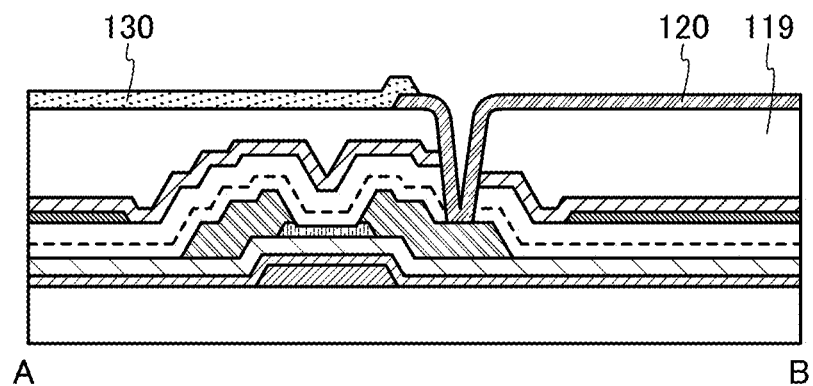
FIGS. 8A and 8B are cross-sectional views illustrating one embodiment of a method for manufacturing a liquid crystal display device.

Next, an insulating film is formed over the insulating film 119 and the conductive film 120 and patterned such that a desired region of the insulating film is left, and then, an unnecessary region is etched to form the insulating film 130 (see FIG. 8A). The insulating film 130 is provided so as to cover an end of the conductive film 120. Although not illustrated, an opening for electrically connecting the conductive film 121 to the transistor in a pixel adjacent to the pixel including the transistor 150 is formed in the insulating film 130.

The insulating film 130 can be formed using any of the materials described above. In this embodiment, an acrylic resin is used for the insulating film 130.

Figure 8B:
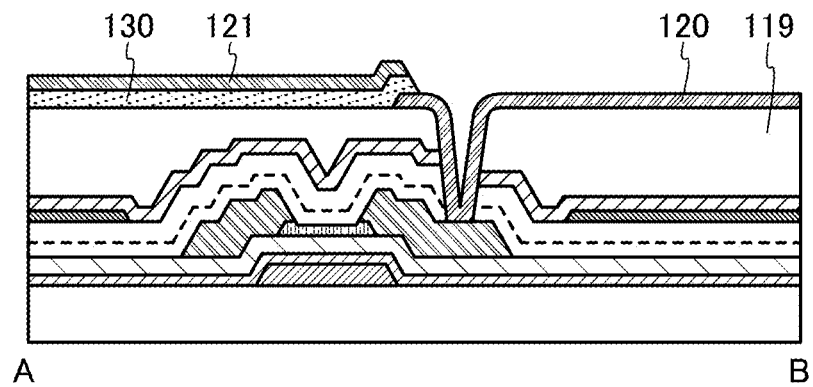

Next, a conductive film to be the conductive film 121 is formed over the insulating film 119, the conductive film 120, and the insulating film 130 and patterned such that a desired region is left, and then, an unnecessary region is etched to form the conductive film 121 (see FIG. 8B).

The conductive film 121 can be formed using any of the materials described above. In this embodiment, an Ag—Pd—Cu alloy is used for the conductive film 121.

Through the above steps, the liquid crystal display device illustrated in FIGS. 1A and 1B can be manufactured.

The structures, the methods, and the like described in this embodiment can be combined as appropriate with any of the structures, the methods, and the like described in the other embodiments.

(Embodiment 2)

In this embodiment, modification examples of the liquid crystal display device described in Embodiment 1 will be described with reference to FIGS. 9A and 9B to FIGS. 11A and 11B as liquid crystal display devices of embodiments of the present invention. Note that portions similar to or having functions similar to those in FIGS. 1A and 1B to FIGS. 8A and 8B, which are used in Embodiment 1, are denoted by the same reference numerals, and the description thereof is not repeated.

<Structure Example of Liquid Crystal Display Device (Modification Example)>

Figure 9A:
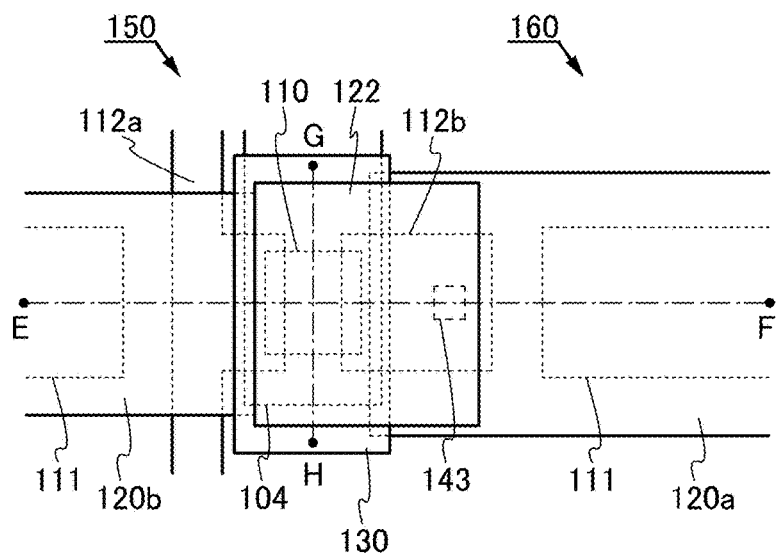
FIGS. 9A and 9B are a top view and a cross-sectional view illustrating one embodiment of a liquid crystal display device.
Figure 9B:
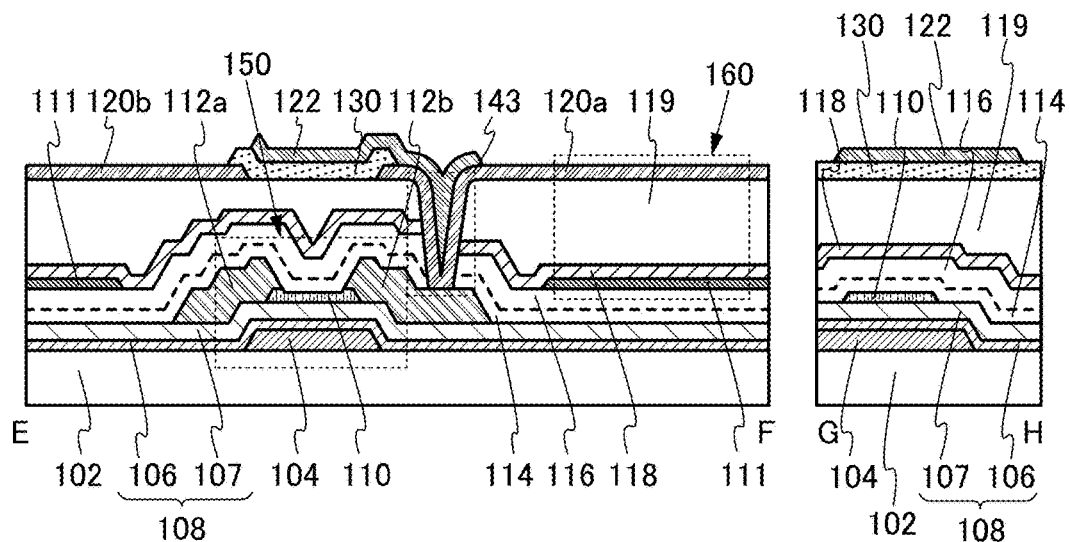

FIG. 9A is a top view of the liquid crystal display device of one embodiment of the present invention. FIG. 9B is a cross-sectional view taken along the dashed-dotted lines E-F and G-H in FIG. 9A. Note that in FIG. 9A, some components of the liquid crystal display device (e.g., a gate insulating film) are not illustrated to avoid complexity.

The liquid crystal display device illustrated in FIGS. 9A and 9B includes the transistor 150 including the first oxide semiconductor film 110 and the capacitor 160 including an insulating film between a pair of electrodes. The structures of the transistor 150 and the capacitor 160 are similar to those in the liquid crystal display device illustrated in FIGS. 1A and 1B. Note that the direction of the dashed-dotted line E-F in FIG. 9A is the channel length direction of a transistor 150. The direction of the dashed-dotted line G-H is the channel width direction of the transistor 150.

The structure of the conductive film 120a is similar to that of the conductive film 120 in FIGS. 1A and 1B. The transistor 150, the capacitor 160, and the conductive film 120a in FIGS. 9A and 9B can constitute one pixel of the liquid crystal display device.

The conductive film 120b can be formed with the same material and at the same time as the conductive film 120a. The conductive film 120b serves as a pixel electrode of a pixel adjacent to a pixel including the transistor 150, for example.

In the liquid crystal display device described in this embodiment, the insulating film 130 includes a region overlapping with the conductive film 120b and a region overlapping with the conductive film 122, and the conductive film 122 is provided over the insulating film 130 and the conductive film 120a. The conductive film 122 is electrically connected to the conductive film 120a.

In the liquid crystal display device illustrated in FIG. 9B, the insulating film 130 is provided over the conductive film 120a and the conductive film 120b. Specifically, the insulating film 130 is provided so as to overlap with ends of the conductive film 120a and the conductive film 120b.

The conductive film 120a and the conductive film 122 are insulated from each other by the insulating film 130 positioned therebetween. Thus, in the top view, a gap does not need to be provided between the conductive films 120a and 122. Such a structure helps increase the aperture ratio of pixels in the liquid crystal display device of one embodiment of the present invention. Furthermore, the increase in the aperture ratio of the pixels enables the reflective liquid crystal display device to display images with high contrast and high luminance.

Figure 10A:
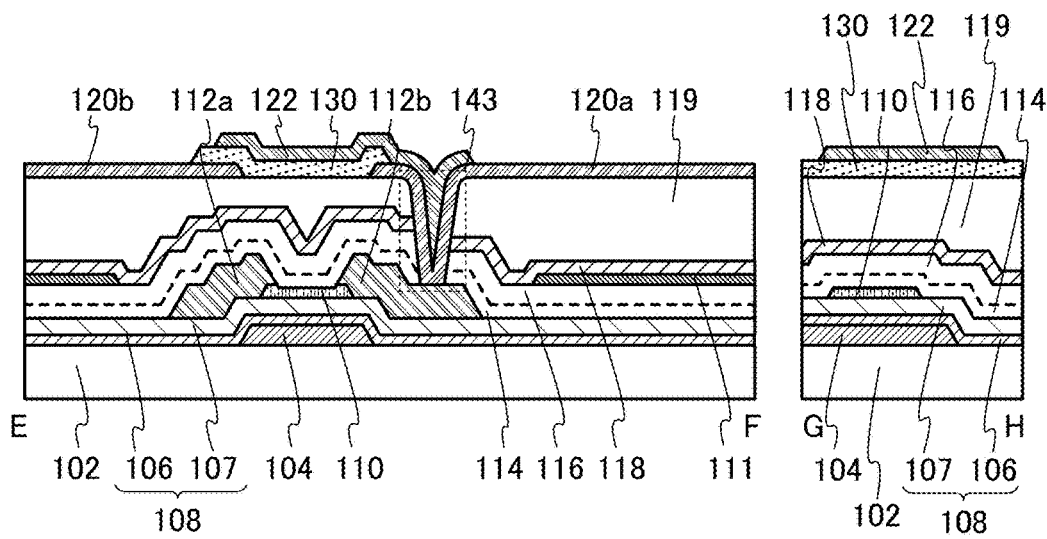
FIGS. 10A and 10B are cross-sectional views each illustrating one embodiment of a liquid crystal display device.

Note that in FIGS. 9A and 9B, the conductive film 120b and the conductive film 122 are provided with the insulating film 130 therebetween such that ends of the conductive films 120b and 122 are substantially in alignment with each other. In other words, a gap is not provided between the conductive films 120b and 122 in the top view; however, one embodiment of the present invention is not limited to this structure and a gap may be formed between the conductive films 120b and 122. Alternatively, as illustrated in FIG. 10A, a region where the conductive films 120b and 122 overlap with each other with the insulating film 130 therebetween may be provided.

Figure 10B:
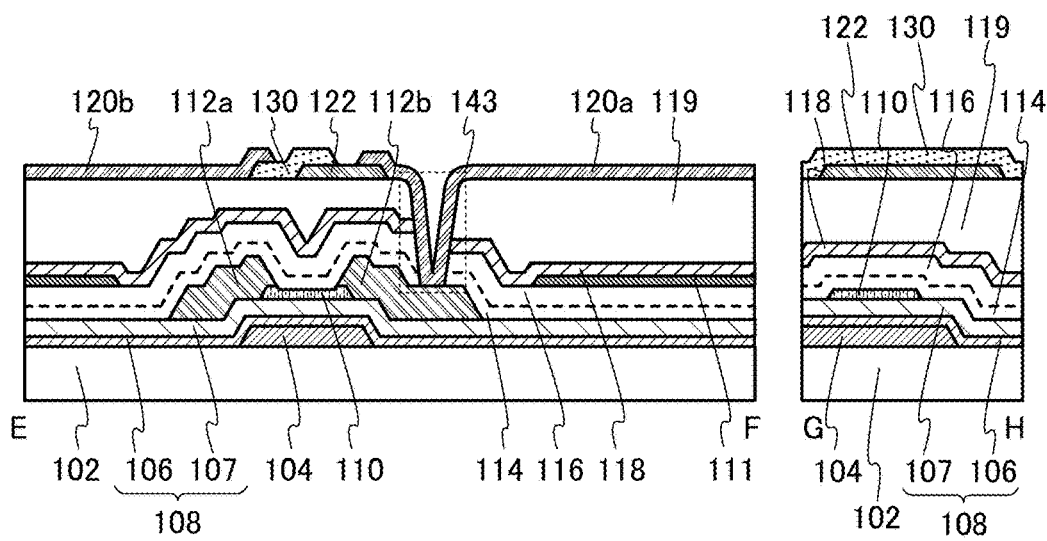
Figure 11A:
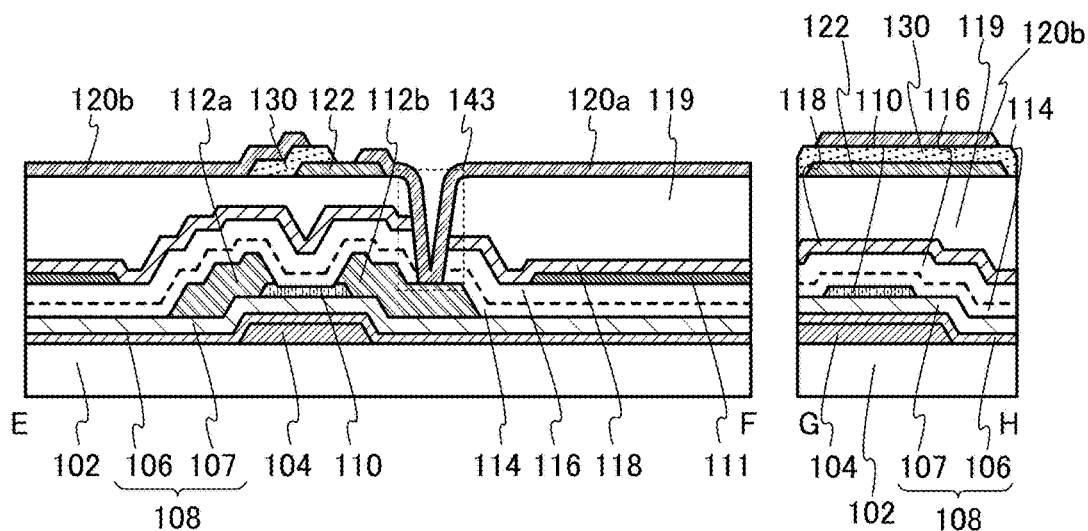
FIGS. 11A and 11B are cross-sectional views each illustrating one embodiment of a liquid crystal display device.

Alternatively, as illustrated in FIG. 10B, the conductive film 122 may be provided below the conductive film 120a. In a liquid crystal display device illustrated in FIG. 10B, the conductive film 120a and the insulating film 130 are provided over the conductive film 122, and the conductive film 120b is provided over the insulating film 130. The conductive films 120a and 120b can be formed with the same material at the same time. Although a gap is not provided between the conductive films 120b and 122 in the top view in FIG. 10B, a region where the conductive films 120b and 122 overlap with each other with the insulating film 130 therebetween may be provided as illustrated in FIG. 11A.

Figure 11B:
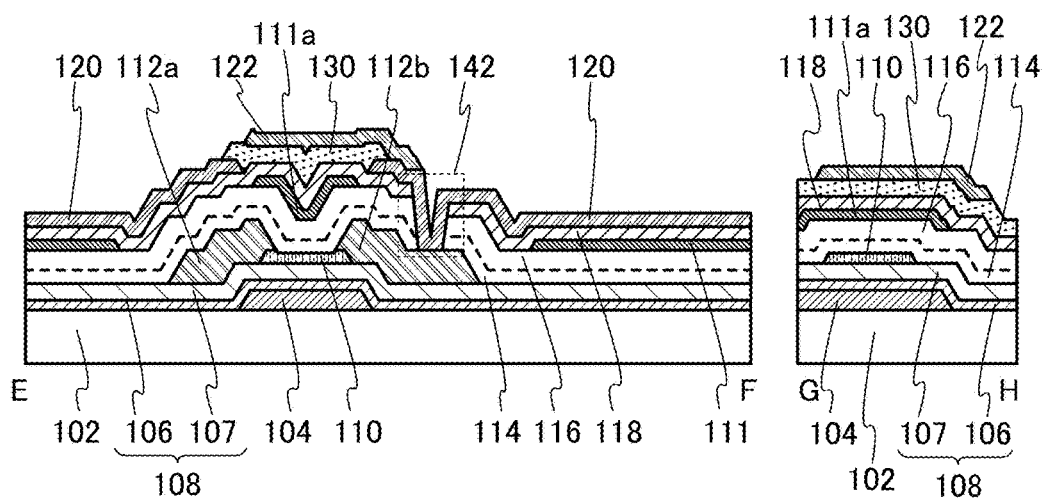

In the liquid crystal display device, the thickness of the insulating film 119 can be appropriately adjusted in accordance with the capacitance of the capacitor 160. Note that the insulating film 119 is not necessarily provided. FIG. 11B is an example of a cross-sectional view illustrating a liquid crystal display device not including the insulating film 119. In FIG. 11B, the insulating film 118 serves as a dielectric film of the capacitor 160.

Note that the description of Embodiment 1 can be referred to for the method for controlling the resistivities of the first oxide semiconductor film 110 and the second oxide semiconductor films 111 and 111a.

The description of Embodiment 1 can be referred to for materials and forming methods for the layers of the liquid crystal display device described in this embodiment. The description of the conductive film 120 in Embodiment 1 can be referred to for a material and a forming method for the conductive films 120a and 120b. The description of the conductive film 121 in Embodiment 1 can be referred to for a material and a forming method for the conductive film 122.

The structures, the methods, and the like described in this embodiment can be combined as appropriate with any of the structures, the methods, and the like described in the other embodiments.

(Embodiment 3)

In this embodiment, a modification example of the liquid crystal display device described in Embodiment 1 will be described with reference to FIGS. 12A and 12B as a liquid crystal display device of one embodiment of the present invention.

<Structure Example of Liquid Crystal Display Device>

Figure 12A:
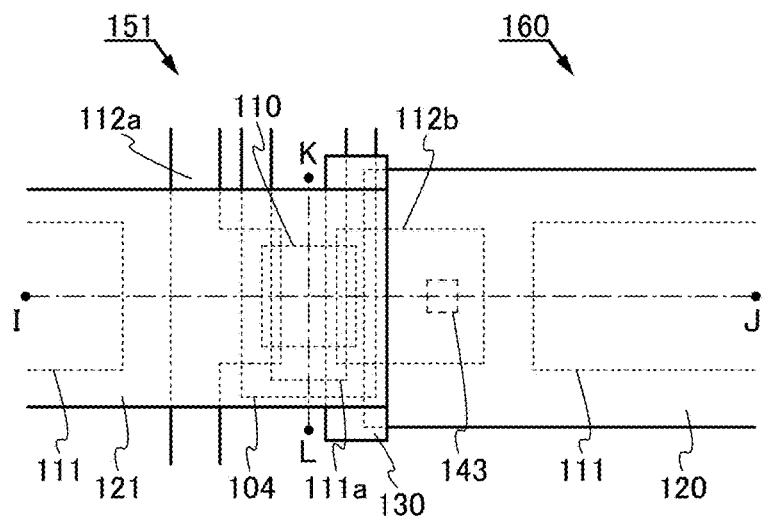
FIGS. 12A and 12B are a top view and a cross-sectional view illustrating one embodiment of a liquid crystal display device.

FIG. 12A is a top view of the liquid crystal display device of one embodiment of the present invention. FIG. 12B is a cross-sectional view taken along the dashed-dotted lines I-J, and K-L shown in FIG. 12A. Note that in FIG. 12A, some components of the liquid crystal display device (e.g., a coloring film and a gate insulating film) are not illustrated to avoid complexity.

The direction of the dashed-dotted line I-J in FIG. 12A is the channel length direction of a transistor 151. The direction of the dashed-dotted line K-L is the channel width direction of the transistor 151. Note that in this specification, the channel length direction of a transistor means the direction in which carriers move between a source (source region or source electrode) and a drain (drain region or drain electrode). The channel width direction means the direction perpendicular to the channel length direction in a plane parallel to a substrate.

Figure 12B:
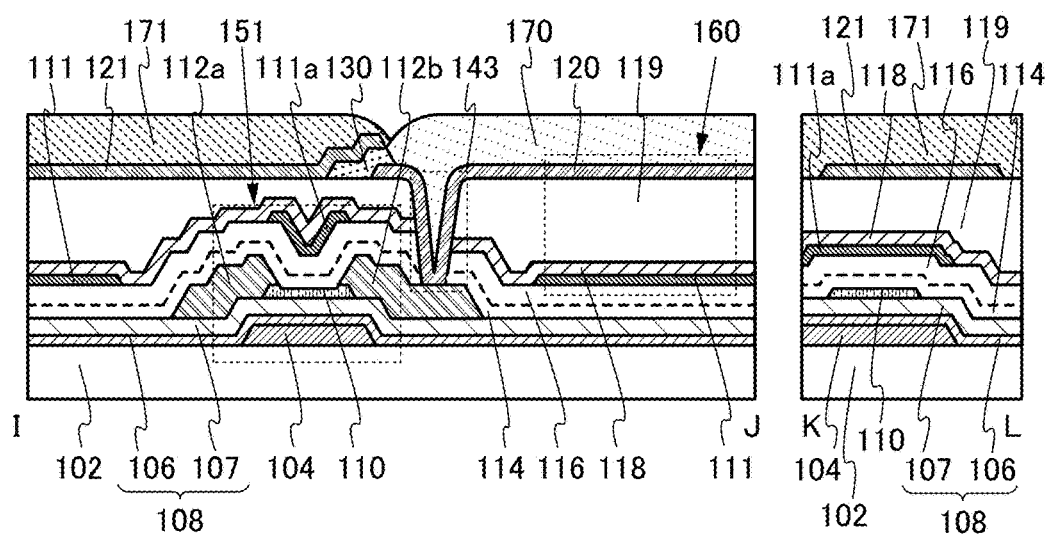

The liquid crystal display device shown in FIGS. 12A and 12B includes a transistor 151 including the first oxide semiconductor film 110 and the second oxide semiconductor film 111a and a capacitor 160 including an insulating film between a pair of electrodes. Note that in the capacitor 160, one of the pair of electrodes is a second oxide semiconductor film 111, and the other of the pair of electrodes is a conductive film 120.

The transistor 151 includes the gate electrode 104 over the substrate 102; the insulating film 108 that is over the gate electrode 104 and serves as a first gate insulating film; a first oxide semiconductor film 110 that is over the insulating film 108 and overlaps with the gate electrode 104; the source electrode 112a and the drain electrode 112b over the first oxide semiconductor film 110; the insulating films 114 and 116 that are over the first oxide semiconductor film 110, the source electrode 112a, and the drain electrode 112b and serve as a second gate insulating film; and the second oxide semiconductor film 111a that is over the insulating film 116 and overlaps with the first oxide semiconductor film 110. Note that the transistor 151 illustrated in FIGS. 12A and 12B has a double-gate structure.

In addition, over the transistor 151, specifically, over the second oxide semiconductor film 111a and the insulating film 116, insulating films 118 and 119 are formed. The insulating films 114, 116, and 118 function as protective insulating films for the transistor 151. The insulating film 119 functions as a planarization film. In addition, the opening 143 reaching the drain electrode 112b is formed in the insulating films 114, 116, 118, and 119. The conductive film 120 is formed over the insulating film 119 so as to cover the opening 143. That is, the conductive film 120 is electrically connected to the transistor 151. The conductive film 120 functions as a pixel electrode of the liquid crystal display device.

The capacitor 160 includes the second oxide semiconductor film 111 serving as the one of the pair of electrodes over the insulating film 116, the insulating films 118 and 119 serving as dielectric films over the second oxide semiconductor film 111, and the conductive film 120 serving as the other of the pair of electrodes, which overlaps with the second oxide semiconductor film 111, with the insulating films 118 and 119 provided between the conductive film 120 and the second oxide semiconductor film 111. In other words, the conductive film 120 serves as the pixel electrode and the electrode of the capacitor.

The transistor 151, the capacitor 160, and the conductive film 120 in FIGS. 12A and 12B can constitute one pixel of the liquid crystal display device.

The insulating film 130 is provided so as to overlap with an end of the conductive film 120, and the conductive film 121 is provided over the insulating film 130. The conductive film 121 serves as a pixel electrode of a pixel adjacent to the pixel including the transistor 151, for example.

The conductive film 120 and the conductive film 121 are insulated from each other by the insulating film 130 positioned therebetween. Thus, in the top view, a gap does not need to be provided between the conductive films 120 and 121. Such a structure helps increase the aperture ratio of pixels in the liquid crystal display device of one embodiment of the present invention. Furthermore, the increase in the aperture ratio of the pixels enables the reflective liquid crystal display device to display images with high contrast and high luminance.

Furthermore, a coloring film 170 is provided over the conductive film 120, and a coloring film 171 is provided over the conductive film 121. Providing the coloring film over and in contact with the conductive film helps suppress crosstalk in which light reflected by the pixel electrode in one pixel passes through the coloring film in the adjacent pixel, leading to suppression of the viewing angle dependence of the reflective liquid crystal display device. Furthermore, with such a structure, a coloring film does not need to be provided over a substrate facing the substrate 102 with liquid crystals therebetween (hereinafter also referred to as a counter substrate). This can reduce alignment accuracy required when the substrate 102 and the counter substrate are bonded to each other. Consequently, the yield in the manufacture of the liquid crystal display device can be increased.

Although the insulating film 130 is provided only in the vicinity of an end of the conductive film 120 so as to cover the end of the conductive film 120 in FIG. 12B, one embodiment of the present invention is not limited to this structure. The insulating film 130 may overlap with the conductive film 121 such that the their ends are substantially in alignment with each other. The liquid crystal display device illustrated in FIGS. 12A and 12B includes a region where the conductive film 120 and the conductive film 121 overlap with each other with the insulating film 130 therebetween; however, the conductive film 120 and the conductive film 121 do not necessarily overlap with each other.

In the liquid crystal display device, the thickness of the insulating film 119 can be appropriately adjusted in accordance with the capacitance of the capacitor 160. Note that the insulating film 119 is not necessarily provided.

Note that in the liquid crystal display device in FIGS. 12A and 12B, the second oxide semiconductor film 111a is provided over the insulating film 116. The second oxide semiconductor film 111a may be formed and etched at the same time as the second oxide semiconductor film 111 so as to overlap with a channel region of the transistor. Since the second oxide semiconductor film 111a is formed and etched at the same time as the second oxide semiconductor film 111 for example, the oxide semiconductor films contain the same material. Thus, an increase in the number of steps in the process can be avoided. Note that one embodiment of the present invention is not limited to this example. The second oxide semiconductor film 111a may be formed through steps different from those of the second oxide semiconductor film 111.

The second oxide semiconductor film 111a includes a region overlapping with the first oxide semiconductor film 110 serving as the channel region of the transistor 151. Thus, the second oxide semiconductor film 111a has a function as a second gate electrode of the transistor 151, and may be connected to the gate electrode 104. Alternatively, the second oxide semiconductor film 111a may have the following structure: the second oxide semiconductor film 111a is not connected to the gate electrode 104 so that signals or potentials different from those supplied to the gate electrode 104 are supplied to the second oxide semiconductor film 111a. With such a structure, the current drive capability of the transistor 151 can be improved.

Note that the first oxide semiconductor film 110 serves as a channel region of the transistor 151. In addition, the second oxide semiconductor film 111 serves as the one of the pair of electrodes of the capacitor 160. Thus, the second oxide semiconductor film 111 has lower resistivity than the first oxide semiconductor film 110. In addition, the first oxide semiconductor film 110 and the second oxide semiconductor film 111 preferably contain the same metal element. When the first oxide semiconductor film 110 and the second oxide semiconductor film 111 contain the same metal element, a common manufacturing apparatus (e.g., a deposition apparatus or a processing apparatus) can be used and accordingly the manufacturing cost can be reduced.

Note that as the insulating film 118 over the transistor 151 and included in the capacitor 160, an insulating film containing at least hydrogen is used. In addition, as the insulating film 107 included in the transistor 151 and the insulating films 114 and 116 over the transistor 151, insulating films containing at least oxygen are used. In this manner, these insulating films having the above composition are used as the insulating films included in the transistor 151 and the capacitor 160 and provided over the transistor 151 and the capacitor 160, so that the resistivity of the first oxide semiconductor film 110 included in the transistor 151 and the resistivity of the second oxide semiconductor film 111 included in the capacitor 160 can be controlled. Note that the description of Embodiment 1 can be referred to for the method for controlling the resistivities of the first oxide semiconductor film 110 and the second oxide semiconductor films 111 and 111a.

Note that the first oxide semiconductor film 110 has higher resistivity than the second oxide semiconductor film 111 because it is used as the channel region in the transistor 151. The second oxide semiconductor films 111 and 111a have lower resistivity than the first oxide semiconductor film 110 because it serves as electrodes.

The description of Embodiment 1 can be referred to for materials and forming methods for the layers of the liquid crystal display device described in this embodiment. The description of the conductive film 120 in Embodiment 1 can be referred to for a material and a forming method for the conductive films 120a and 120b. Examples of a material that can be used for the coloring films 170 and 171 include a metal material, a resin material, and a resin material containing a pigment or dye.

The structures, the methods, and the like described in this embodiment can be combined as appropriate with any of the structures, the methods, and the like described in the other embodiments.

(Embodiment 4)

In this embodiment, a liquid crystal display device 80 which is one embodiment of the present invention will be described with reference to FIGS. 13A and 13B to FIG. 25.

Figure 13A:
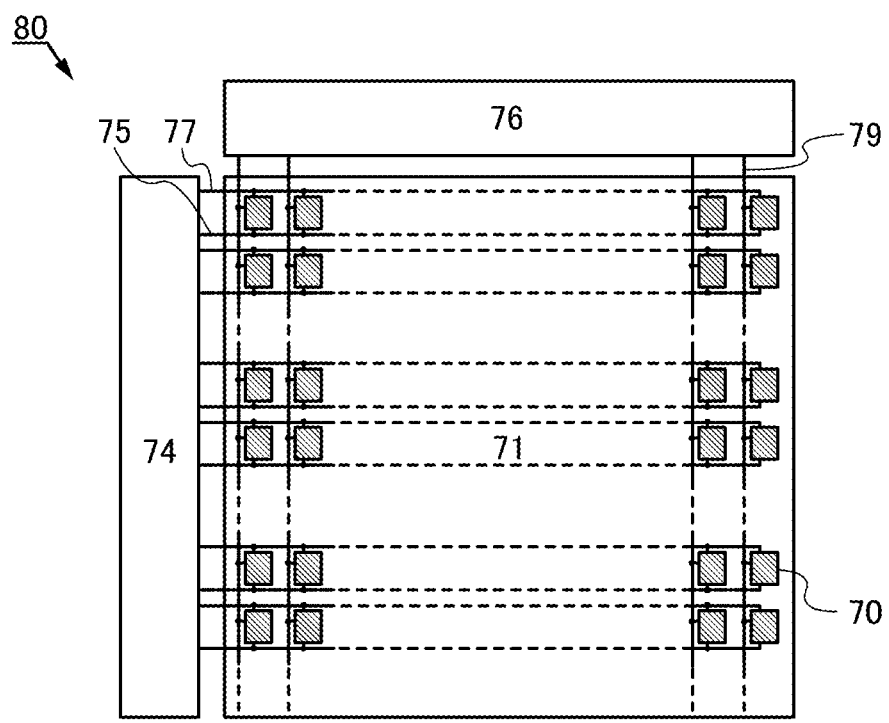
FIG. 13A is a top view illustrating one embodiment of a liquid crystal display device.

The liquid crystal display device 80 illustrated in FIG. 13A includes a pixel portion 71, a scan line driver circuit 74, a signal line driver circuit 76, m scan lines 77 that are arranged parallel or substantially parallel to each other and whose potentials are controlled by the scan line driver circuit 74, and n signal lines 79 that are arranged parallel or substantially parallel to each other and whose potentials are controlled by the signal line driver circuit 76. Note that m and n are each an integer of 1 or more. The pixel portion 71 includes a plurality of pixels 70 arranged in a matrix. Furthermore, capacitor wirings 75 arranged parallel or substantially parallel to each other are provided along the scan lines 77. The scan line driver circuit 74 and the signal line driver circuit 76 are collectively referred to as a driver circuit portion in some cases.

Each of the scan lines 77 is electrically connected to the n pixels 70 in the corresponding row among the pixels 70 arranged in m rows and n columns in the pixel portion 71. Each of the signal lines 79 is electrically connected to the m pixels in the corresponding column among the pixels 70 arranged in m rows and n columns. Each of the capacitor wirings 75 is electrically connected to the n pixels 70 in the corresponding row among the pixels 70 arranged in m rows and n columns.

Figure 13B:
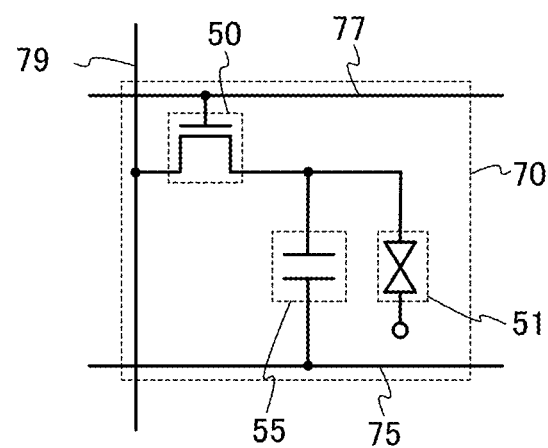
FIG. 13B is a circuit diagram illustrating one embodiment of a pixel.

FIG. 13B illustrates an example of a circuit configuration that can be used for the pixel 70 in the liquid crystal display device 80 illustrated in FIG. 13A.

The pixel 70 illustrated in FIG. 13B includes a liquid crystal element 51, a transistor 50, and a capacitor 55.

One of a pair of electrodes of the liquid crystal element 51 is connected to the transistor 50 and the potential thereof is set as appropriate in accordance with the specifications of the pixel 70. The other of the electrodes of the liquid crystal element 51 is connected to a common line (not illustrated) and a common potential is applied thereto. The alignment of liquid crystals of the liquid crystal element 51 is controlled in accordance with data written to the transistor 50.

The liquid crystal element 51 controls transmission or non-transmission of light utilizing an optical modulation action of liquid crystal. Note that optical modulation action of liquid crystal is controlled by an electric field applied to the liquid crystal (including a horizontal electric field, a vertical electric field, and an oblique electric field). As the liquid crystal used for the liquid crystal element 51, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. An alignment film is not necessarily provided and rubbing treatment is thus not necessary; accordingly, electrostatic discharge damage caused by the rubbing treatment can be prevented and defects and damage of the liquid crystal display device in the manufacturing process can be reduced.

The liquid crystal display device 80 including the liquid crystal element 51 can be driven in a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like.

Examples of a method for driving the liquid crystal display device 80 including the liquid crystal element 51 include the vertical alignment modes such as a multi-domain vertical alignment (MVA) mode, a patterned vertical alignment (PVA) mode, and an advanced super view (ASV) mode.

In the pixel 70 illustrated in FIG. 13B, one of a source electrode and a drain electrode of the transistor 50 is electrically connected to the signal line 79, and the other is electrically connected to the one of the pair of electrodes of the liquid crystal element 51. A gate electrode of the transistor 50 is electrically connected to the scan line 77. The transistor 50 has a function of controlling whether to write data of a data signal.

In the pixel 70 illustrated in FIG. 13B, one of a pair of electrodes of the capacitor 55 is connected to the other of the source electrode and the drain electrode of the transistor 50. The other of the electrodes of the capacitor 55 is electrically connected to the capacitor wiring 75. The potential of the capacitor wiring 75 is set as appropriate in accordance with the specifications of the pixel 70. The capacitor 55 has a function of a storage capacitor for storing written data.

<Structure Example of Liquid Crystal Display Device>

Figure 14:
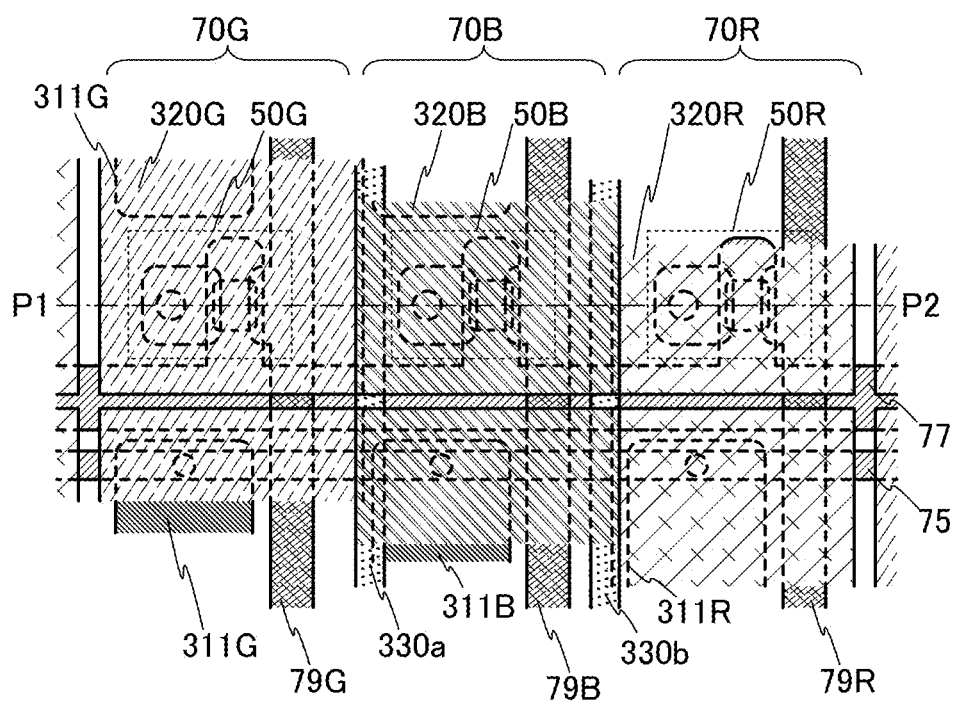
FIG. 14 is a top view illustrating one embodiment of a liquid crystal display device.
Figure 15:
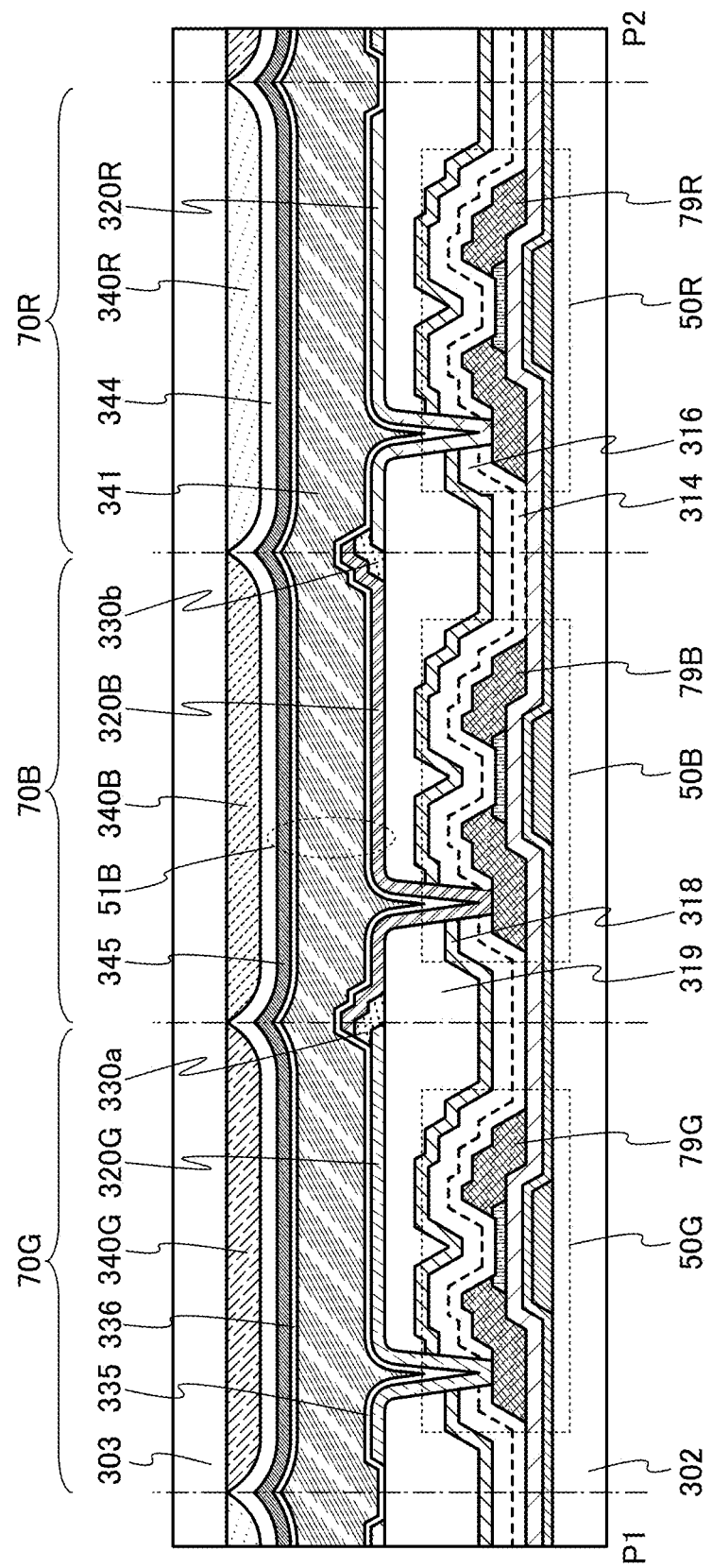
FIG. 15 is a cross-sectional view illustrating one embodiment of a liquid crystal display device.

Next, a specific structure of the liquid crystal display device 80 will be described. FIG. 14 is a top view illustrating a plurality of pixels 70R, 70G, and 70B included in the liquid crystal display device 80. In the top view, only the structure of an element substrate included in the liquid crystal display device 80 is illustrated. FIG. 15 is a cross-sectional view of the liquid crystal display device 80 taken along the dashed dotted line P1-P2 in FIG. 14. For example, the pixel 70R, the pixel 70G, and the pixel 70B display red, green, and blue images, respectively. The display of red, green, and blue images can be performed when the liquid crystal display device 80 is provided with coloring films 340R, 340G, and 340B that selectively transmit red light, green light, and blue light, respectively, such that they overlap with the pixels 70R, 70G, and 70B, respectively.

The liquid crystal display device 80 includes the pixels 70R, 70G, and 70B. The pixel 70R includes a pixel electrode 320R and a transistor 50R. The pixel 70G includes a pixel electrode 320G and a transistor 50G. The pixel 70B includes a pixel electrode 320B and a transistor 50B. The transistor 50R is electrically connected to a signal line 79R and the scan line 77. The transistor 50G is electrically connected to a signal line 79G and the scan line 77. The transistor 50B is electrically connected to a signal line 79B and the scan line 77.

The pixel 70R includes a capacitor including the pixel electrode 320R and an oxide semiconductor film 311R as a pair of electrodes. The pixel 70G includes a capacitor including the pixel electrode 320G and an oxide semiconductor film 311G as a pair of electrodes. The pixel 70B includes a capacitor including the pixel electrode 320B and an oxide semiconductor film 311B as a pair of electrodes. The oxide semiconductor films 311R, 311G, and 311B are electrically connected to the capacitor wiring 75.

The liquid crystal display device 80 includes at least three transistors (50R, 50G, and 50B) over the same substrate 302, an insulating film 318 covering the transistor, and an insulating film 319 covering the insulating film 318 (see FIG. 15). The pixel electrodes 320R, 320G, and 320B are provided over the insulating film 319.

Through openings formed in the insulating films 314, 316, 318, and 319, the pixel electrode 320R is electrically connected to a source electrode or a drain electrode of the transistor 50R, the electrode 320G is electrically connected to a source electrode or a drain electrode of the transistor 50G, and the pixel electrode 320B is electrically connected to a source electrode or a drain electrode of the transistor 50B. An alignment film 335 is provided over the pixel electrodes 320R, 320G, and 320B.

The liquid crystal display device 80 is provided with the coloring films 340R, 340G, and 340B on the substrate 303 side. An insulating film 344, a common electrode 345, and an alignment film 336 are provided so as to overlap with the coloring films for all the colors. For example, a liquid crystal element 51B in the pixel 70B is composed of the pixel electrode 320B, the common electrode 345, and a liquid crystal layer 341 sandwiched between the pixel electrode 320B and the common electrode 345. The insulating film 344 may have a function as a planarization film. Note that a structure without the insulating film 344 may be employed.

Furthermore, one end of the pixel electrode 320B is over and overlaps with the pixel electrode 320G with an insulating film 330a therebetween, and the other end of the pixel electrode 320B is over and overlaps with the pixel electrode 320R with the insulating film 330b therebetween.

Figure 16:
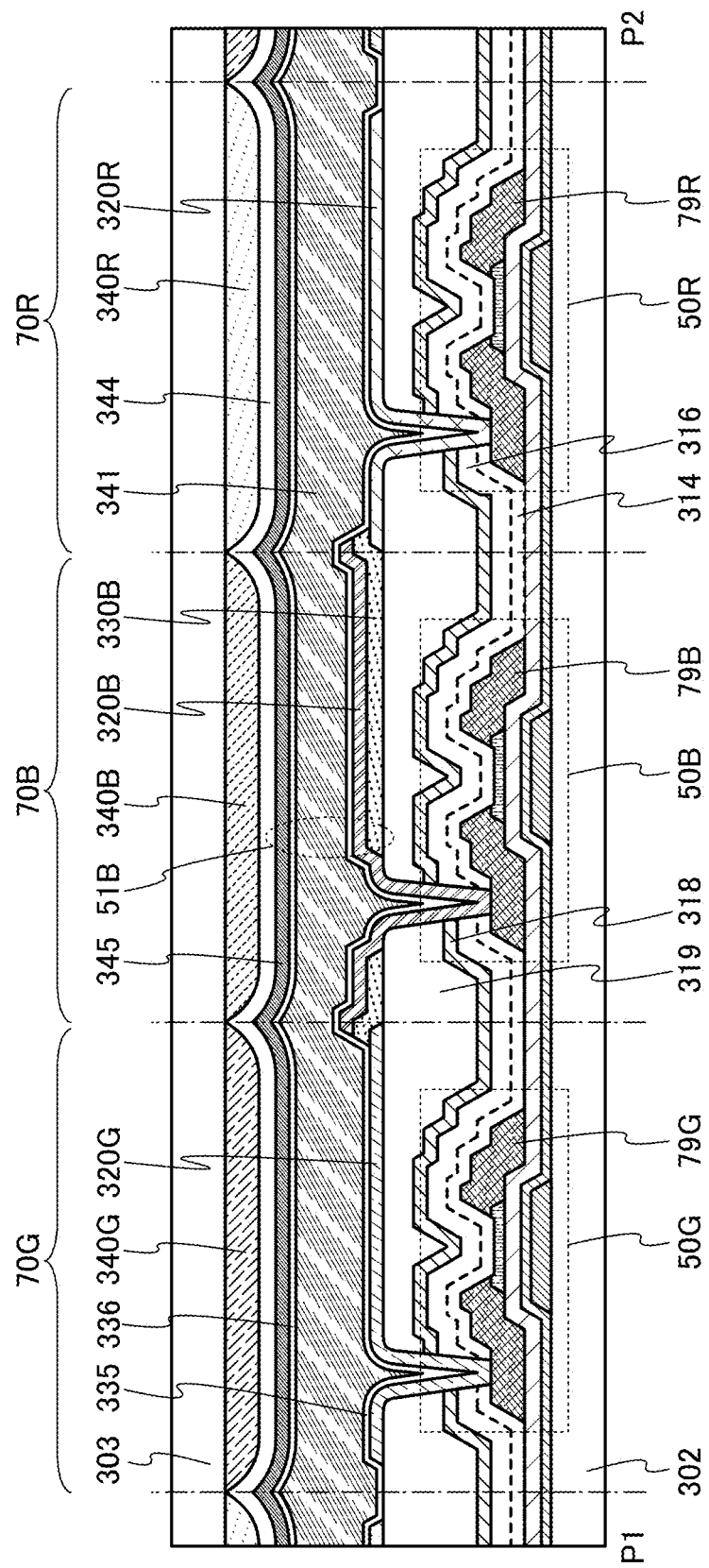
FIG. 16 is a cross-sectional view illustrating one embodiment of a liquid crystal display device.

Although the insulating films 330a and 330b are provided only in the vicinity of ends of pixel electrodes 320G and 320R so as to cover the ends thereof in FIG. 15, one embodiment of the present invention is not limited to this structure. As illustrated in FIG. 16, the insulating film 330B may be provided such that it covers the ends of the pixel electrodes 320R and 320G and an end of the insulating film 330B is substantially in alignment with the end of the pixel electrode 320B. In a liquid crystal display device 80 illustrated in FIG. 16, an opening is formed in the insulating film 330B, and the pixel electrode 320B and a source electrode or a drain electrode of the transistor 50B are electrically connected to each other through the opening.

Figure 17:
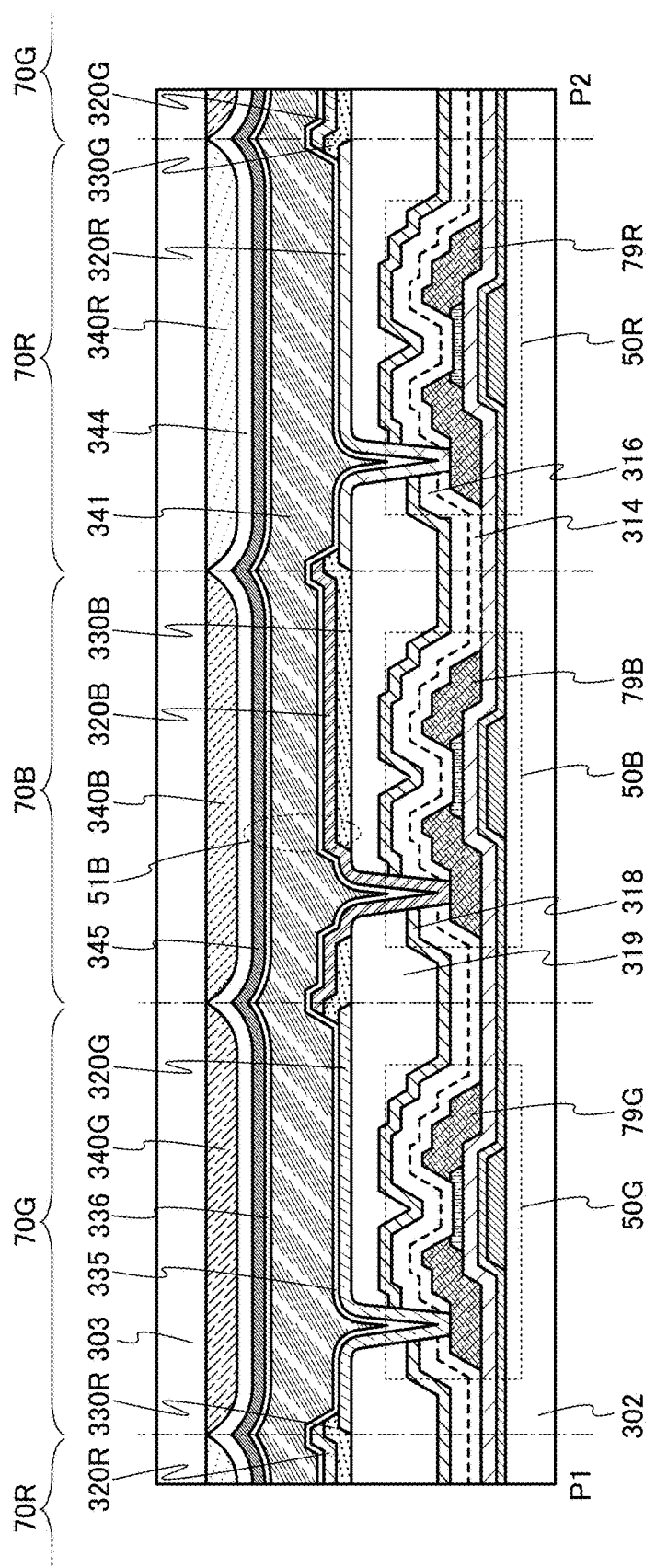
FIG. 17 is a cross-sectional view illustrating one embodiment of a liquid crystal display device.
Figure 18:
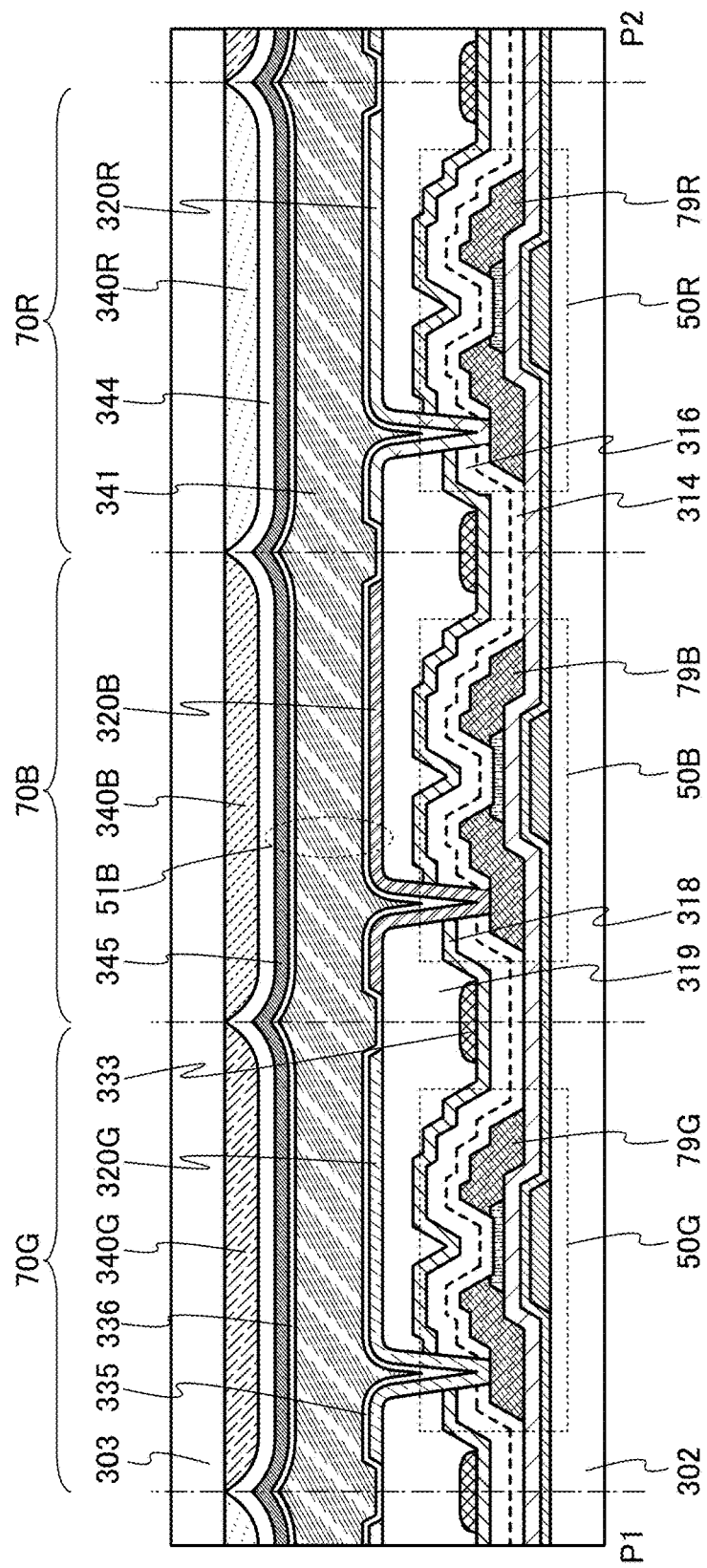
FIG. 18 is a cross-sectional view illustrating one embodiment of a liquid crystal display device.

Although the insulating film 330B is provided under the pixel electrode 320B and is provided under neither the pixel electrode 320R nor the pixel electrode 320G in FIG. 16, one embodiment of the present invention is not limited to this structure. As illustrated in FIG. 17, an insulating film 330R may be provided under the pixel electrode 320R in the pixel 70R adjacent to the pixel 70G, and an insulating film 330G may be provided under the pixel electrode 320G in the pixel 70G adjacent to the pixel 70R. Such a structure can uniformly increase the aperture ratios of the pixels 70R, the pixels 70G, and the pixels 70B in the liquid crystal display device including the pixels 70R, 70G, and 70B.

In the case where a gap is provided between adjacent two pixel electrodes, a structure body may be formed so as to overlap with the gap. In a liquid crystal display device illustrated in FIG. 18, gaps are provided between the pixel electrode 320R and the pixel electrode 320G, between the pixel electrode 320G and the pixel electrode 320B, and between the pixel electrode 320B and the pixel electrode 320R, and structure bodies 333 are provided over the insulating film 318 so as to overlap with the gaps. For the structure bodies 333, a material that blocks visible light can be used. For example, the structure bodies 333 serve as a black matrix. In the case where a wiring or the like is provided below the structure bodies 333, the structure bodies 333 can reduce reflection of external light by the wiring, increasing the contrast of the reflective liquid crystal display device.

Figure 19:
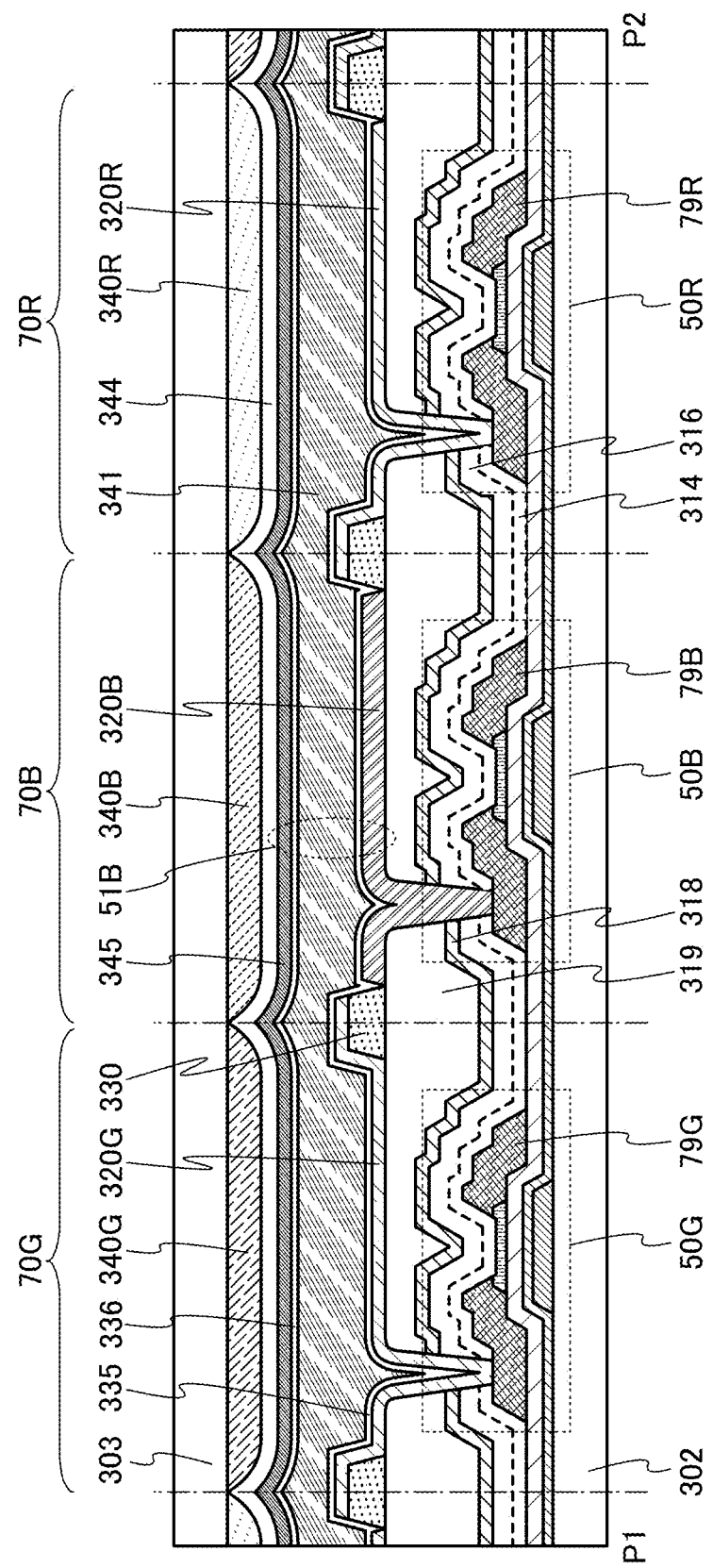
FIG. 19 is a cross-sectional view illustrating one embodiment of a liquid crystal display device.
Figure 20:
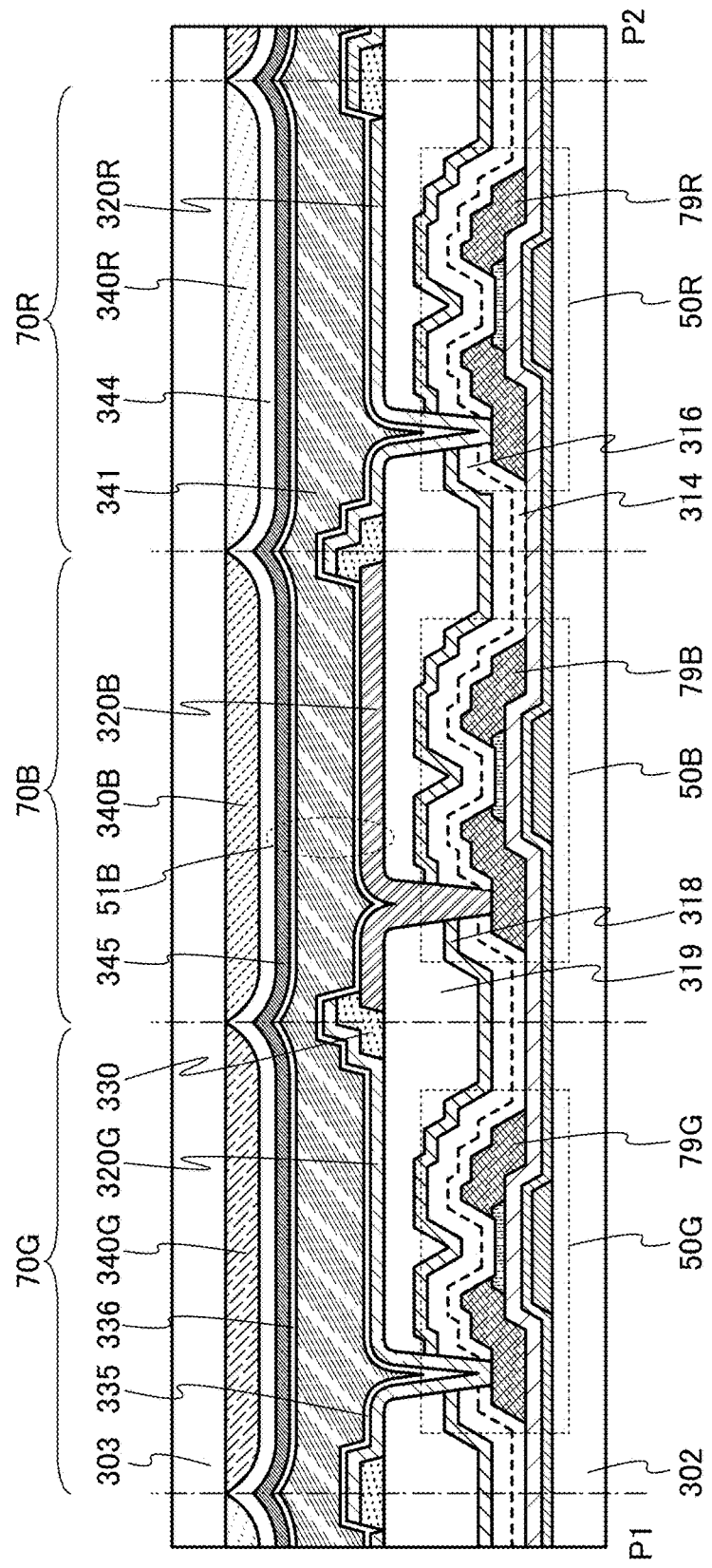
FIG. 20 is a cross-sectional view illustrating one embodiment of a liquid crystal display device.
Figure 21:
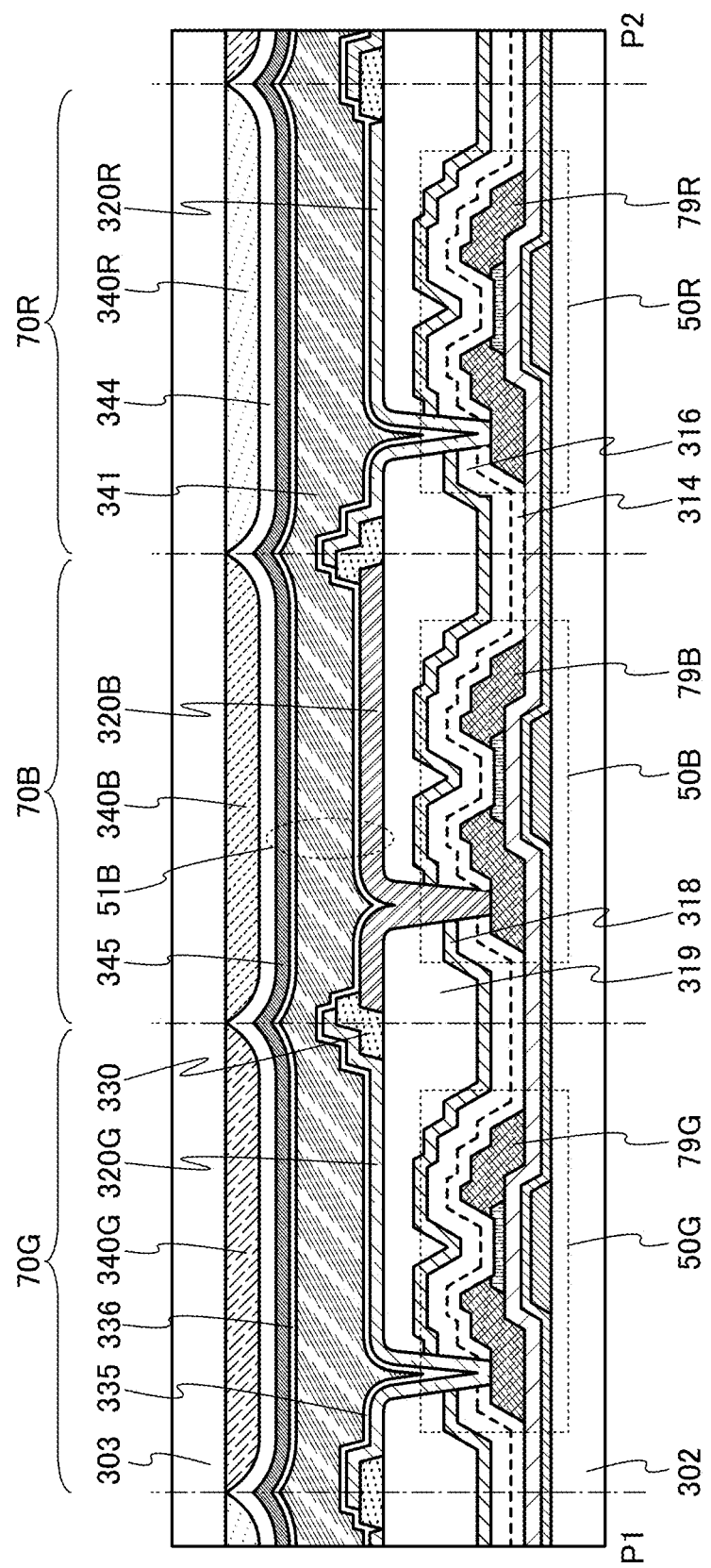
FIG. 21 is a cross-sectional view illustrating one embodiment of a liquid crystal display device.

Alternatively, a plurality of pixel electrodes included in the liquid crystal display device may be formed using a plurality of materials as illustrated in FIG. 19. In FIG. 19, pixel electrodes 320R and 320G can be formed with the same material at the same time. The pixel electrode 320B is formed using a material different from that for the pixel electrodes 320R and 320G. For example, APC can be used for the pixel electrodes 320R and 320G, and aluminum can be used for the pixel electrode 320B. Aluminum, which has a higher reflectivity of light in the blue wavelength region (e.g., longer than or equal to 400 nm and shorter than or equal to 450 nm) than APC, can favorably be used for the pixel electrode of the pixel 70B including the coloring film 340B. Furthermore, a difference in thickness between the pixel electrode 320B and the pixel electrodes 320R and 320G allows the thickness of the liquid crystal layer 341 to be adjusted in the liquid crystal elements in each pixel. Varying the thickness of the liquid crystal layer 341 in accordance with the wavelength of light passing through the liquid crystal layer 341 enables efficient extraction of external light in the reflective liquid crystal display device. Note that in FIG. 19, an insulating film 330 is provided between adjacent pixels of different colors, and ends of the insulating film 330 and ends of the pixel electrodes (320G, 320R) positioned over the insulating film 330 are substantially in alignment with each other. All insulating films 330 are provided over the insulating film 319. Furthermore, the insulating film 330 may be provided over the pixel electrode so as to cover the end of the pixel electrode. In FIG. 20, the insulating film 330 is provided so as to cover the end of the pixel electrode 320B. Note that the ends of the pixel electrodes (320G, 320R) positioned over the insulating film 330 may be located inward from the end of the insulating film 330 as illustrated in FIG. 21.

In the liquid crystal display device of one embodiment of the present invention, an insulating film is provided between adjacent two pixel electrodes, a gap does not need to be provided between the adjacent two pixel electrodes in the top view. Such a structure can increase the aperture ratio of pixels. One embodiment of the present invention enables the aperture ratio of the liquid crystal display device to be higher than or equal to 75% and lower than 100%, preferably higher than or equal to 90% and lower than 100%, more preferably higher than or equal to 98% and lower than 100%.

Note that it is preferred that the boundary between two pixel electrodes that are adjacent to each other with the insulating film 330 therebetween be not in alignment with the boundary between coloring films overlapping with the two pixel electrodes. Specifically, for example, the pixel electrode 320B is preferably provided such that its end and the vicinity thereof overlaps with the coloring film 340R as illustrated in FIG. 22.

Since the pixel electrode 320R adjacent to the pixel electrode 320B is located over the insulating film 330, the distance between the common electrode 345 and the pixel electrode 320R over the insulating film 330 is smaller than the distance between the pixel electrode 320B and the common electrode 345. The insulating film 330 and the pixel electrode 320R are located in the vicinity of a side surface of the pixel electrode 320B. Consequently, in the vicinity of the boundary between the pixel electrode 320B and the pixel electrode 320R, the intensity of an electric field applied between the pixel electrode 320R and the common electrode 345 is higher than that of an electric field applied between the pixel electrode 320B and the common electrode 345. Thus, the electric field generated by the pixel electrode 320R is also applied to the position overlapping with the end and its vicinity of the pixel electrode 320B. Providing the pixel electrode 320B such that its end and the vicinity thereof overlap with the coloring film 340R can effectively prevent light leakage from the pixel 70B from affecting display of the pixel 70R. Similarly, providing the pixel electrode 320B such that its end and the vicinity thereof overlap with the coloring film 340G can effectively reduce the influence of light leakage from the pixel 70B on display of the pixel 70G.

Figure 22:
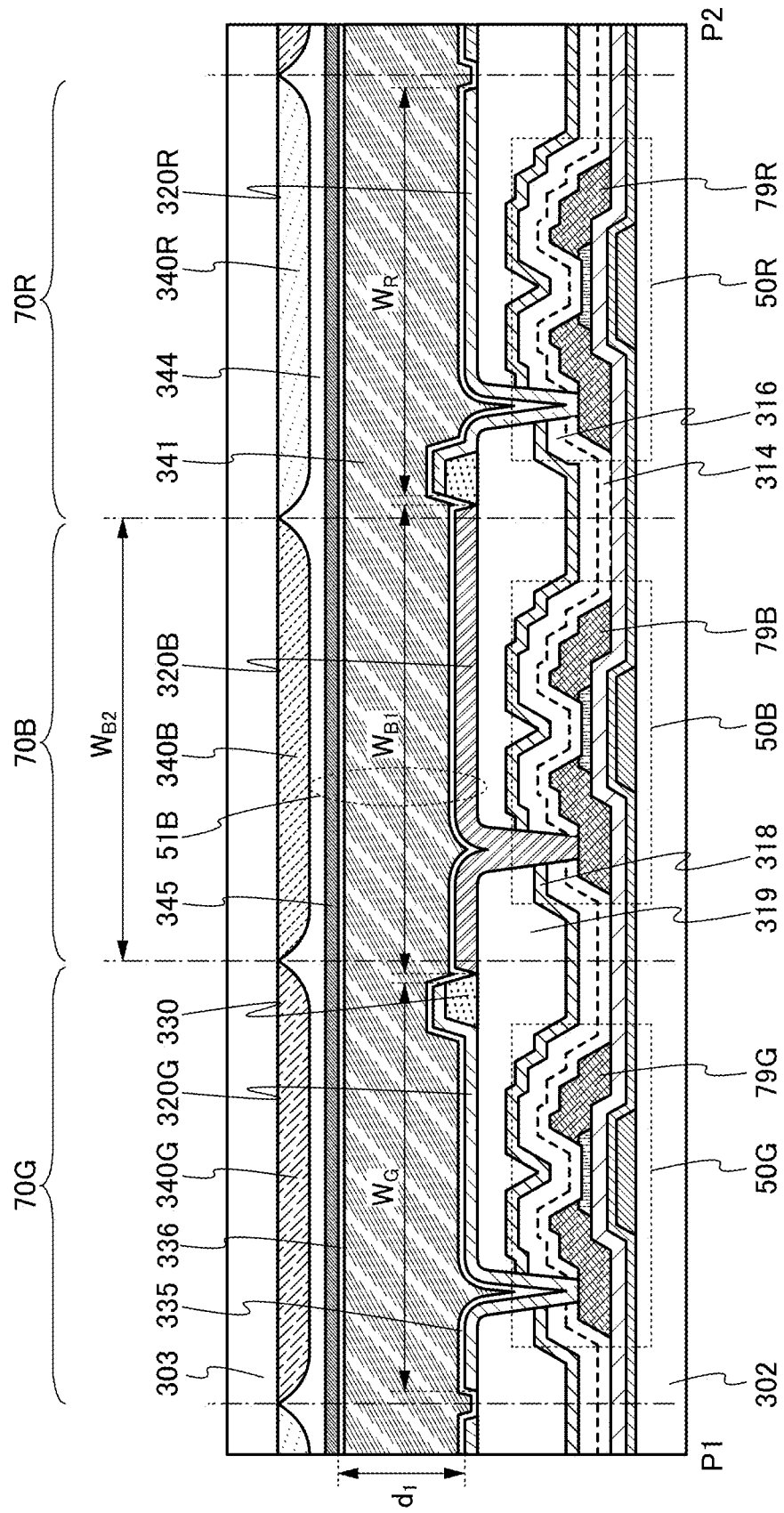
FIG. 22 is a cross-sectional view illustrating one embodiment of a liquid crystal display device.

For example, it is assumed in FIG. 22 that a width $W_R$ of the pixel electrode 320R and a width $W_G$ of the pixel electrode 320G are each 18 µm, and a width $W_{B1}$ of the pixel electrode 320B is 21.5 µm. It is also assumed that the thicknesses of the pixel electrodes 320R and 320G formed using APC are each 100 nm, and the thickness of the pixel electrode 320B formed using aluminum is 300 nm. When a distance $d_1$ between a surface of the pixel electrode 320R and a surface of the common electrode 345 is 2.2 µm, the end of the pixel electrode 320B is positioned so as to extend beyond the end of the coloring film 340B by 0.5 µm, that is, a width $W_{B2}$ of the coloring film 340B is set to be 20.5 µm, whereby light leakage of the liquid crystal display device 80 can be reduced, leading to an improvement in color purity of display. Note that it is assumed that the end of the coloring film 340B and the end of the coloring film 340R are in alignment with each other, and the end of the coloring film 340B and the end of the coloring film 340G are in alignment with each other.

Figure 23:
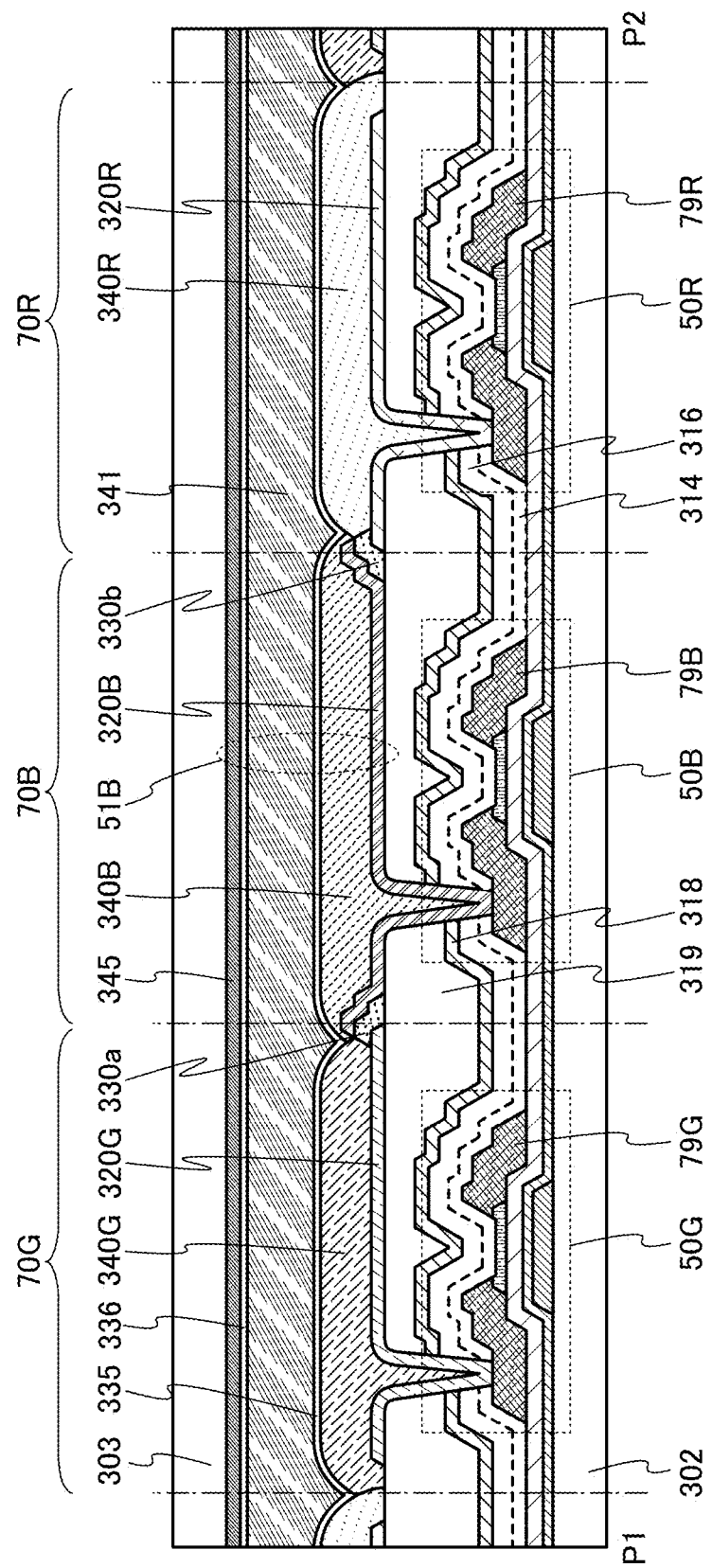
FIG. 23 is a cross-sectional view illustrating one embodiment of a liquid crystal display device.
Figure 24:
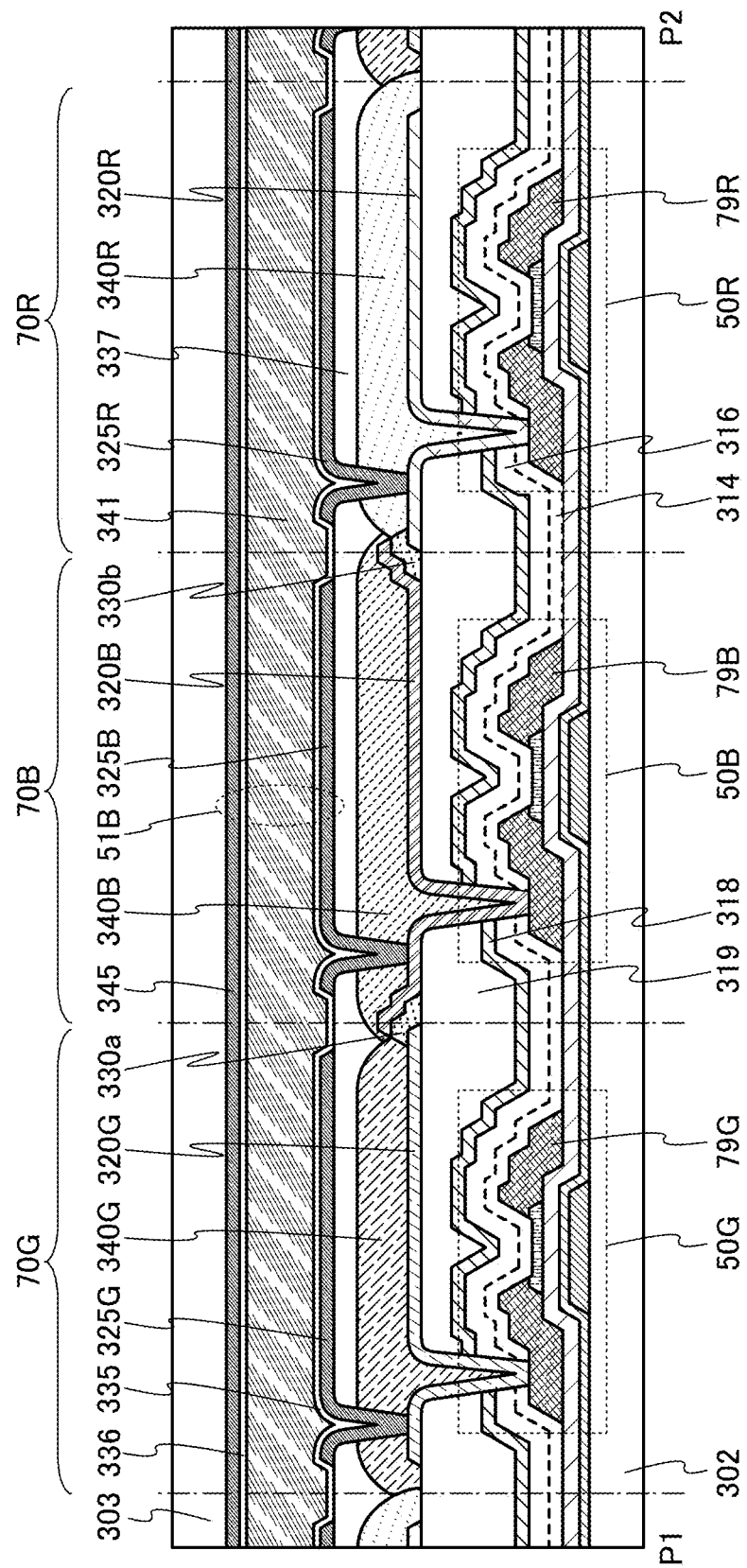
FIG. 24 is a cross-sectional view illustrating one embodiment of a liquid crystal display device.

As illustrated in FIG. 23, the coloring films may be provided over and in contact with the pixel electrodes. Specifically, the coloring films 340R, 340G, and 340B may be provided over and in contact with the pixel electrodes 320R, 320G, and 320B, respectively. In this case, the alignment film 335 is provided over the coloring films 340R, 340G, and 340B, and the alignment film 336 is provided over the common electrode 345. Such a structure helps suppress crosstalk in which light reflected by the pixel electrode in one pixel (e.g., the pixel 70B) passes through the coloring film of the adjacent pixel (e.g., the pixel 70G), leading to suppression of the viewing angle dependence of the reflective liquid crystal display device. Furthermore, with such a structure, a coloring film does not need to be provided on the substrate 303 side. This can reduce alignment accuracy required when the substrate 302 and the substrate 303 are bonded to each other. Consequently, the yield in the manufacture of the liquid crystal display device can be increased.

In addition to the structure in FIG. 23, an overcoat film may be provided over the coloring film, and a conductive film may be provided over the insulating film. A liquid crystal display device illustrated in FIG. 24 includes an overcoat film 337 and conductive films 325R, 325G, and 325B over the coloring films 340R, 340G, and 340B. The conductive film 325R is electrically connected to the pixel electrode 320R through an opening formed in the overcoat film 337 and the coloring film 340R. The conductive film 325G is electrically connected to the pixel electrode 320G through an opening formed in the overcoat film 337 and the coloring film 340G. The conductive film 325B is electrically connected to the pixel electrode 320B through an opening formed in the overcoat film 337 and the coloring film 340B.

The conductive films 325R, 325G, and 325B are light-transmitting conductive film and can be formed using a material similar to that of the common electrode 345, for example. In the liquid crystal display device illustrated in FIG. 24, for example, the liquid crystal element 51B in the pixel 70B is composed of the conductive film 325B, the common electrode 345, and the liquid crystal layer 341 between the conductive film 325B and the common electrode 345. The conductive films 325R, 325G, and 325B each have a function as a pixel electrode. The pixel electrodes 320R, 320G, and 320B each have a function as a reflective film.

The transistors 50R, 50G, and 50B can be formed with the same material and the same forming method as the transistor 150 described in Embodiment 1. The transistor 270 described in Embodiment 6 may be used for the transistors 50R, 50G, and 50B.

Figure 25:
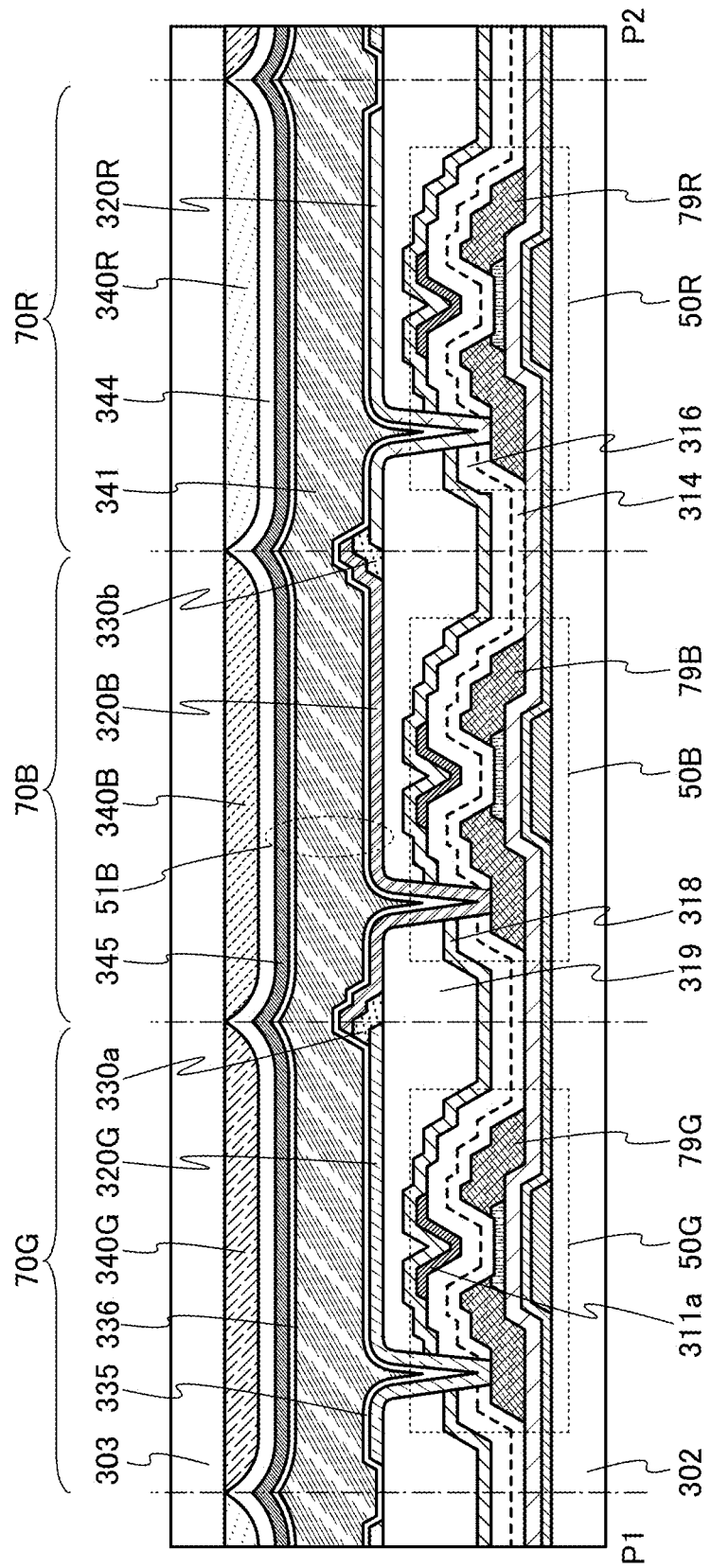
FIG. 25 is a cross-sectional view illustrating one embodiment of a liquid crystal display device.

Note that the transistors 50R, 50G, and 50B each preferably include a second gate electrode as illustrated in FIG. 25. The second gate electrode can be provided between a semiconductor layer in the transistor and the pixel electrode so as to overlap with the semiconductor layer. For example, the second gate electrode can be formed with the same material and at the same time as the oxide semiconductor film 311R. The liquid crystal display device 80 illustrated in FIG. 25 is different from that in FIG. 15 in that the transistors 50R, 50G, and 50B each include an oxide semiconductor film 311a that serves as a second gate electrode. The second gate electrode included in each of the transistors 50R, 50G, and 50B contributes to preventing changes in the potential of the pixel electrode from influencing the characteristics of the transistor in the case where the semiconductor layer and the pixel electrode are located close to each other. Providing the pixel electrode also in the position overlapping with the transistor leads to an increase in the aperture ratio of the liquid crystal display device 80.

Capacitors included in the pixels 70R, 70G, and 70B can be formed with the same material and the same forming method as the capacitor 160 described in Embodiment 1. In each of the capacitors, the insulating film 318 and the insulating film 319 serve as dielectric films.

The pixel electrodes 320R, 320G, and 320B can be formed with the same material and the same forming method as the conductive film 120 described in Embodiment 1. A material that transmits visible light is used for the common electrode 345, for example. Specifically, a material including one of indium (In), zinc (Zn), and tin (Sn) is preferably used. Furthermore, the common electrode 345 can be formed using, for example, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added. The common electrode 345 can be formed by a sputtering method, for example.

As the insulating film 344, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

Note that the structures, the methods, and the like described in this embodiment can be combined as appropriate with any of the structures, the methods, and the like described in the other embodiments.

(Embodiment 5)

In this embodiment, an example of an oxide semiconductor that can be used for the transistor and the capacitor of the liquid crystal display device of one embodiment of the present invention will be described.

The structure of an oxide semiconductor will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time contains a void and has an unstable structure. For this reason, an a-like OS has physical properties similar to those of an amorphous oxide semiconductor.

<CAAC-OS>

First, a CAAC-OS will be described.

A CAAC-OS is an oxide semiconductor having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 26A:
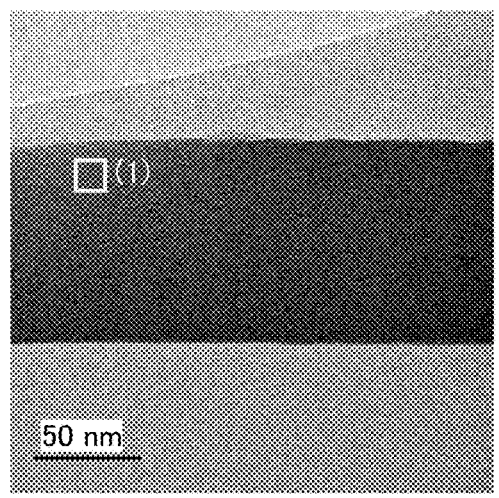
FIGS. 26A to 26D are Cs-corrected high-resolution TEM images of a cross section of a CAAC-OS and a cross-sectional schematic view of the CAAC-OS.

The CAAC-OS observed with a TEM will be described below. FIG. 26A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 26B:
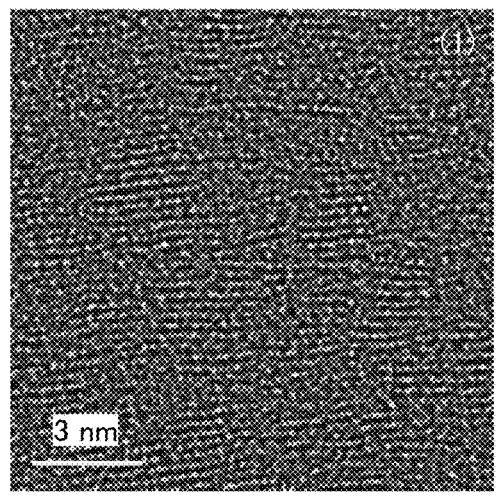

FIG. 26B is an enlarged Cs-corrected high-resolution TEM image of a region (1) in FIG. 26A. FIG. 26B shows that metal atoms are arranged in a layered manner in a pellet. Each metal atom layer has a configuration reflecting unevenness of a surface over which the CAAC-OS is formed (hereinafter, the surface is referred to as a formation surface)

or a top surface of the CAAC-OS, and is arranged parallel to the formation surface or the top surface of the CAAC-OS.

Figure 26C:
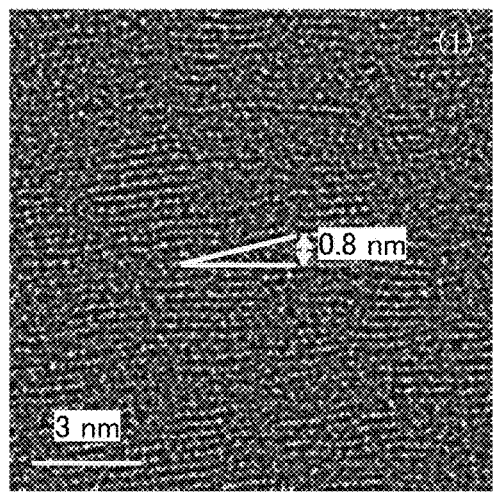

As shown in FIG. 26B, the CAAC-OS has a characteristic atomic arrangement. The characteristic atomic arrangement is denoted by an auxiliary line in FIG. 26C. FIGS. 26B and 26C prove that the size of a pellet is greater than or equal to 1 nm or greater than or equal to 3 nm, and the size of a space caused by the tilt of the pellets is approximately 0.8 nm. Therefore, the pellet can also be referred to as a nanocrystal (nc). Note that a CAAC-OS can be referred to as an oxide semiconductor including c-axis aligned nanocrystals (CANC).

Figure 26D:
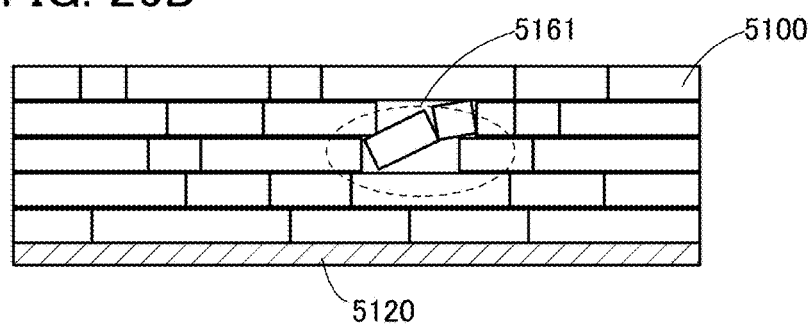

Here, according to the Cs-corrected high-resolution TEM images, the schematic arrangement of pellets 5100 of a CAAC-OS over a substrate 5120 is illustrated by such a structure in which bricks or blocks are stacked (see FIG. 26D). The part in which the pellets are tilted as observed in FIG. 26C corresponds to a region 5161 illustrated in FIG. 26D.

FIG. 27A shows a Cs-corrected high-resolution TEM image of a plane of the CAAC-OS film observed from the direction substantially perpendicular to the sample surface. FIGS. 27B, 27C, and 27D are enlarged Cs-corrected high-resolution TEM images of regions (1), (2), and (3) in FIG. 27A, respectively. FIGS. 27B, 27C, and 27D indicate that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) will be described. For example, when the structure of a CAAC-OS including an InGaZnO$_4$ crystal is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in the direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. In a preferable CAAC-OS whose structure is analyzed by an out-of-plane method, a peak appears when 2θ is around 31° and no peak appears when 2θ is around 36°.

On the other hand, in structural analysis of the CAAC-OS by an in-plane method in which an X-ray is incident on a sample in the direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 28B, a peak is not clearly observed. In contrast, in the case of a single crystal oxide semiconductor of InGaZnO$_4$, when φ scan is performed with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in the direction parallel to the sample surface, such a diffraction pattern (also referred to as a selected-area transmission electron diffraction pattern) as is shown in FIG. 29A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 29B shows a diffraction pattern obtained in such a manner that an electron beam with a probe diameter of 300 nm is incident on the same sample in the direction perpendicular to the sample surface. As shown in FIG. 29B, a ring-like diffraction pattern is observed. Thus, the electron diffraction also indicates that the a-axes and b-axes of the pellets included in the CAAC-OS do not have regular alignment. The first ring in FIG. 29B is considered to be derived from the (010) plane, the (100) plane, and the like of the InGaZnO$_4$ crystal. The second ring in FIG. 29B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. Furthermore, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, more preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is subjected to analysis by an out-of-plane method using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Furthermore, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation will be described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts. Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 30:
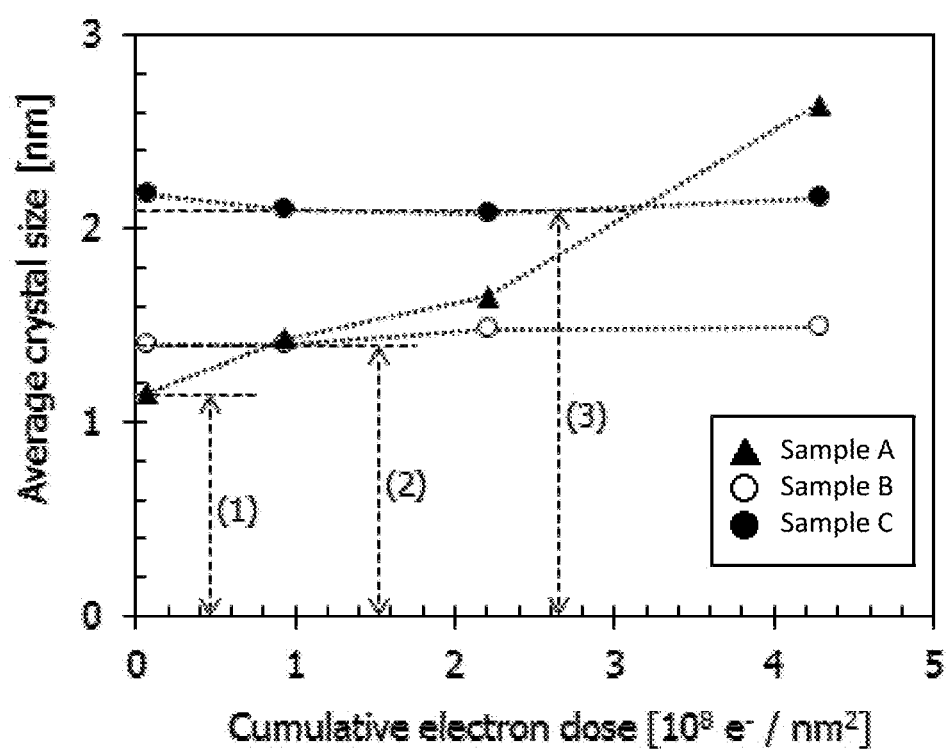
FIG. 30 shows changes in crystal part of an In—Ga—Zn oxide induced by electron irradiation.

FIG. 30 shows change in the average size of crystal parts (at 22 points to 45 points) in each sample. Note that the crystal part size corresponds to the length of a lattice fringe. FIG. 30 indicates that the crystal part size in the a-like OS increases with an increase in the cumulative electron dose. Specifically, as shown by (1) in FIG. 30, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 30, the average size of crystal parts in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

<Method for Forming CAAC-OS>

Figure 31:
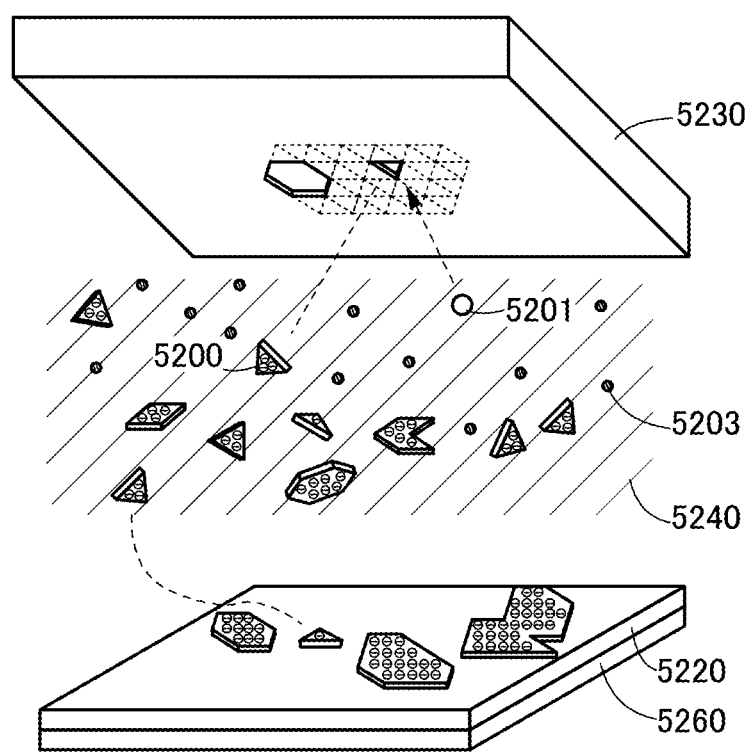
FIG. 31 illustrates a deposition method for a CAAC-OS.

An example of a method for forming a CAAC-OS film will be described below. FIG. 31 is a schematic view of the inside of a deposition chamber. The CAAC-OS film can be formed by a sputtering method.

As shown in FIG. 31, a substrate 5220 and a target 5230 are arranged to face each other. Plasma 5240 is generated between the substrate 5220 and the target 5230. A heating mechanism 5260 is provided under the substrate 5220. Although not illustrated, a target 5230 is attached to a backing plate. A plurality of magnets is provided to face the target 5230 with the backing plate positioned therebetween. A sputtering method in which the disposition rate is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a certain voltage or higher to the target 5230, and plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Here, the target 5230 has a polycrystalline structure which includes a plurality of crystal grains and in which a cleavage plane exists in any of the crystal grains. FIGS. 32A to 32C show a crystal structure of $InMZnO_4$ (the element M is Al, Ga, Y, or Sn, for example) included in the target 5230 as an example. Note that FIG. 32A illustrates the crystal structure of $InMZnO_4$ observed from the direction parallel to the b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 which is a flat-plate-like or pellet-like sputtered particles is separated from the cleavage plane (FIG. 31). The pellet 5200 is between the two cleavage planes shown in FIG. 32A. Thus, when the pellet 5200 is observed, the cross-section thereof is as shown in FIG. 32B, and the top surface thereof is as shown in FIG. 32C. Note that the structure of the pellet 5200 may be distorted by an impact of collision of the ion 5201.

The pellet 5200 is a flat-plate-like (pellet-like) sputtered particle having a triangle plane, e.g., a regular triangle plane. Alternatively, the pellet 5200 is a flat-plate-like (pellet-like) sputtered particle having a hexagonal plane, e.g., regular hexagonal plane. The shape of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 100 nm, preferably greater than or equal to 2 nm and less than or equal to 50 nm, more preferably greater than or equal to 3 nm and less than or equal to 30 nm. For example, the ion 5201 collides with the target 5230 including the In-M-Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The surface of the pellet 5200 may be negatively or positively charged when the pellet 5200 passes through the plasma 5240. For example, the pellet 5200 may receive a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particles 5203 that have passed through the plasma 5240 reach a surface of the substrate 5220. Note that some of the particles 5203 are discharged to the outside by a vacuum pump or the like because of their smallness in mass.

Next, deposition of the pellet 5200 and the particle 5203 on the surface of the substrate 5220 will be described with reference to FIGS. 33A to 33F.

First, a first pellet 5200 is deposited on the substrate 5220. Since the pellet 5200 has a flat-plate-like shape, it is deposited so that its flat plane faces the surface of the substrate 5220. At this time, charge on a surface of the pellet 5200 on the substrate 5220 side is lost through the substrate 5220.

Next, a second pellet 5200 reaches the substrate 5220. Since a surface of the first pellet 5200 and a surface of the second pellet 5200 are charged, they repel each other. As a result, the second pellet 5200 avoids being deposited on the first pellet 5200, and is deposited with its flat plane facing the surface of the substrate 5220 so as to be a little distance away from the first pellet 5200. With repetition of this, millions of the pellets 5200 are deposited on the surface of the substrate 5220 to have a thickness of one layer. A region where no pellet 5200 is deposited is generated between adjacent pellets 5200 (see FIG. 33A).

Then, the particles 5203 that have received energy from plasma reach the surface of the substrate 5220. The particles 5203 cannot be deposited on an active region such as the surfaces of the pellets 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 33B).

Figure 33A:
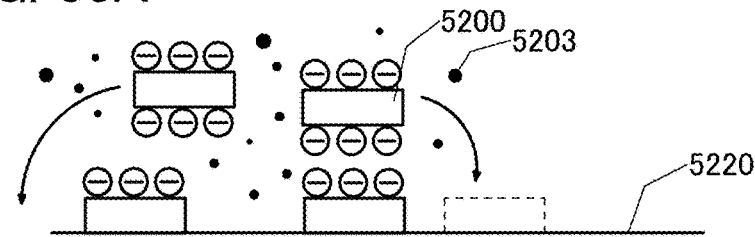
FIGS. 33A to 33F illustrate a deposition method for a CAAC-OS.
Figure 33B:
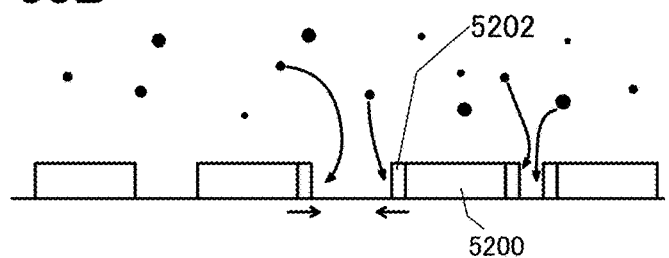
Figure 33C:
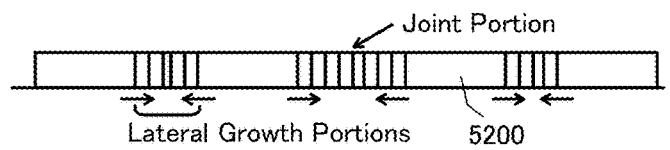

The lateral growth portions 5202 then further grow laterally so that the pellets 5200 are anchored to each other (see FIG. 33C). In this manner, the lateral growth portions 5202 are formed until they fill regions where no pellet 5200 is deposited. This mechanism is similar to a deposition mechanism for an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. Regions filling the gaps between the crystal regions are distorted crystal regions, and thus, it will not be appropriate to say that the regions have an amorphous structure.

Figure 33D:
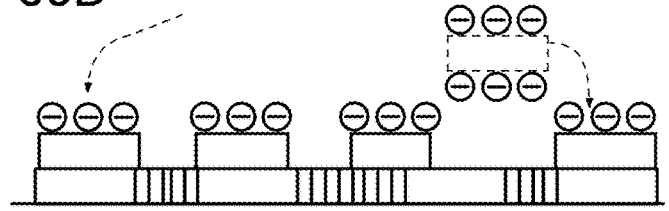
Figure 33E:
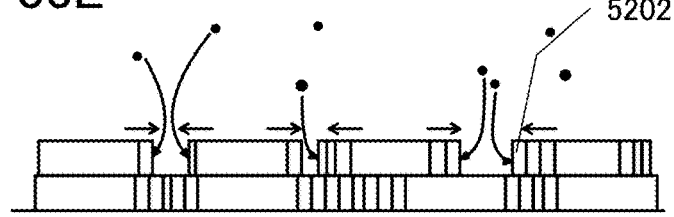
Figure 33F:
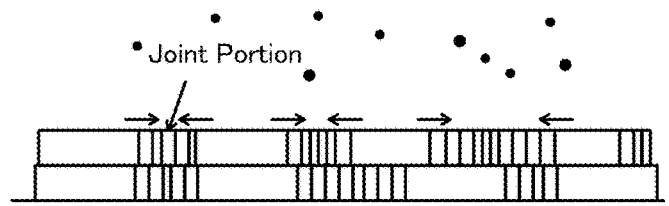

Next, new pellets 5200 are deposited with their flat planes facing the surface of the substrate 5220 (see FIG. 33D). After that, the particles 5203 are deposited so as to fill regions where no pellet 5200 is deposited, thereby forming the lateral growth portions 5202 (see FIG. 33E). In such a manner, the particles 5203 are attached to side surfaces of the pellets 5200 and the lateral growth portions 5202 cause a lateral growth so that the pellets 5200 in the second layer are anchored to each other (see FIG. 33F). Deposition continues until the m-th layer (m is an integer of two or more) is formed; as a result, a layered thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, the proportion of the pellets 5200 that are directly connected with each other without the particles 5203 increases, whereby a CAAC-OS film with high orientation is made. The surface temperature of the substrate 5220 for formation of the CAAC-OS film is higher than or equal to room temperature and lower than 340° C., preferably higher than or equal to room temperature and lower than or equal to 300° C., more preferably higher than or equal to 100° C. and lower than or equal to 250° C., still more preferably higher than or equal to 100° C. and lower than or equal to 200° C. Therefore, even when a large-sized substrate of the 8th generation or more is used as the substrate 5220, a warp or the like due to the formation of the CAAC-OS film hardly occurs.

In contrast, if the surface temperature of the substrate 5220 is low, the migration of the pellets 5200 over the substrate 5220 does not easily occur. As a result, the pellets 5200 are stacked to form an nc-OS or the like with low orientation. In the nc-OS, the pellets 5200 are possibly deposited with certain gaps when the pellets 5200 are negatively charged. Therefore, the nc-OS has low orientation but some regularity, and thus it has a denser structure than an amorphous oxide semiconductor.

When spaces between pellets are extremely small in a CAAC-OS, the pellets may apparently form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are considered to be deposited on the surface of the substrate according to such a deposition model. A CAAC-OS film can be formed even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS film can be formed.

In addition, even when the surface of the substrate (formation surface) has an uneven shape, the pellets are aligned along the shape.

The above-described deposition model suggests that a CAAC-OS film with high crystallinity can be formed in the following manner: deposition is performed in a high vacuum to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In-M-Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then an M-Zn—O layer is bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

(Embodiment 6)

In this embodiment, a structure example different from that of the transistor described in Embodiment 1 will be described with reference to FIGS. 34A to 34C to FIGS. 37A to 37D.

<Example 1 of Transistor Structure>

Figure 34A:
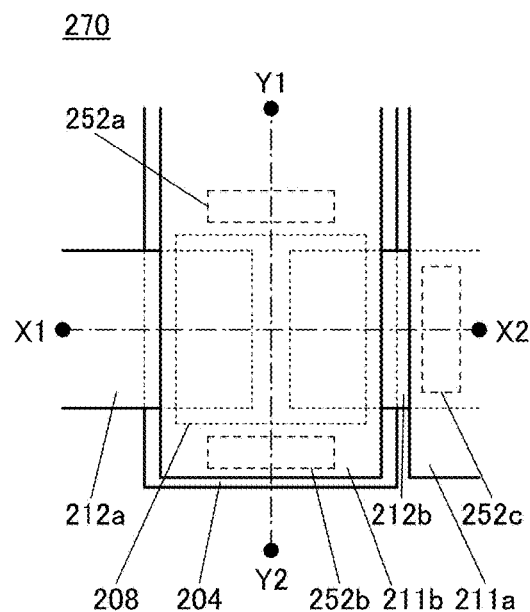
FIGS. 34A to 34C are a top view and cross-sectional views illustrating an example of a transistor.
Figure 34B:
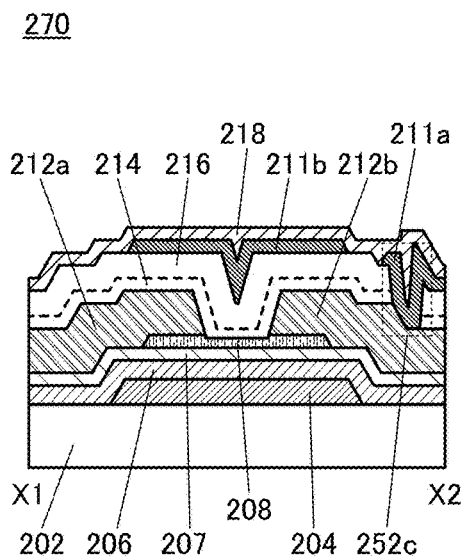
Figure 34C:
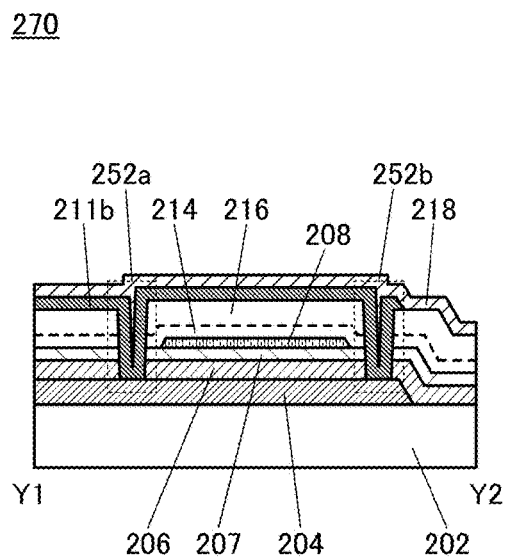

FIG. 34A is a top view of a transistor 270. FIG. 34B is a cross-sectional view taken along the dashed-dotted line X1-X2 in FIG. 34A, and FIG. 34C is a cross-sectional view taken along the dashed-dotted line Y1-Y2 in FIG. 34A. Note that the direction of the dashed dotted line X1-X2 may be called the channel length direction, and the direction of the dashed dotted line Y1-Y2 may be called the channel width direction.

The transistor 270 includes the conductive film 204 functioning as a first gate electrode over the substrate 202, the insulating film 206 over the substrate 202 and the conductive film 204, the insulating film 207 over the insulating film 206, the oxide semiconductor film 208 over the insulating film 207, the conductive film 212*a* functioning as a source electrode electrically connected to the oxide semiconductor film 208, the conductive film 212*b* functioning as a drain electrode electrically connected to the oxide semiconductor film 208, the insulating films 214 and 216 over the oxide semiconductor film 208 and the conductive films 212a and 212b, and the oxide semiconductor film 211b over the insulating film 216. In addition, the insulating film 218 is provided over the oxide semiconductor film 211b.

In the transistor 270, the insulating films 214 and 216 function as a second gate insulating film of the transistor 270. The oxide semiconductor film 211a is connected to the conductive film 212b through an opening 252c provided in the insulating films 214 and 216. The oxide semiconductor film 211a functions as, for example, a pixel electrode used for a display device. The oxide semiconductor film 211b in the transistor 270 functions as a second gate electrode (also referred to as a back gate electrode).

As illustrated in FIG. 34C, the oxide semiconductor film 211b is connected to the conductive film 204 functioning as a first gate electrode through openings 252a and 252b provided in the insulating films 206, 207, 214, and 216. Accordingly, the oxide semiconductor film 211b and the conductive film 220b are supplied with the same potential.

Note that although the structure in which the openings 252a and 252b are provided so that the oxide semiconductor film 211b and the conductive film 204 are connected to each other is described in this embodiment, one embodiment of the present invention is not limited thereto. For example, a structure in which only one of the openings 252a and 252b is provided so that the oxide semiconductor film 211b and the conductive film 204 are connected to each other, or a structure in which the openings 252a and 252b are not provided and the oxide semiconductor film 211b and the conductive film 204 are not connected to each other may be employed. Note that in the case where the oxide semiconductor film 211b and the conductive film 204 are not connected to each other, it is possible to apply different potentials to the oxide semiconductor film 211b and the conductive film 204.

As illustrated in FIG. 34B, the oxide semiconductor film 208 is positioned to face each of the conductive film 204 functioning as a first gate electrode and the oxide semiconductor film 211b functioning as a second gate electrode, and is sandwiched between the two conductive films functioning as gate electrodes. The length in the channel length direction and the length in the channel width direction of the oxide semiconductor film 211b functioning as a second gate electrode are longer than that in the channel length direction and that in the channel width direction of the oxide semiconductor film 208, respectively. The whole oxide semiconductor film 208 is covered with the oxide semiconductor film 211b with the insulating films 214 and 216 positioned therebetween. Since the oxide semiconductor film 211b functioning as a second gate electrode is connected to the conductive film 204 functioning as a first gate electrode through the openings 252a and 252b provided in the insulating films 206 and 207 and the insulating films 214 and 216, a side surface of the oxide semiconductor film 208 in the channel width direction faces the oxide semiconductor film 211b functioning as a second gate electrode with the insulating films 214 and 216 positioned therebetween.

In other words, in the channel width direction of the transistor 270, the conductive film 204 functioning as a first gate electrode and the oxide semiconductor film 211b functioning as a second gate electrode are connected to each other through the openings provided in the insulating films 206 and 207 functioning as first gate insulating films and the insulating films 214 and 216 functioning as second gate insulating films; and the conductive film 204 and the oxide semiconductor film 211b surround the oxide semiconductor film 208 with the insulating films 206 and 207 functioning as first gate insulating films and the insulating films 214 and 216 functioning as second gate insulating films positioned therebetween.

Such a structure enables the oxide semiconductor film 208 included in the transistor 270 to be electrically surrounded by electric fields of the conductive film 204 functioning as a first gate electrode and the oxide semiconductor film 211b functioning as a second gate electrode. A device structure of a transistor, like that of the transistor 270, in which electric fields of a first gate electrode and a second gate electrode electrically surround an oxide semiconductor film where a channel region is formed, can be referred to as a surrounded channel (s-channel) structure.

Since the transistor 270 has the s-channel structure, an electric field for inducing a channel can be effectively applied to the oxide semiconductor film 208 by the conductive film 204 functioning as a first gate electrode; therefore, the current drive capability of the transistor 270 can be improved and high on-state current characteristics can be obtained. Since the on-state current can be increased, it is possible to reduce the size of the transistor 270. In addition, since the transistor 270 is surrounded by the conductive film 204 functioning as a first gate electrode and the oxide semiconductor film 211b functioning as a second gate electrode, the mechanical strength of the transistor 270 can be increased.

<Example 2 of Transistor Structure>

Figure 35A:
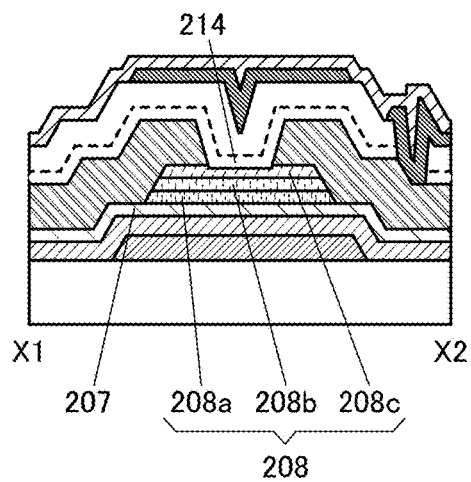
FIGS. 35A to 35D are cross-sectional views illustrating examples of transistors.
Figure 35B:
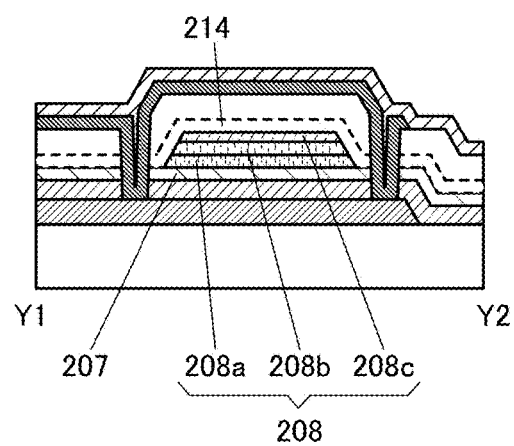
Figure 35C:
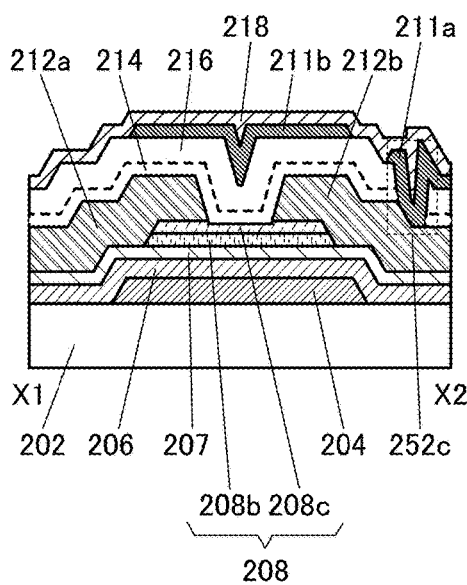
Figure 35D:
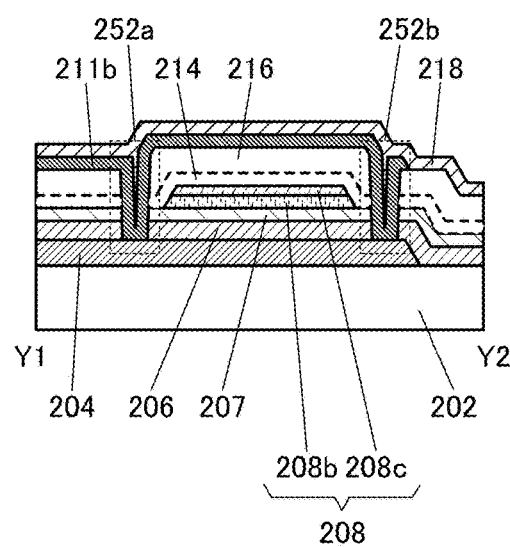

Structure examples different from that of the transistor 270 in FIGS. 34A to 34C will be described with reference to FIGS. 35A to 35D. FIGS. 35A and 35B illustrate a cross-sectional view illustrating a modification example of the transistor 270 in FIGS. 34B and 34C. FIGS. 35C and 35D illustrate a cross-sectional view illustrating another modification example of the transistor 270 in FIGS. 34B and 34C.

A transistor 270A in FIGS. 35A and 35B is different from the transistor 270 in FIGS. 34B and 34C in that the oxide semiconductor film 208 has a three-layer structure. Specifically, the oxide semiconductor film 208 of the transistor 270A includes an oxide semiconductor film 208a, an oxide semiconductor film 208b, and an oxide semiconductor film 208c.

A transistor 270B in FIGS. 35C and 35D is different from the transistor 270 in FIGS. 34B and 34C in that the oxide semiconductor film 208 has a two-layer structure. Specifically, the oxide semiconductor film 208 of the transistor 270B includes the oxide semiconductor film 208b and the oxide semiconductor film 208c.

The structure of the liquid crystal display device in Embodiment 1 can be referred to for the structures of the transistors 270, 270A, and 270B in this embodiment. Thus, the material and the manufacturing method of the substrate 102 can be referred to for those of the substrate 202. The material and the manufacturing method of the gate electrode 104 can be referred to for those of the conductive film 204. The material and the manufacturing method of the insulating film 106 and those of the insulating film 107 can be referred to for those of the insulating film 206 and those of the insulating film 207, respectively. The material and the manufacturing method of the first oxide semiconductor film 110 can be referred to for those of the oxide semiconductor film 208. The material and the manufacturing method of the second oxide semiconductor film 111 can be referred to for those of the oxide semiconductor film 211a and those of the oxide semiconductor film 211b. The material and the manufacturing method of the source electrode 112a and the drain electrode 112b can be referred to for those of the conductive film 212a and the conductive film 212b. The materials and the manufacturing methods of the insulating film 114, those of the insulating film 116, and those of the insulating film 118 can be referred to for those of the insulating film 214, those of the insulating film 216, and those of the insulating film 218, respectively.

Here, a band structure including the oxide semiconductor film 208 and insulating films in contact with the oxide semiconductor film 208 will be described with reference to FIGS. 36A and 36B.

Figure 36A:
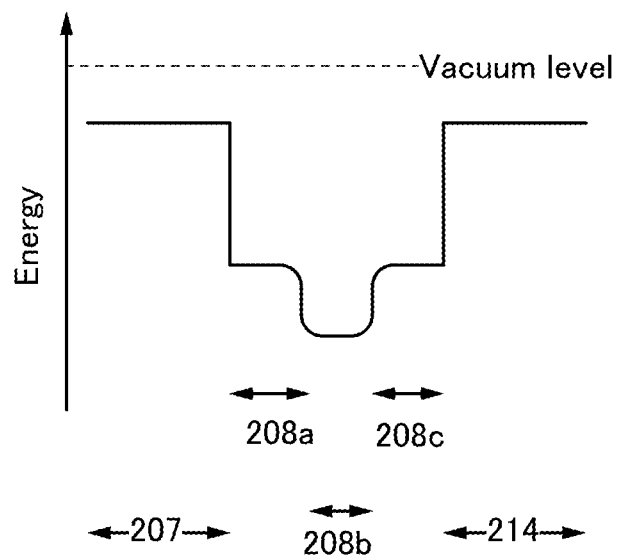
FIGS. 36A and 36B show band structures.

FIG. 36A shows an example of a band structure in the thickness direction of a layered structure including the insulating film 207, the oxide semiconductor films 208a, 208b, and 208c, and the insulating film 214. FIG. 36B shows an example of a band structure in the thickness direction of a layered structure including the insulating film 207, the oxide semiconductor films 208b and 208c, and the insulating film 214. For easy understanding, the energy level of the conduction band minimum (Ec) of each of the insulating film 207, the oxide semiconductor films 208a, 208b, and 208c, and the insulating film 214 is shown in the band structures.

In the band structure of FIG. 36A, a silicon oxide film is used as each of the insulating film 207 and the insulating film 214, an oxide semiconductor film formed using a metal oxide target having an atomic ratio of metal elements, In:Ga:Zn=1:1:1.2, is used as the oxide semiconductor film 208a, an oxide semiconductor film formed using a metal oxide target having an atomic ratio of metal elements, In:Ga:Zn=4:2:4.1, is used as the oxide semiconductor film 208b, and an oxide semiconductor film formed using a metal oxide target having an atomic ratio of metal elements, In:Ga:Zn=1:1:1.2, is used as the oxide semiconductor film 208c.

Figure 36B:
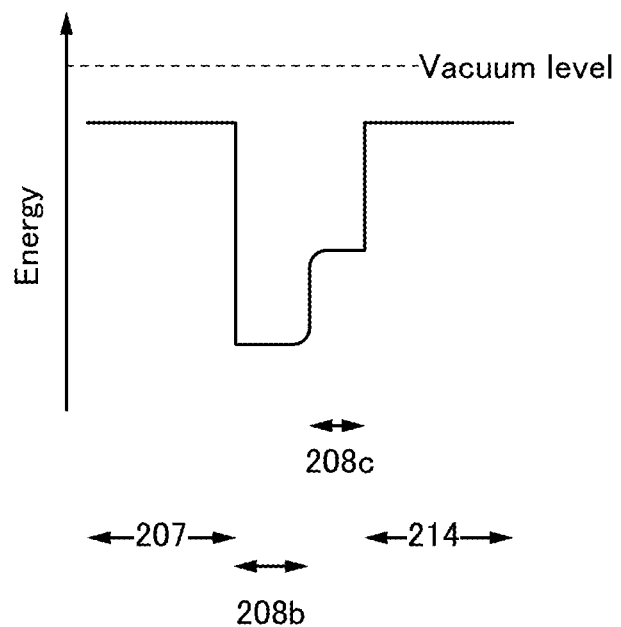

In the band structure of FIG. 36B, a silicon oxide film is used as each of the insulating film 207 and the insulating film 214, an oxide semiconductor film formed using a metal oxide target having an atomic ratio of metal elements, In:Ga:Zn=4:2:4.1, is used as the oxide semiconductor film 208b, and an oxide semiconductor film formed using a metal oxide target having an atomic ratio of metal elements, In:Ga:Zn=1:1:1.2, is used as the oxide semiconductor film 208c.

As illustrated in FIGS. 36A and 36B, the energy level of the conduction band minimum gradually changes between the oxide semiconductor film 208a and the oxide semiconductor film 208b and between the oxide semiconductor film 208b and the oxide semiconductor film 208c. In other words, the energy level of the conduction band minimum is continuously changed or continuously connected. To obtain such a band structure, there exists no impurity, which forms a defect state such as a trap center or a recombination center, at the interface between the oxide semiconductor film 208a and the oxide semiconductor film 208b or at the interface between the oxide semiconductor film 208b and the oxide semiconductor film 208c.

To form a continuous junction between the oxide semiconductor film 208a and the oxide semiconductor film 208b and between the oxide semiconductor film 208b and the oxide semiconductor film 208c, it is necessary to form the films successively without exposure to the air by using a multi-chamber deposition apparatus (sputtering apparatus) provided with a load lock chamber.

With the band structures of FIG. 36A and FIG. 36B, the oxide semiconductor film 208b serves as a well, and a channel region is formed in the oxide semiconductor film 208b in the transistor with the layered structure.

By providing the oxide semiconductor film 208a and the oxide semiconductor film 208c, the oxide semiconductor film 208b can be distanced away from trap states.

In addition, the trap states might be more distant from the vacuum level than the energy level of the conduction band minimum (Ec) of the oxide semiconductor film 208b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 208b. Such a structure inhibits accumulation of electrons in the trap states. As a result, the on-state current and the field-effect mobility of the transistor can be increased.

The energy level of the conduction band minimum of each of the oxide semiconductor films 208a and 208c is closer to the vacuum level than that of the oxide semiconductor film 208b. Typically, a difference in energy level between the conduction band minimum of the oxide semiconductor film 208b and the conduction band minimum of each of the oxide semiconductor films 208a and 208c is 0.15 eV or more or 0.5 eV or more and 2 eV or less or 1 eV or less. That is, the difference between the electron affinity of each of the oxide semiconductor films 208a and 208c and the electron affinity of the oxide semiconductor film 208b is 0.15 eV or more or 0.5 eV or more and 2 eV or less or 1 eV or less.

In such a structure, the oxide semiconductor film 208b serves as a main path of a current. In other words, the oxide semiconductor film 208b serves as a channel region, and the oxide semiconductor films 208a and 208c serve as oxide insulating films. In addition, since the oxide semiconductor films 208a and 208c each include one or more metal elements included in the oxide semiconductor film 208b in which a channel region is formed, interface scattering is less likely to occur at the interface between the oxide semiconductor film 208a and the oxide semiconductor film 208b or at the interface between the oxide semiconductor film 208b and the oxide semiconductor film 208c. Thus, the transistor can have high field-effect mobility because the movement of carriers is not hindered at the interface.

To prevent each of the oxide semiconductor films 208a and 208c from functioning as part of a channel region, a material having sufficiently low conductivity is used for the oxide semiconductor films 208a and 208c. Thus, the oxide semiconductor films 208a and 208c can be referred to as oxide insulating films for such properties and/or functions. Alternatively, a material which has a smaller electron affinity (a difference in energy level between the vacuum level and the conduction band minimum) than the oxide semiconductor film 208b and has a difference in energy level in the conduction band minimum from the oxide semiconductor film 208b (band offset) is used for the oxide semiconductor films 208a and 208c. Furthermore, to inhibit generation of a difference in threshold voltage due to the value of the drain voltage, it is preferable to form the oxide semiconductor films 208a and 208c using a material whose energy level of the conduction band minimum is closer to the vacuum level than that of the oxide semiconductor film 208b. For example, a difference between the energy level of the conduction band minimum of the oxide semiconductor film 208b and the energy level of the conduction band minimum of each of the oxide semiconductor films 208a and 208c is preferably greater than or equal to 0.2 eV, more preferably greater than or equal to 0.5 eV.

It is preferable that the oxide semiconductor films 208a and 208c not have a spinel crystal structure. This is because if the oxide semiconductor films 208a and 208c have a spinel crystal structure, constituent elements of the conductive films 212a and 212b might be diffused to the oxide semiconductor film 208b at the interface between the spinel crystal structure and another region. Note that each of the oxide semiconductor films 208a and 208c is preferably a CAAC-OS film, in which case a higher blocking property against constituent elements of the conductive films 212a and 212b, for example, copper elements, can be obtained.

The thickness of each of the oxide semiconductor films 208a and 208c is greater than or equal to a thickness that is capable of inhibiting diffusion of the constituent elements of the conductive films 212a and 212b to the oxide semiconductor film 208b, and less than a thickness that inhibits supply of oxygen from the insulating film 214 to the oxide semiconductor film 208b. For example, when the thickness of each of the oxide semiconductor films 208a and 208c is greater than or equal to 10 nm, diffusion of the constituent elements of the conductive films 212a and 212b to the oxide semiconductor film 208b can be inhibited. When the thickness of each of the oxide semiconductor films 208a and 208c is less than or equal to 100 nm, oxygen can be effectively supplied from the insulating film 214 to the oxide semiconductor film 208b.

Although the example where an oxide semiconductor film formed using a metal oxide target having an atomic ratio of metal elements, In:Ga:Zn=1:1:1.2, is used as each of the oxide semiconductor films 208a and 208c is described in this embodiment, one embodiment of the present invention is not limited thereto. For example, an oxide semiconductor film formed using a metal oxide target having an atomic ratio of metal elements, In:Ga:Zn=1:1:1, In:Ga:Zn=1:3:2, In:Ga:Zn=1:3:4, or In:Ga:Zn=1:3:6, may be used as each of the oxide semiconductor films 208a and 208c.

When the oxide semiconductor films 208a and 208c are formed using a metal oxide target having an atomic ratio of In:Ga:Zn=1:1:1, the oxide semiconductor films 208a and 208c have an atomic ratio of In:Ga:Zn=1:$\beta$1 (0<$\beta$1≤2):$\beta$2 (0<$\beta$2≤3) in some cases. When the oxide semiconductor films 208a and 208c are formed using a metal oxide target having an atomic ratio of In:Ga:Zn=1:3:4, the oxide semiconductor films 208a and 208c have an atomic ratio of In:Ga:Zn=1:133 (1≤$\beta$3≤5):$\beta$4 (2≤$\beta$4≤6) in some cases. When the oxide semiconductor films 208a and 208c are formed using a metal oxide target having an atomic ratio of In:Ga:Zn=1:3:6, the oxide semiconductor films 208a and 208c have an atomic ratio of In:Ga:Zn=1:135 (1≤$\beta$5≤5):$\beta$6 (4≤$\beta$6≤8) in some cases.

Figure 37A:
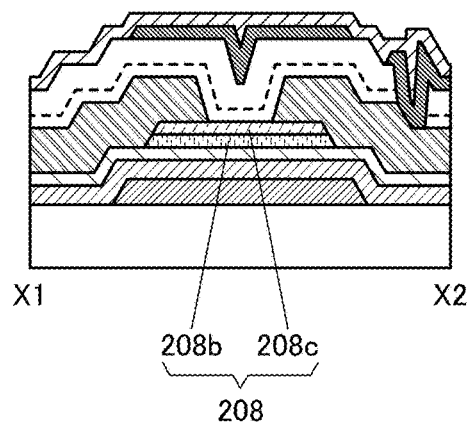
FIGS. 37A to 37D are cross-sectional views illustrating examples of transistors.
Figure 37B:
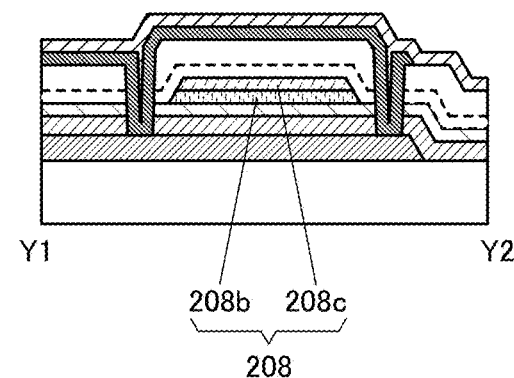

The drawings illustrate an example where the oxide semiconductor film 208 in the transistor 270 and the oxide semiconductor film 208c in the transistors 270A and 270B have a small thickness in a region which does not overlap with the conductive films 212a and 212b, that is, an example where part of the oxide semiconductor film has a depressed portion. However, one embodiment of the present invention is not limited thereto, and the oxide semiconductor film does not necessarily have a depressed region in a region which does not overlap with the conductive films 212a and 212b. FIGS. 37A and 37B illustrate examples in this case. FIGS. 37A and 37B are cross-sectional views illustrating an example of the transistor. FIGS. 37A and 37B illustrate a structure where the oxide semiconductor film 208 in the transistor 270B does not have a depressed portion.

Figure 37C:
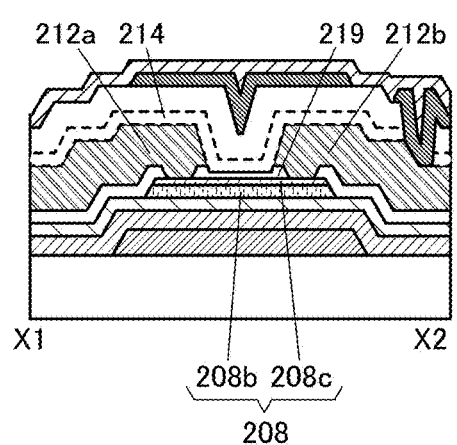
Figure 37D:
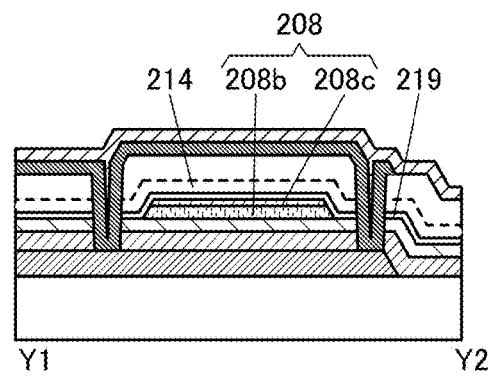

As illustrated in FIGS. 37C and 37D, the oxide semiconductor film 208c may be formed thinner than the oxide semiconductor film 208b in advance, and an insulating film 219 may further be formed over the oxide semiconductor film 208c and the insulating film 207. In that case, an opening for connecting the oxide semiconductor film 208c and the conductive films 212a and 212b is formed in the insulating film 219. The insulating film 219 can be formed with the same material and the same forming method as the insulating film 214.

The structures of the transistors of this embodiment can be freely combined with each other.

The structures, the methods, and the like described in this embodiment can be combined as appropriate with any of the structures, the methods, and the like described in the other embodiments.

(Embodiment 7)

In this embodiment, the structure of a display device of one embodiment of the present invention will be described with reference to FIG. 38 to FIG. 45.

<Structure Example 1 of Display Device>

Figure 38:
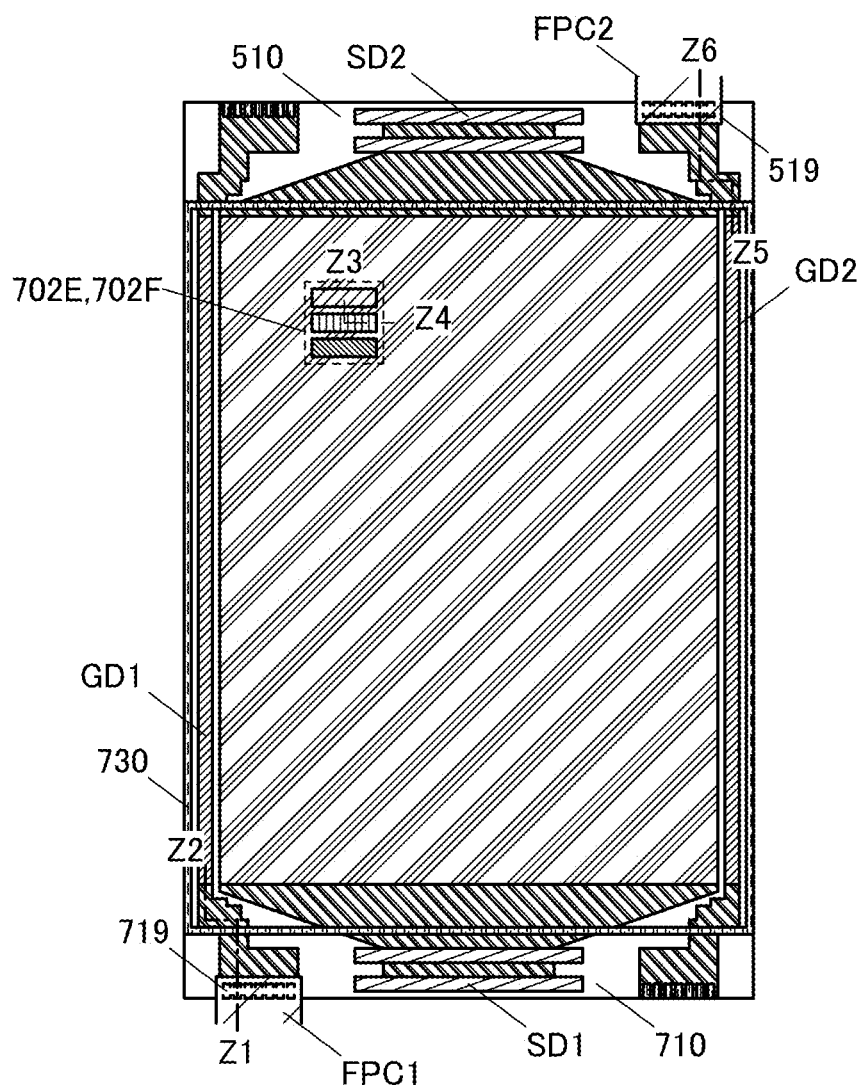
FIG. 38 is a top view illustrating a structure of a display device.
Figure 39:
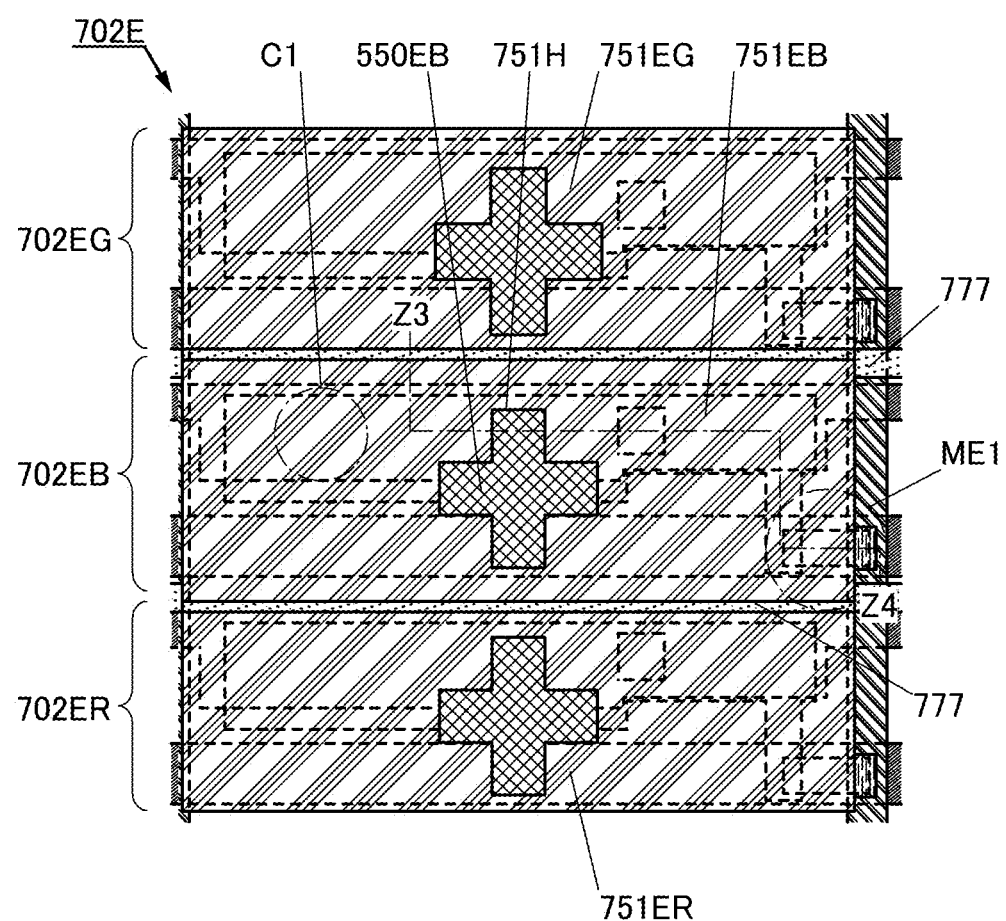
FIG. 39 is a top view illustrating a structure of a pixel provided in a display device.

FIG. 38 is a top view illustrating the structure of the display device of one embodiment of the present invention. FIG. 39 is a top view illustrating the structure of a pixel in the display device of one embodiment of the present invention.

Figure 40:
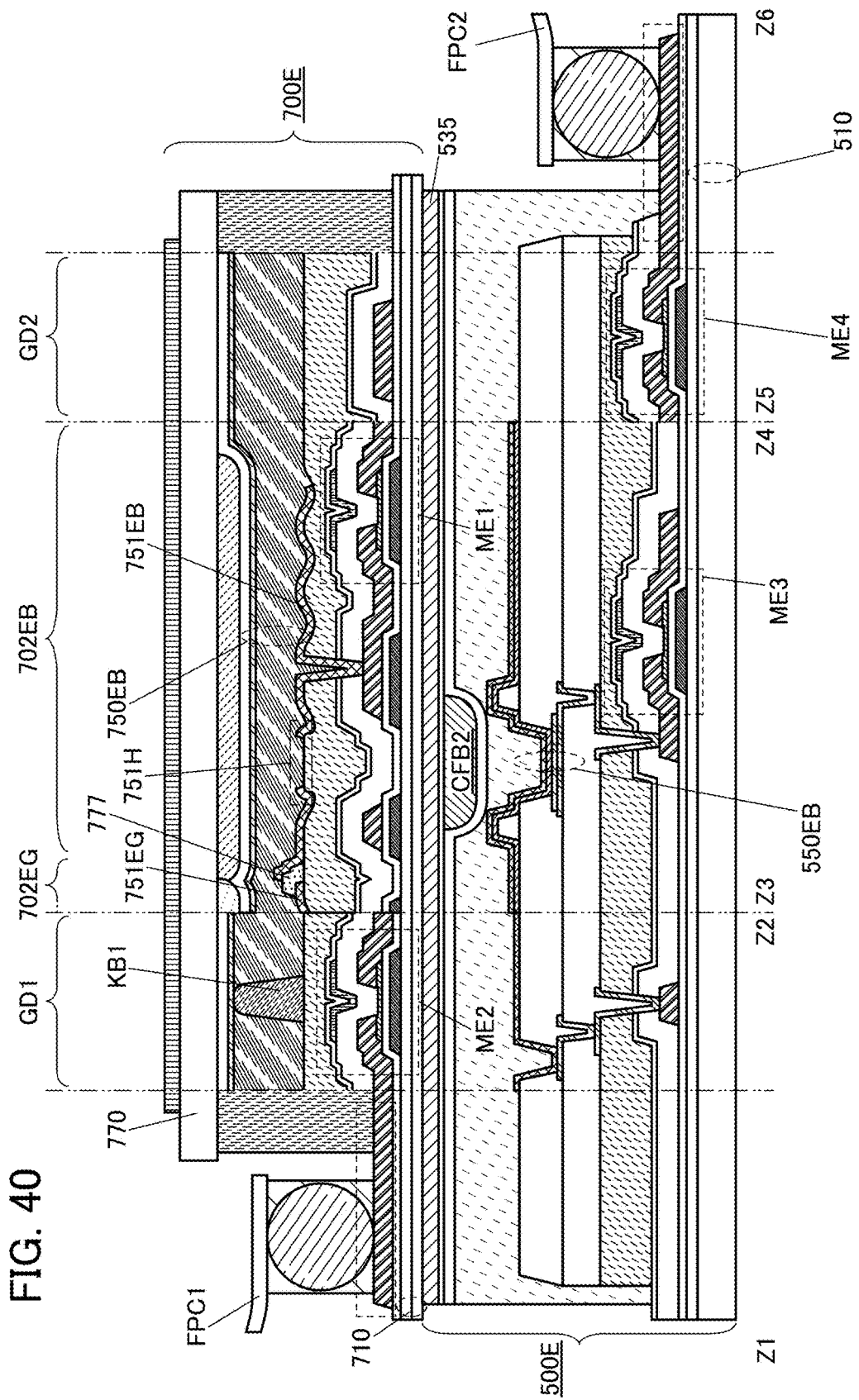
FIG. 40 is a cross-sectional view illustrating a cross-sectional structure of a display device.

FIG. 40 is a cross-sectional view illustrating cross-sectional structures of the display device of one embodiment of the present invention taken along the lines Z1-Z2, Z3-Z4, and Z5-Z6 in FIG. 38.

FIG. 41A is a cross-sectional view illustrating cross-sectional structures of a first display portion 700E of the display device of one embodiment of the present invention taken along the lines Z1-Z2, Z3-Z4, and Z5-Z6 in FIG. 38. FIG. 41B is a cross-sectional view illustrating the structure of a transistor.

Figure 42:
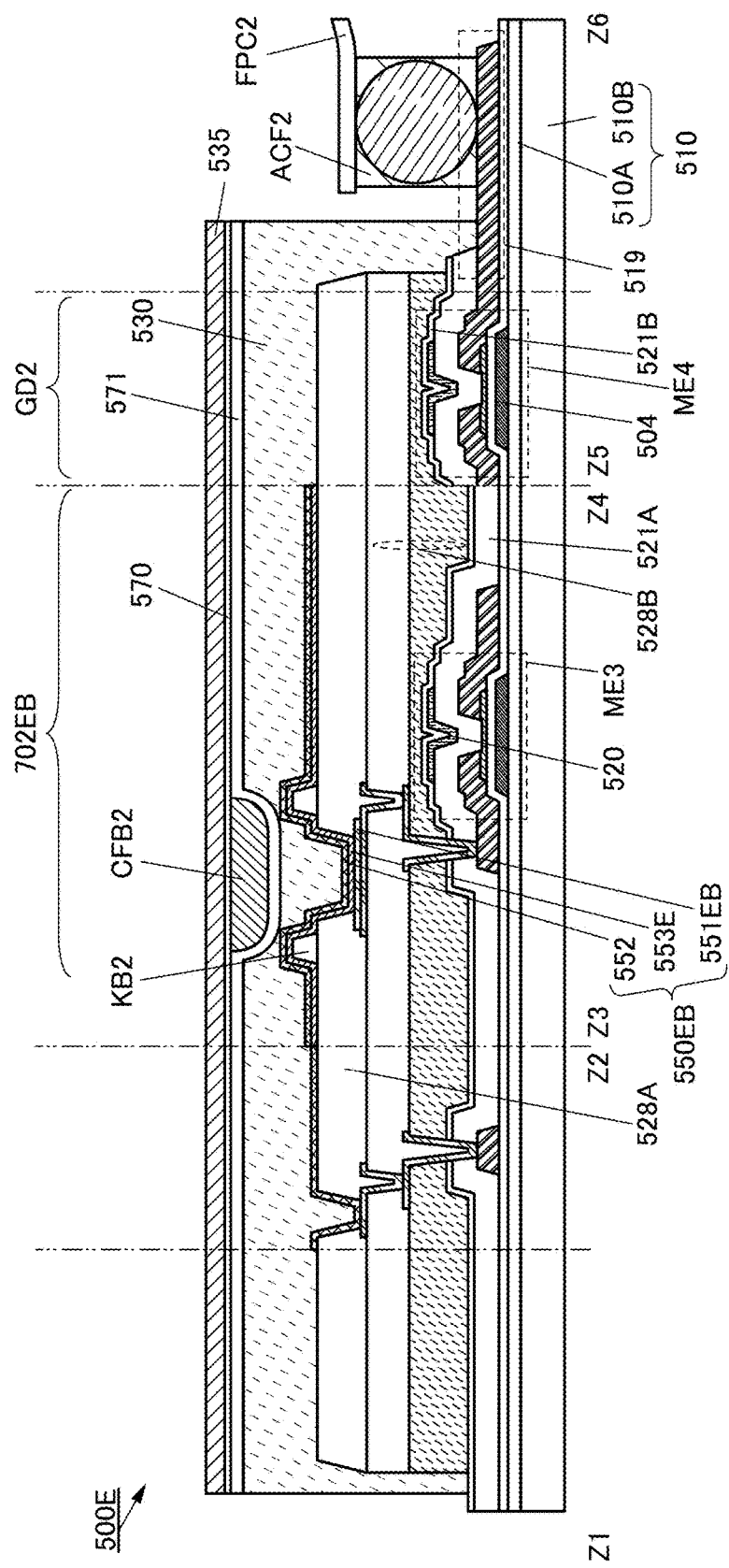
FIG. 42 is a cross-sectional view illustrating a cross-sectional structure of a second display portion of a display device.

FIG. 42 is a cross-sectional view illustrating cross-sectional structures of a second display portion 500E of the display device of one embodiment of the present invention taken along the lines Z1-Z2, Z3-Z4, and Z5-Z6 in FIG. 38.

The display device described in this embodiment includes a pixel 702E and a substrate 710 (see FIG. 38, FIG. 39, and FIG. 40). Note that a sub-pixel 702EB, a sub-pixel 702EG, or a sub-pixel 702ER can be used in the pixel 702E.

The substrate 710 has a function of supporting the pixel 702E (see FIG. 40).

The pixel 702E includes a first display element 750EB and a second display element 550EB that includes a region overlapping with the first display element 750EB (see FIG. 39 and FIG. 40).

The first display element 750EB includes a reflective film (a first conductive film 751EB) that reflects external light and has a function of controlling transmission of external light. The reflective film (the first conductive film 751EB) has an opening 751H.

The second display element 550EB has a function of emitting light to the opening 751H and a region overlapping with the opening 751H.

The first display element 750EB includes a liquid crystal layer 753, the first conductive film 751EB, and a second conductive film 752 (see FIGS. 41A and 41B).

The second display element 550EB includes a layer 553E containing a luminescent organic compound, a third conductive film 551EB, and a fourth conductive film 552 (see FIG. 42).

The area of the opening 751H is, for example, greater than or equal to 5% and less than or equal to 35%, preferably greater than or equal to 15% and less than or equal to 25% of that of the first conductive film 751EB.

The second display element 550EB has a function of emitting light to a region with a shape substantially overlapping with the opening 751H. Note that the region with a shape substantially overlapping with the opening 751H includes a region overlapping with the opening 751H and a region not overlapping with the opening 751H. The area of the region not overlapping with the opening 751H is less than or equal to 20%, preferably less than or equal to 10% of the area of the region overlapping with the opening 751H.

Specifically, the area of the region of the second display element 550EB that emits light is greater than or equal to 0.5 times and less than 1.5 times, preferably greater than or equal to 0.8 times and less than 1.2 times, more preferably greater than or equal to 0.9 times and less than 1.1 times as large as that of the opening 751H.

The above display device includes the sub-pixel 702EB and the substrate 710 that supports the sub-pixel 702EB. The sub-pixel 702EB includes the first display element 750EB (e.g., a reflective liquid crystal element) including a reflective film having the opening 751H as the first conductive film 751EB and the second display element 550EB (e.g., an organic EL element) that emits light to the opening 751H.

This enables the display device to be used as a reflective display device in, for example, an environment where the intensity of external light is high, and to be used as a self-light-emitting display device in, for example, a dim environment. Consequently, the novel display device that has reduced power consumption and is highly convenient or reliable can be provided.

Furthermore, an insulating film is provided between two pixel electrodes of adjacent sub-pixels. Specifically, an insulating film 777 is provided between the first conductive film 751EB included in the sub-pixel 702EB and the first conductive film 751EG included in the sub-pixel 702EG. The first conductive film 751EB and the first conductive film 751EG are insulated from each other by the insulating film 777; thus, a gap does not need to be provided between the first conductive film 751EB and the first conductive film 751EG in the top view. Such a structure helps increase the aperture ratio of the pixels in the first display portion 700E. Furthermore, the increase in the aperture ratio of the pixels enables display images on the first display portion 700E to have high contrast and high luminance.

<Structure>

The display device of one embodiment of the present invention includes the first display portion 700E, the second display portion 500E, and the bonding layer 535 (see FIG. 38 and FIG. 40).

<<First Display Portion 700E>>

The first display portion 700E includes a pixel portion, a wiring portion, a source driver circuit portion SD1, a gate driver circuit portion GD1, and a terminal portion (see FIG. 38 and FIGS. 41A and 41B).

The first display portion 700E further includes the substrate 710, a substrate 770, a structure body KB1, the liquid crystal layer 753, a sealant 730, and an optical film 770P.

The substrate 770 includes a region overlapping with the substrate 710.

The sealant 730 has a function of bonding the substrate 710 and the substrate 770 to each other.

The liquid crystal layer 753 is provided in a region surrounded by the substrate 710, the substrate 770, and the sealant 730.

The structure body KB1 is provided between the substrate 710 and the substrate 770. The structure body KB1 has a function of keeping a predetermined distance between the substrate 710 and the substrate 770.

<<Pixel Portion>>

The pixel portion includes the pixel 702E, the insulating film 771, an insulating film 721A, an insulating film 721B, and an insulating film 728.

For example, a plurality of sub-pixels can be used in the pixel 702E. Specifically, the sub-pixel 702EB, which displays a blue image, the sub-pixel 702EG, which displays a green image, the sub-pixel 702ER, which displays a red image, and the like can be used. In addition, a sub-pixel that displays a white image, a sub-pixel that displays a yellow image, or the like can be used.

For example, when the area of the pixel that displays a blue image is larger than that of the pixel that displays an image of a color other than blue, a white image can favorably be displayed.

<<Pixel>>

The sub-pixel 702EB includes the first display element 750EB, a coloring film CFB1, and a pixel circuit.

<<First Display Element 750EB>>

For example, a display element having a function of controlling transmission or reflection of light can be used as the first display element 750EB. For example, a combined structure of a polarizing plate and a liquid crystal element or a MEMS shutter display element can be used.

Specifically, a liquid crystal element that can be driven by any of the following driving methods can be used: an in-plane-switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

Alternatively, a liquid crystal element that can be driven by a driving method such as a vertical alignment (VA) mode, specifically, a multi-domain vertical alignment (MVA) mode, a patterned vertical alignment (PVA) mode, or an ASV mode can be used.

For example, thermotropic liquid crystal, low-molecular liquid crystal, high-molecular liquid crystal, polymer dispersed liquid crystal, ferroelectric liquid crystal, or antiferroelectric liquid crystal can be used. These liquid crystal materials exhibit a cholesteric phase, a smectic phase, a cubic phase, a chiral nematic phase, an isotropic phase, or the like depending on conditions. Alternatively, a liquid crystal material which exhibits a blue phase can be used.

For example, the first display element 750EB includes the liquid crystal layer 753 containing a liquid crystal material and the first conductive film 751EB and the second conductive film 752 disposed such that an electric field which controls the orientation of the liquid crystal material can be applied.

A conductive material can be used for the first conductive film 751EB.

For example, a material used for the wiring portion can be used for the first conductive film 751EB or the second conductive film 752.

For example, a material that reflects light incident from the liquid crystal layer 753 side can be used for the first conductive film 751EB. This allows the first display element 750EB to serve as a reflective liquid crystal element. Note that the first conductive film 751EB has a function as a pixel electrode.

For example, a conductive film whose surface has projections and depressions may be used for the first conductive film 751EB. In that case, incident light can be reflected in various directions so that a white image can be displayed.

For example, a conductive material that transmits visible light can be used for the second conductive film 752.

For example, a conductive oxide or an indium-containing conductive oxide can be used for the second conductive film 752. Alternatively, a metal film that is thin enough to transmit light can be used as the second conductive film 752.

Specifically, indium oxide, indium tin oxide, indium zinc oxide, zinc oxide, or zinc oxide to which gallium is added can be used for the second conductive film 752.

<<Opening 751H>>

In the first display portion 700F, the opening 751H is formed in the first conductive film 751EB. Part of light incident from the substrate 710 passes through the opening 751H and can be emitted from the substrate 770.

The area of the opening 751H is preferably greater than or equal to 5% and less than or equal to 35%, more preferably greater than or equal to 15% and less than or equal to 25% of that of the first conductive film 751EB.

The opening 751H may have a polygonal shape, a quadrangular shape, an elliptical shape, a circular shape, or a cross shape, for example.

<<First Coloring Film>>

A first coloring film includes a region overlapping with the first display element 750EB and has a function of transmitting light of a predetermined color. The coloring film can be used as a color filter, for example.

For example, the coloring film CFB1, which transmits blue light, can be used in the sub-pixel 702EB. A coloring film CFG1, which transmits green light, can be used in the sub-pixel 702EG. A coloring film that transmits red light can be used in the sub-pixel 702ER. Furthermore, a coloring film that transmits white light and a coloring film that transmits yellow light can be used in sub-pixels for displaying a variety of colors.

<<Light-blocking Film BM>>

A light-blocking film BM having an opening in a region overlapping with the sub-pixel 702EB may be provided.

A material that prevents light transmission can be used for the light-blocking film BM, in which case the light-blocking film BM serves as a black matrix, for example.

<<Pixel Circuit>>

A transistor ME1, a capacitor C1, or the like can be used in the pixel circuit.

The transistor ME1 includes a semiconductor film 718 and a conductive film 704 including a region overlapping with the semiconductor film 718 (see FIG. 41B). The transistor ME1 further includes a conductive film 712A and a conductive film 712B.

Note that the conductive film 712A has one of a function as a source electrode and a function as a drain electrode, and the conductive film 712B has the other. The conductive film 704 serves as a gate electrode, and an insulating film 706 serves as a gate insulating film.

A semiconductor material used for the semiconductor film 718 is not particularly limited, and for example, an oxide semiconductor, silicon or germanium can be used. There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferred that a semiconductor having crystallinity is used, in which case deterioration of the transistor characteristics can be inhibited.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is particularly preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state leakage current of the transistor can be reduced.

For example, the transistor described in Embodiment 1 or Embodiment 6, which is a transistor using an oxide semiconductor, can be used as the transistor ME1.

The capacitor C1 includes the conductive film 712A and a conductive film including a region overlapping with the conductive film 712A (see FIG. 41A).

Note that the conductive film 712A is electrically connected to the first conductive film 751EB.

<<Insulating Film>>

The insulating film 771 is provided between the liquid crystal layer 753 and the coloring films CFB1 and CFG1.

A material having a function of inhibiting diffusion of impurities into the liquid crystal layer 753 from the coloring film CFB1 and the like can be used for the insulating film 771.

The insulating film 721B includes a region overlapping with the conductive film 704 and a region overlapping with the semiconductor film 718.

The insulating film 721A is provided between the semiconductor film 718 and the insulating film 721B (see FIGS. 41A and 41B).

<<Insulating Film 728>>

The insulating film 728 is provided between the insulating film 721B and the liquid crystal layer 753.

The insulating film 728 can eliminate level differences caused by various structures underlying the insulating film 728. Thus, the liquid crystal layer 753 can have a uniform thickness.

For example, an insulating inorganic material, an insulating organic material, or an insulating composite material containing an inorganic material or an organic material can be used for the insulating film 728 (see FIG. 41A).

Specifically, an inorganic oxide film, an inorganic nitride film, an inorganic oxynitride film, or a material obtained by stacking any of these films can be used for the insulating film 728.

Specifically, for the insulating film 728, polyester, polyolefin, polyamide, polyimide, polycarbonate, polysiloxane, an acrylic resin, or the like, or a layered material or a composite material of a plurality of kinds of resins selected from these can be used. Alternatively, a photosensitive material may be used.

<<Insulating Film 777>>

The insulating film 777 is provided so as to cover an end of the pixel electrode. Specifically, the insulating film 777 is provided so as to cover an end of the first conductive film 751EG (see FIG. 39 and FIG. 40). Furthermore, the insulating film 777 is provided so as to cover an end of a first conductive film 751ER (see FIG. 39).

<<Source Driver Circuit Portion SD1>>

For example, an integrated circuit can be used in the source driver circuit portion SD1. Specifically, an integrated circuit formed over a silicon substrate can be used (see FIG. 38).

For example, a chip on glass (COG) method can be used to mount the source driver circuit portion SD1 on a pad provided over the substrate 710. Specifically, an anisotropic conductive film can be used to mount the integrated circuit on the pad.

Note that the pad is electrically connected to the pixel circuit.

<<Gate Driver Circuit Portion GD1>>

For example, a transistor ME2 can be used in the gate driver circuit portion GD1 (see FIGS. 41A and 41B).

For example, the transistor described in Embodiment 1 or Embodiment 6 can be used as the transistor ME2.

For example, a semiconductor film that can be formed through the same process as the semiconductor film 718 included in the transistor ME1 can be used in the transistor ME2.

Note that the transistor ME2 can have the same structure as the transistor ME1. Alternatively, the transistor ME2 may have a structure different from that of the transistor ME1.

<<Conductive Film 720>>

The conductive film 720 includes a region overlapping with the semiconductor film 718. In other words, the semiconductor film 718 is provided between the conductive film 720 and the conductive film 704. This can improve the characteristics or reliability of the transistor ME1 or the transistor ME2.

The conductive film 720 can be used for a second gate electrode of the transistor ME2. The conductive film 720 can be regarded as part of the transistor ME1 or the transistor ME2.

For example, a wiring through which the potential equal to that of the conductive film 704 can be supplied can be electrically connected to the conductive film 720.

For example, a material used for the wiring portion can be used for the conductive film 720. Specifically, conductive oxide, indium-containing conductive oxide, indium oxide, indium tin oxide, indium zinc oxide, indium zinc gallium oxide, zinc oxide, zinc oxide to which gallium is added, or the like can be used for the conductive film 720.

<<Wiring Portion, Terminal Portion>>

The wiring portion includes a signal line 711, and the terminal portion includes a connection electrode 719 (see FIG. 41A).

The signal line 711 is electrically connected to the connection electrode 719. Part of the signal line 711 can be used for the connection electrode 719.

The connection electrode 719 is electrically connected to a flexible printed substrate FPC1 with the use of, for example, a conductive member ACF1.

A conductive material can be used for the signal line 711 and the connection electrode 719.

For example, an inorganic conductive material, an organic conductive material, a metal material, or a conductive ceramic material can be used for the signal line 711 or the connection electrode 719.

Specifically, a metal element selected from aluminum, gold, platinum, silver, copper, chromium, tantalum, titanium, molybdenum, tungsten, nickel, iron, cobalt, palladium, and manganese, or the like can be used for the signal line 711 or the connection electrode 719. Alternatively, an alloy containing any of the above-described metal elements, or the like can be used for the signal line 711 or the connection electrode 719. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be employed for the signal line 711 or the connection electrode 719.

Specifically, a conductive oxide such as indium oxide, indium tin oxide, indium zinc oxide, zinc oxide, or zinc oxide to which gallium is added can be used for the signal line 711 or the connection electrode 719.

Specifically, a film including graphene or graphite can be used for the signal line 711 or the connection electrode 719.

For example, a film including graphene oxide is formed and is subjected to reduction, so that a film including graphene can be formed. As a reducing method, a method using heat, a method using a reducing agent, or the like can be employed.

Specifically, a conductive polymer can be used for the signal line 711 or the connection electrode 719.

<<Conductive Member ACF1>>

For example, solder, a conductive paste, or an anisotropic conductive film can be used for the conductive member ACF1.

Specifically, conductive particles, a material that disperses particles, and the like can be used for the conductive member ACF1.

For example, a spherical, columnar, or filler particle with a size of greater than or equal to 1 μm and less than or equal to 200 μm, preferably greater than or equal to 3 μm and less than or equal to 150 μm can be used.

For example, a particle covered with a conductive material containing nickel, gold, or the like can be used.

Specifically, a particle containing polystyrene, an acrylic resin, titanium oxide, or the like can be used.

For example, synthetic rubber, a thermosetting resin, or a thermoplastic resin can be used for the material that disperses particles.

Thus, the flexible printed substrate FPC1 can be electrically connected to the connection electrode 719 with the use of particles.

<<Substrate 710>>

A light-transmitting material is used for the substrate 710. Alternatively, a material that is reduced in thickness by a polishing method can be used for the substrate 710.

For example, a layered material of a base 710A and an insulating film 710B can be used for the substrate 710. The insulating film 710B has a function of inhibiting diffusion of impurities contained in the base 710A or impurities from the outside.

A material having heat resistance high enough to withstand heat treatment in the manufacturing process can be used for the substrate 710.

For example, a large-sized glass substrate having any of the following sizes can be used as the substrate 710: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 710, an organic material, an inorganic material, a composite material of an organic material and an inorganic material, or the like can be used. For example, an inorganic material such as glass, ceramic, or metal can be used for the substrate 710.

Specifically, non-alkali glass, soda-lime glass, potash glass, crystal glass, quartz, sapphire, or the like can be used for the substrate 710. Specifically, an inorganic oxide film, an inorganic nitride film, an inorganic oxynitride film, or the like can be used for the substrate 710. For example, a silicon oxide film, a silicon nitride film, a silicon oxynitride film, or an aluminum oxide film can be used for the substrate 710. For example, SUS or aluminum can be used for the substrate 710.

For example, a single crystal semiconductor substrate or a polycrystalline semiconductor substrate of silicon or silicon carbide, a compound semiconductor substrate of silicon germanium or the like, or an SOI substrate can be used as the substrate 710. Thus, a semiconductor element can be provided over the substrate 710.

For example, an organic material such as a resin, a resin film, or plastic can be used for the substrate 710. Specifically, a resin film or resin plate of polyester, polyolefin, polyamide, polyimide, polycarbonate, an acrylic resin, or the like can be used for the substrate 710.

For example, a composite material formed by attaching a metal plate, a thin glass plate, or a film of an inorganic material to a resin film or the like can be used for the substrate 710. For example, a composite material formed by dispersing a fibrous or particulate metal, glass, inorganic material, or the like into a resin film can be used for the substrate 710. For example, a composite material formed by dispersing a fibrous or particulate resin, organic material, or the like into an inorganic material can be used for the substrate 710.

Furthermore, a single-layer material or a layered material in which a plurality of layers are stacked can be used for the substrate 710. For example, a layered material in which a base, an insulating film that prevents diffusion of impurities contained in the base, and the like are stacked can be used for the substrate 710. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 710. Alternatively, a layered material in which a resin and a film for preventing diffusion of impurities that penetrate the resin, such as a silicon oxide film, a silicon nitride film, and a silicon oxynitride film are stacked can be used for the substrate 710.

Specifically, a resin film, a resin plate, a stack, or the like of polyester, polyolefin, polyamide, polyimide, polycarbonate, an acrylic resin, or the like can be used for the substrate 710.

Specifically, a material including polyester, polyolefin, polyamide (e.g., nylon or aramid), polyimide, polycarbonate, polyurethane, an acrylic resin, an epoxy resin, a resin having a siloxane bond, or the like can be used for the substrate 710.

Specifically, polyethylene terephthalate (PET), polyethylene naphthalate (PEN), polyethersulfone (PES), acrylic, or the like can be used for the substrate 710.

Alternatively, paper, wood, or the like can be used for the substrate 710.

For example, a flexible substrate can be used as the substrate 710.

Note that a transistor, a capacitor, or the like can be directly formed on the flexible substrate. Alternatively, a transistor, a capacitor, or the like formed on a process substrate having heat resistance can be transferred to a flexible substrate.

<<Substrate 770>>

A light-transmitting material can be used for the substrate 770.

For example, a material that can be used for the substrate 710 can be used for the substrate 770.

<<Sealant 730>>

For the sealant 730, an inorganic material, an organic material, a composite material of an inorganic material and an organic material, or the like can be used.

For example, an organic material such as a thermally fusible resin or a curable resin can be used for the sealant 730.

For example, an organic material such as a reactive curable adhesive, a light curable adhesive, a thermosetting adhesive, and/or an anaerobic adhesive can be used for the sealant 730.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin, or the like can be used for the sealant 730.

<<Optical Film 770P>>

The substrate 770 is located between the optical film 770P and the liquid crystal layer 753. The optical film 770P includes a region overlapping with the first display element 750EB.

For example, a polarizing plate, a retardation plate, a diffusing film, a condensing film, or the like can be used as the optical film 770P.

A hard coat layer that prevents damage can be used as the optical film, for example.

<<Second Display Portion 500E>>

The second display portion 500E includes a pixel portion, a wiring portion, a source driver circuit portion SD2, a gate driver circuit portion GD2, and a terminal portion (see FIG. 38 and FIG. 42).

The second display portion 500E includes a substrate 510, an insulating film 570, a structure body KB2, and a bonding layer 530.

The second display portion 500E further includes a coloring film and an insulating film 571.

The second display portion 500E further includes an insulating film 521A, an insulating film 521B, a partition wall 528A, and an insulating film 528B.

The insulating film 570 includes a region overlapping with the substrate 510.

The bonding layer 530 has a function of bonding the substrate 510 and the insulating film 570 to each other.

The structure body KB2 is provided between the substrate 510 and the insulating film 570. The structure body KB2 has a function of keeping a predetermined distance between the substrate 510 and the insulating film 570.

<<Pixel Portion>>

The pixel portion includes a pixel.

For example, a plurality of sub-pixels can be used in the pixel. Specifically, a sub-pixel that displays a blue image, a sub-pixel that displays a green image, a sub-pixel that displays a red image, and the like can be used. In addition, a sub-pixel that displays a white image, a sub-pixel that displays a yellow image, or the like can be used.

For example, when the area of the pixel that displays a blue image is larger than that of the pixel that displays an image of a color other than blue, a white image can favorably be displayed.

<<Pixel>>

The pixel includes the second display element 550EB, a coloring film CFB2, and a pixel circuit.

<<Second Display Element 550EB>>

The second display element 550EB has a function of emitting light to the opening 751H and a region overlapping with the opening 751H.

A region of the second display element 550EB that has a shape substantially overlapping with the opening 751H emits light (see FIG. 39).

Any of a variety of light-emitting elements can be used as the second display element 550EB. For example, an organic electroluminescence element, an inorganic electroluminescence element, a light-emitting diode, or the like can be used as the second display element 550EB.

For example, the third conductive film 551EB, the fourth conductive film 552 including a region overlapping with the third conductive film 551EB, and the layer 553E containing a luminescent organic compound between the third conductive film 551EB and the fourth conductive film 552 can be used in the second display element 550EB (see FIG. 42).

For example, a stack formed to emit white light can be used as a layer 553E containing a luminescent organic compound. Specifically, a stack of a layer containing a luminescent organic compound containing a fluorescent material that emits blue light and a layer containing a material that is other than a fluorescent material and that emits green light and/or red light can be used as the layer 553E containing a luminescent organic compound.

For example, a material used for the wiring portion can be used for the third conductive film 551EB or the fourth conductive film 552.

For example, a conductive material that reflects visible light can be used for the third conductive film 551EB.

For example, a conductive material that transmits visible light can be used for the fourth conductive film 552.

Specifically, conductive oxide, indium-containing conductive oxide, indium oxide, indium tin oxide, indium zinc oxide, zinc oxide, zinc oxide to which gallium is added, or the like can be used for the fourth conductive film 552.

Alternatively, a metal film that is thin enough to transmit light can be used as the fourth conductive film 552.
<<Second Coloring Film>>

A second coloring film is provided between the opening 751H of the first conductive film 751EB and the second display element 550EB.

The second coloring film includes a region overlapping with the opening 751H and the second display element 550EB and has a function of transmitting light of a predetermined color. For example, a coloring film that transmits light passing through the coloring film CFB1 can be used as the coloring film CFB2. In that case, part of light emitted from the second display element 550EB that passes through the coloring film CFB2, the opening 751H, and the coloring film CFB1 can be extracted to the outside of a display device.

For example, the material that can be used for the coloring film CFB1 can be used for the coloring film CFB2.
<<Pixel Circuit>>

A transistor ME3 or the like can be used in the pixel circuit.

For example, the structure that can be used for the transistor ME1 can be used for the transistor ME3.

For example, the transistor described in Embodiment 1 or Embodiment 6 can be used as the transistor ME3.
<<Insulating Film>>

The insulating film 571 is provided between the coloring film CFB2 and the bonding layer 530.

The insulating film 521B includes a region overlapping with the conductive film 504 and a region overlapping with the semiconductor film.

The insulating film 521A is provided between the semiconductor film and the insulating film 521B (see FIG. 42).
<<Insulating Film 528B>>

The insulating film 528B can eliminate level differences caused by various structures underlying the insulating film 528B.

For example, the material that can be used for the insulating film 728 can be used for the insulating film 528B.
<<Partition Wall 528A>>

The partition wall 528A has an opening in a region overlapping with the second display element 550EB. For example, an insulating material can be used for the partition wall 528A. In that case, the second display element 550EB can be insulated from another structure adjacent to the second display element 550EB. Alternatively, the shape of the second display element can be determined using the shape of the opening formed in the partition wall 528A.

For example, the material that can be used for the insulating film 528B can be used for the partition wall 528A.
<<Source Driver Circuit Portion SD2>>

For example, an integrated circuit can be used in the source driver circuit portion SD2. Specifically, an integrated circuit formed over a silicon substrate can be used (see FIG. 38).

For example, a chip on glass (COG) method can be used to mount the source driver circuit portion SD2 on a pad provided over the substrate 510. Specifically, an anisotropic conductive film can be used to mount the integrated circuit on the pad. Note that the pad is electrically connected to the pixel circuit.
<<Gate Driver Circuit Portion GD2>>

For example, a transistor ME4 can be used in the gate driver circuit portion GD2 (see FIG. 42).

For example, the transistor described in Embodiment 1 or Embodiment 6 can be used as the transistor ME4.

For example, a semiconductor film that can be formed through the same process as the semiconductor film included in the transistor ME3 can be used in the transistor ME4.

Note that the transistor ME4 can have the same structure as the transistor ME3. Alternatively, the transistor ME4 may have a structure different from that of the transistor ME3.
<<Conductive Film 520>>

The conductive film 520 includes a region overlapping with the semiconductor film. In other words, the semiconductor film is provided between the conductive film 520 and the conductive film 504. This can improve reliability of the transistor ME3 or the transistor ME4.

The conductive film 520 can be used for a second gate electrode of the transistor ME4. The conductive film 520 can be regarded as part of the transistor ME3 or the transistor ME4.

For example, a wiring through which the potential equal to that of the conductive film 504 can be supplied can be electrically connected to the conductive film 520.

For example, a material used for the wiring portion can be used for the conductive film 520. Specifically, conductive oxide, indium-containing conductive oxide, indium oxide, indium tin oxide, indium zinc oxide, indium zinc gallium oxide, zinc oxide, zinc oxide to which gallium is added, or the like can be used for the conductive film 520.
<<Wiring Portion, Terminal Portion>>

The wiring portion includes a signal line, and the terminal portion includes a connection electrode 519 (see FIG. 42).

The signal line is electrically connected to the connection electrode 519. Part of the signal line can be used for the connection electrode 519.

The connection electrode 519 is electrically connected to a flexible printed substrate FPC with the use of, for example, a conductive member ACF2.

The material that can be used for the signal line 711 or the connection electrode 719 can be used for the signal line or the connection electrode 519.

<<Conductive Member ACF2>>

The material that can be used for the conductive member ACF1 can be used for the conductive member ACF2.

<<Substrate 510>>

A material having heat resistance high enough to withstand heat treatment in the manufacturing process can be used for the substrate 510.

For example, a layered material of a base 510A and an insulating film 510B can be used for the substrate 510. The insulating film 510B has a function of inhibiting diffusion of impurities contained in the base 510A or impurities from the outside.

For example, a material that can be used for the substrate 710 can be used for the substrate 510. Alternatively, a light-blocking material can be used for the substrate 510.

<<Insulating Film 570>>

For example, a single-layer material or a layered material in which a plurality of layers are stacked can be used for the insulating film 570. For example, a layered material including an insulating film that prevents diffusion of impurities can be used for the insulating film 570. Specifically, a layered material in which a resin and one or a plurality of films that are selected from a silicon oxide layer, a silicon nitride layer, a silicon oxynitride layer, and the like and that prevent diffusion of impurities that pass through the resin and the like are stacked can be used for the insulating film 570.

<<Bonding Layer 530>>

For the bonding layer 530, an inorganic material, an organic material, a composite material of an inorganic material and an organic material, or the like can be used.

For example, a material that can be used for the sealant 730 can be used for the bonding layer 530.

<<Bonding Layer 535>>

For the bonding layer 535, an inorganic material, an organic material, a composite material of an inorganic material and an organic material, or the like can be used.

For example, the material that can be used for the bonding layer 530 can be used for the bonding layer 535.

<<Structure Example 2 of Display Device>>

Another structure of the display device of one embodiment of the present invention will be described with reference to FIG. 38, FIG. 39, and FIG. 43 to FIG. 45.

Figure 43:
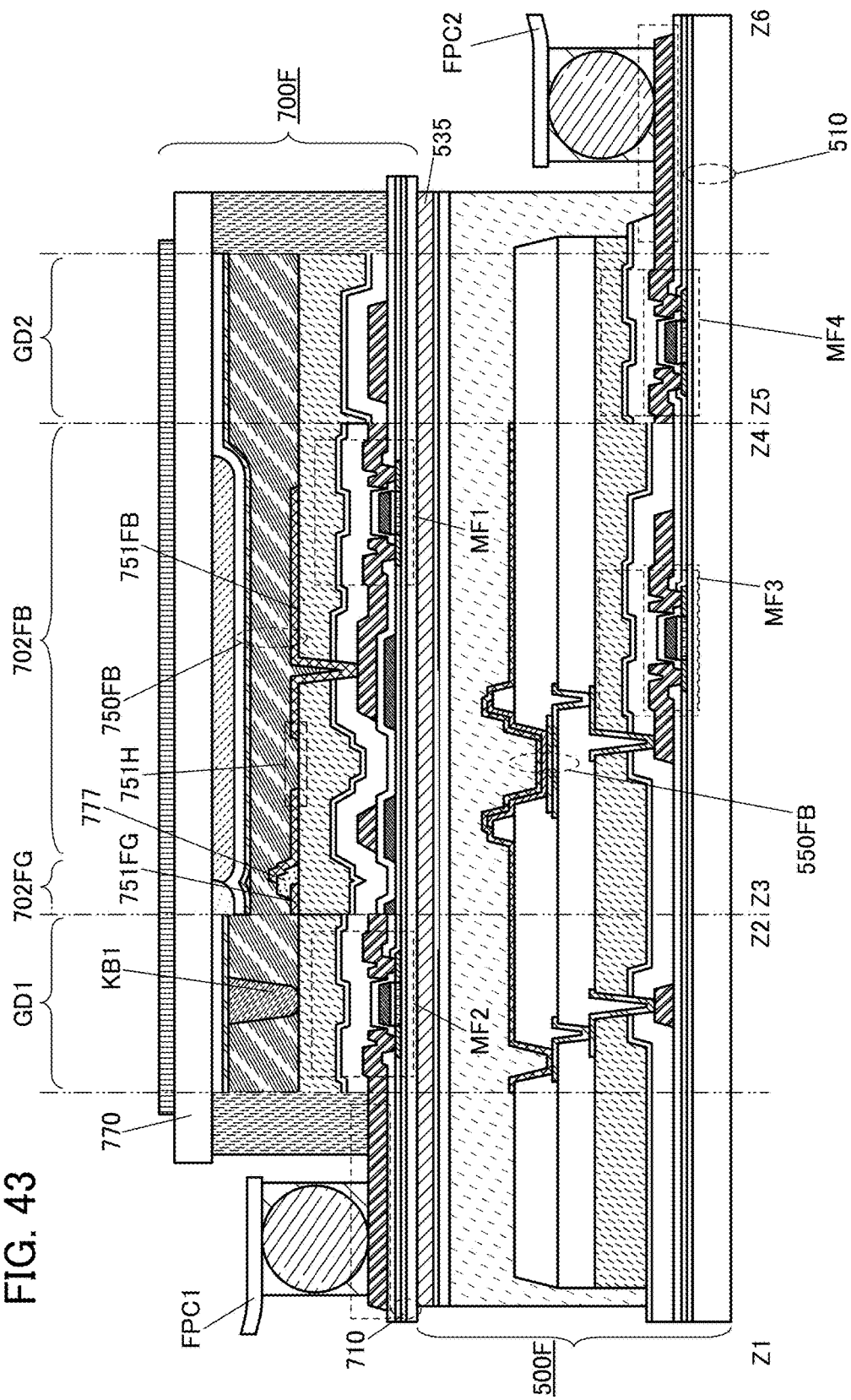
FIG. 43 is a cross-sectional view illustrating a cross-sectional structure of a display device.

FIG. 43 is a cross-sectional view illustrating cross-sectional structures of the display device of one embodiment of the present invention taken along the lines Z1-Z2, Z3-Z4, and Z5-Z6 in FIG. 38.

Figure 44A:
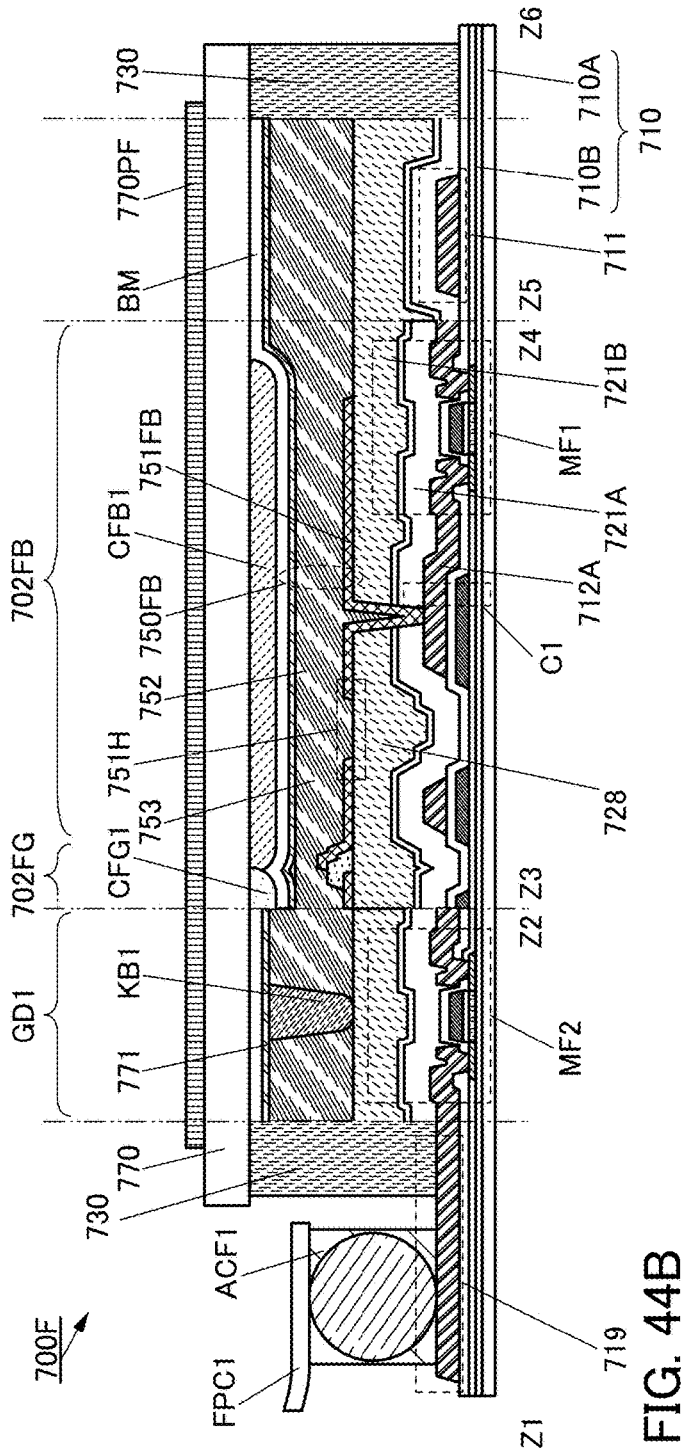
FIGS. 44A and 44B are cross-sectional views illustrating a cross-sectional structure of a first display portion of a display device.
Figure 44B:
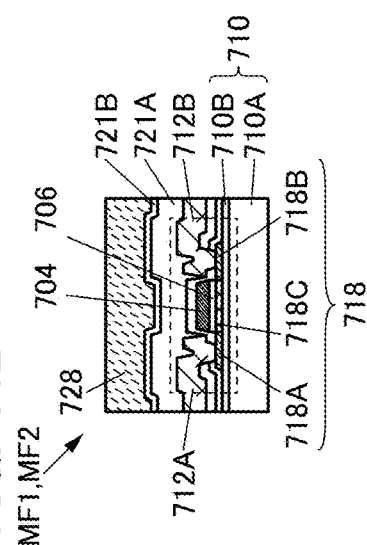

FIG. 44A is a cross-sectional view illustrating cross-sectional structures of a first display portion 700F of the display device of one embodiment of the present invention taken along the lines Z1-Z2, Z3-Z4, and Z5-Z6 in FIG. 38. FIG. 44B is a cross-sectional view illustrating the structure of a transistor.

Figure 45:
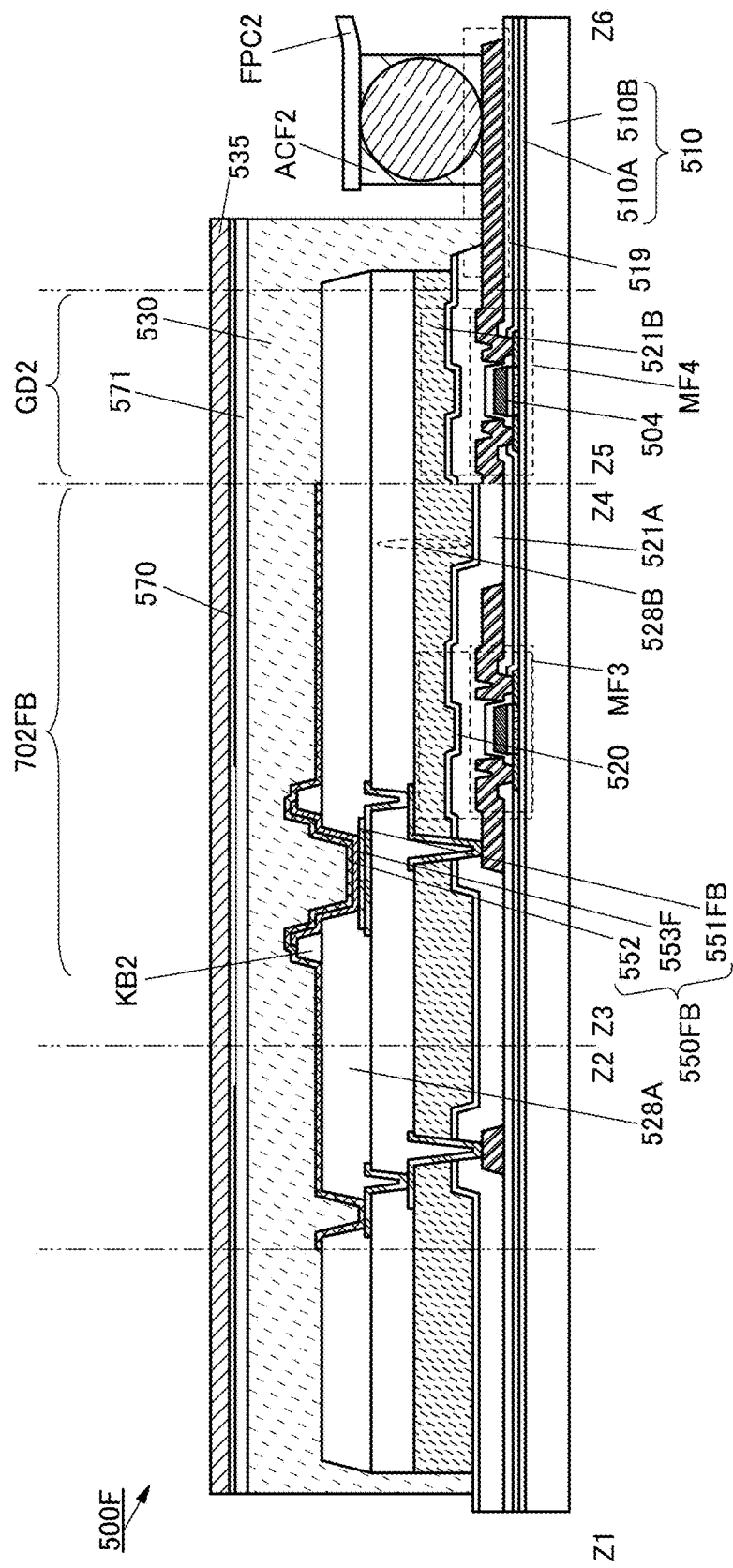
FIG. 45 is a cross-sectional view illustrating a cross-sectional structure of a second display portion of a display device.

FIG. 45 is a cross-sectional view illustrating cross-sectional structures of the display device of one embodiment of the present invention taken along the lines Z1-Z2, Z3-Z4, and Z5-Z6 in FIG. 38.

Structures different from those in the display device described above will be described in detail below, and the above description is referred to for the other similar structures.

<<First Display Portion 700F>>

The first display portion 700F is different from the first display portion 700E described with reference to FIGS. 41A and 41B in that a flat first conductive film 751FB and an optical film 770PF are provided, the structure body KB1 is provided over the substrate 770, and top-gate transistors MF1 and MF2 are provided.

For example, a polarizing plate containing a dichromatic pigment can be used for the optical film 770PF.

<<Second Display Portion 500F>>

The second display portion 500F is different from the second display portion 500E described with reference to FIG. 42 in that the coloring film CFB2 is not provided, a second display element 550FB that emits blue light, green light, red light, or the like is provided, and the top-gate transistors MF1 and MF2 are provided.

In one sub-pixel, the second display element 550FB that emits light of a color different from that emitted from the second display element provided in another sub-pixel is used. For example, the second display element 550FB that emits blue light is used in one sub-pixel, and the second display element that emits green light or red light is used in another sub-pixel.

Specifically, the second display element including a layer 553F containing a luminescent organic compound that emits blue light is used in one sub-pixel. The second display element including a layer containing a luminescent organic compound that emits green light or red light is used in another sub-pixel.

Note that an evaporation method or an ink-jet method using a shadow mask can be employed to form the layers containing luminescent organic compounds. In that case, in one sub-pixel, the second display element 550FB that emits light of a color different from that emitted from the second display element provided in another sub-pixel can be used.

<<Transistor MF1>>

The transistor MF1 includes the conductive film 704 including a region overlapping with the insulating film 710B and the semiconductor film 718 including a region located between the insulating film 710B and the conductive film 704. Note that the conductive film 704 serves as a gate electrode (FIG. 44B).

The semiconductor film 718 includes a first region 718A and a second region 718B that do not overlap with the conductive film 704, and a third region 718C that is located between the first region 718A and the second region 718B and overlaps with the conductive film 704.

The transistor MF1 includes the insulating film 706 between the third region 718C and the conductive film 704. Note that the insulating film 706 serves as a gate insulating film.

The first region 718A and the second region 718B have lower resistance than the third region 718C and serve as source and drain regions.

Note that a method for controlling the resistivity of an oxide semiconductor film that will be described below can be employed for formation of the first region 718A and the second region 718B in the semiconductor film 718. Specifically, plasma treatment using a gas containing a rare gas can be employed. For example, the use of the conductive film 704 as a mask allows part of the shape of the third region 718C to be self-aligned with the shape of an end of the conductive film 704.

The transistor MF1 includes the conductive film 712A in contact with the first region 718A and the conductive film 712B in contact with the second region 718B. The conductive film 712A and the conductive film 712B function as a source electrode and a drain electrode.

A transistor that can be formed in the same process as the transistor MF1 can be used as the transistor MF2.

<Method for Controlling Resistivity of Oxide Semiconductor Film>

The method for controlling the resistivity of an oxide semiconductor film will be described.

An oxide semiconductor film with a predetermined resistivity can be used for the conductive film 720, the first region 718A, or the second region 718B. The method for controlling the resistivity of the second oxide semiconductor film 111 that is described in Embodiment 1 can be referred to for the method for controlling the resistivity of the oxide semiconductor film.

Note that an oxide semiconductor film having higher hydrogen concentration and/or a larger amount of oxygen vacancies and lower resistivity than the semiconductor film 718 is used as the conductive film 720.

The hydrogen concentration in the conductive film 720 is twice or more, preferably ten times or more that in the semiconductor film 718.

The resistivity of the conductive film 720 is greater than or equal to $1\times10^{-8}$ times and less than $1\times10^{-1}$ times that of the semiconductor film 718.

Specifically, the resistivity of the conductive film 720 is higher than or equal to $1\times10^{-3}$ Ω·cm and lower than $1\times10^{4}$ Ω·cm, preferably higher than or equal to $1\times10^{-3}$ Ω·cm and lower than $1\times10^{-1}$ Ω·cm.

Note that this embodiment can be combined with any of the other embodiments in this specification as appropriate.

(Embodiment 8)

In this embodiment, electronic devices each including the liquid crystal display device of one embodiment of the present invention will be described with reference to FIG. 46 and FIGS. 47A to 47H.

Figure 46:
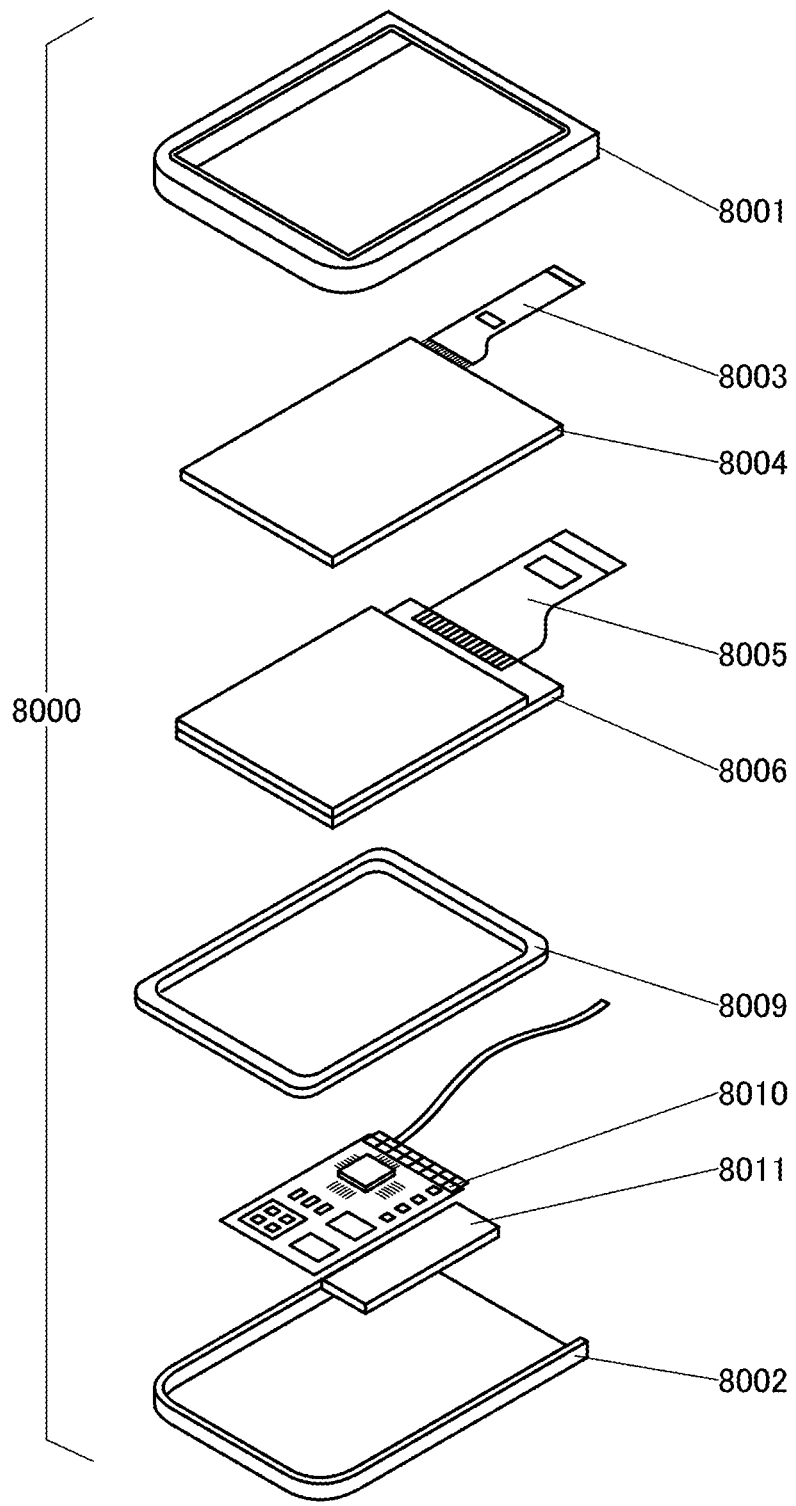
FIG. 46 illustrates an electronic device.

In a display module 8000 illustrated in FIG. 46, a touch panel 8004 connected to an FPC 8003, a display panel 8006 connected to an FPC 8005, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 to form an optical touch panel.

The frame 8009 protects the display panel 8006 and functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 47A to 47H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, an electric field, a current, a voltage, electric power, radiation, a flow rate, humidity, gradient, oscillation, odor, or infrared ray), a microphone 5008, and the like.

Figure 47A:
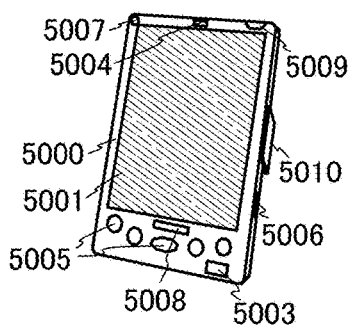
FIGS. 47A to 47H illustrate electronic devices.
Figure 47B:
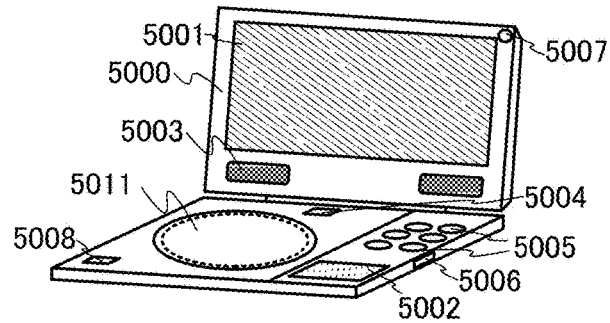
Figure 47C:
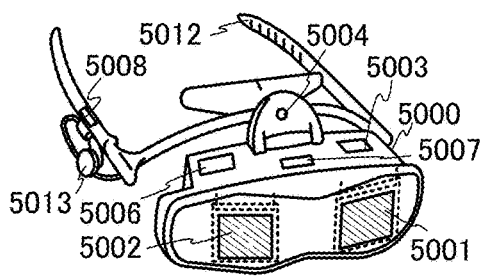
Figure 47D:
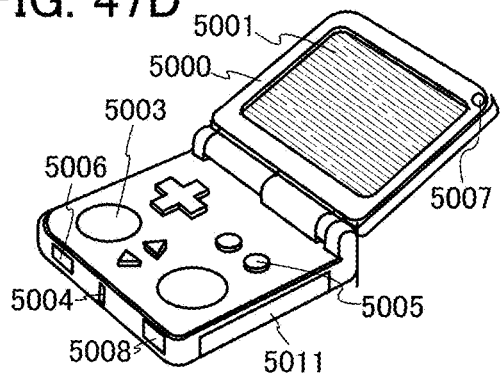
Figure 47E:
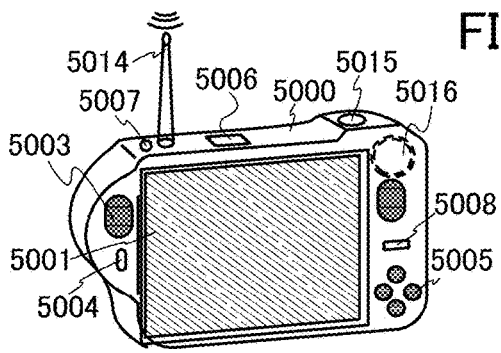
Figure 47F:
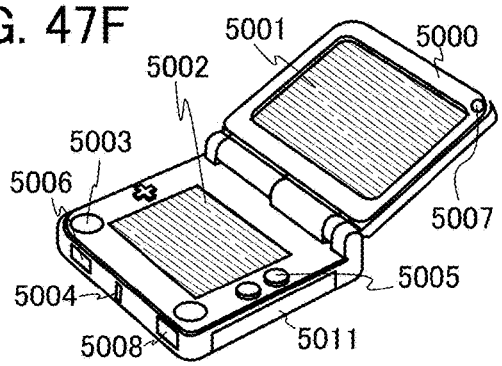
Figure 47G:
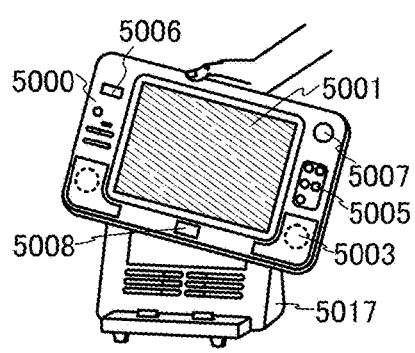
Figure 47H:
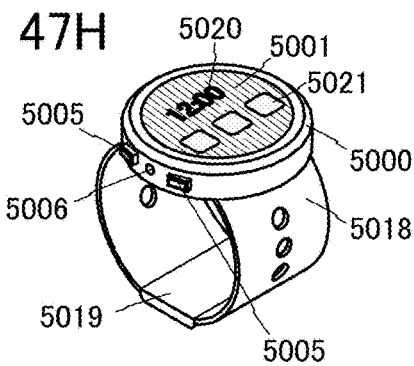

FIG. 47A illustrates a mobile computer which can include a switch 5009, an infrared port 5010, and the like in addition to the above components. FIG. 47B illustrates a portable image reproducing device (e.g., a DVD reproducing device) which is provided with a memory medium and can include a second display portion 5002, a memory medium reading portion 5011, and the like in addition to the above components. FIG. 47C illustrates a goggle-type display which can include the second display portion 5002, a supporting portion 5012, an earphone 5013, and the like in addition to the above components. FIG. 47D illustrates a portable game machine which can include the memory medium reading portion 5011 and the like in addition to the above components. FIG. 47E illustrates a digital camera which has a television reception function and can include an antenna 5014, a shutter button 5015, an image receiving portion 5016, and the like in addition to the above components. FIG. 47F illustrates a portable game machine which can include the second display portion 5002, the memory medium reading portion 5011, and the like in addition to the above components. FIG. 47G illustrates a portable television receiver which can include a charger 5017 capable of transmitting and receiving signals, and the like in addition to the above components. FIG. 47H illustrates a watch-type information terminal that includes a band 5018, a clasp 5019, and the like in addition to the above components. The display portion 5001 mounted in the housing 5000 doubling as a bezel includes a non-rectangular display region. The display portion 5001 can display an icon 5305 indicating time, another icon 5306, and the like.

The electronic devices illustrated in FIGS. 47A to 47H can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images where parallax is considered on a plurality of display portions, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 47A to 47H are not limited thereto, and the electronic devices can have a variety of functions.

The electronic devices of this embodiment each include a display portion for displaying some sort of data. The liquid crystal display device of one embodiment of the present invention can be used in the display portion.

The structures described in this embodiment can be combined as appropriate with any of the structures described in the other embodiments.

[Example]

In this example, results obtained by checking display of the liquid crystal display device of one embodiment of the present invention that was fabricated will be described. FIG. 21 corresponds to the cross-sectional structures of the pixels 70R and 70G in the liquid crystal display device, and FIG. 22 corresponds to the cross-sectional structure of the pixel 70B in the liquid crystal display device.

First, Table 1 shows the specifications of the liquid crystal display device fabricated in this example.

TABLE 1

| | |
|---|---|
| Display type | Reflective |
| Screen diagonal | 5.9 inch |
| Resolution | 1536 (H) × 2048 × RGB (V) |
| Pixel pitch | 58.5 μm (H) × 19.5 μm (V) |
| Pixel density | 434 ppi |
| Aperture ratio | 68.8% |
| Scan driver | Integrated |
| Liquid crystal mode | Twisted ECB mode |

The liquid crystal display device fabricated in this example is an active matrix reflective liquid crystal display device that is a color display, and a CAAC-IGZO was used in an FET on the back plane side. The reflectivity and the NTSC ratio of the fabricated liquid crystal display device were 25.1% and 37%, respectively.

Figure 48:
FIG. 48 shows display of a liquid crystal display device of an example.

FIG. 48 shows a display example of the liquid crystal display device. As shown in FIG. 48, the liquid crystal display device of one embodiment of the present invention can display an image with high contrast while maintaining the high aperture ratio.

The structure described in this example can be combined as appropriate with any of the structures described in the embodiments.

This application is based on Japanese Patent Application serial no. 2015-056766 filed with Japan Patent Office on Mar. 19, 2015 and Japanese Patent Application serial no. 2015-067084 filed with Japan Patent Office on Mar. 27, 2015, the entire contents of which are hereby incorporated by reference.

What is claimed is:

1. A semiconductor device comprising:
a first pixel electrode electrically connected to a first transistor;
a second pixel electrode;
the first transistor comprising:
a gate electrode;
a gate insulating film adjacent to the gate electrode; and
a first oxide semiconductor film which is adjacent to the gate insulating film and overlaps with the gate electrode;
a first insulating film over the first oxide semiconductor film;
a second oxide semiconductor film over the first insulating film;
a second insulating film over the second oxide semiconductor film; and
a third insulating film between the first pixel electrode and the second pixel electrode,
wherein a capacitor is formed between the first pixel electrode and the second oxide semiconductor film,
wherein the third insulating film overlaps with an end of the first pixel electrode, and
wherein the second pixel electrode is over the third insulating film.

2. The semiconductor device according to claim 1, wherein the first insulating film comprises oxygen, and wherein the second insulating film comprises hydrogen.

3. The semiconductor device according to claim 1, wherein the first pixel electrode is electrically connected to one of a source electrode and a drain electrode of the first transistor in an opening in the first insulating film and the second insulating film.

4. The semiconductor device according to claim 1, wherein resistivity of the second oxide semiconductor film is lower than resistivity of the first oxide semiconductor film.

5. The semiconductor device according to claim 1, wherein the second pixel electrode is electrically connected to a second transistor in a pixel adjacent to a pixel including the first transistor.

6. The semiconductor device according to claim 1, further comprising:
a first coloring film over the first pixel electrode; and
a second coloring film over the second pixel electrode.

7. The semiconductor device according to claim 1, wherein the semiconductor device is a liquid crystal display device.

8. A semiconductor device comprising:
a first pixel electrode electrically connected to a first transistor;
a second pixel electrode;
a conductive film which is electrically connected to and overlaps with the first pixel electrode;
the first transistor comprising:
a gate electrode;
a gate insulating film adjacent to the gate electrode; and
a first oxide semiconductor film which is adjacent to the gate insulating film and overlaps with the gate electrode;
a first insulating film over the first oxide semiconductor film;
a second oxide semiconductor film over the first insulating film;
a second insulating film over the second oxide semiconductor film; and
a third insulating film between the first pixel electrode and the second pixel electrode,
wherein a capacitor is formed between the first pixel electrode and the second oxide semiconductor film,
wherein the third insulating film overlaps with an end of the first pixel electrode, and
wherein the conductive film is over the third insulating film.

9. The semiconductor device according to claim 8, wherein the first insulating film comprises oxygen, and wherein the second insulating film comprises hydrogen.

10. The semiconductor device according to claim 8, wherein the first pixel electrode is electrically connected to one of a source electrode and a drain electrode of the first transistor in an opening in the first insulating film and the second insulating film.

11. The semiconductor device according to claim 8, wherein resistivity of the second oxide semiconductor film is lower than resistivity of the first oxide semiconductor film.

12. The semiconductor device according to claim 8, wherein the second pixel electrode is electrically connected to a second transistor in a pixel adjacent to a pixel including the first transistor.

13. The semiconductor device according to claim 8, further comprising:
a first coloring film over the first pixel electrode; and
a second coloring film over the second pixel electrode.

14. The semiconductor device according to claim 8, wherein the semiconductor device is a liquid crystal display device.

15. A semiconductor device comprising:
a first pixel electrode electrically connected to a first transistor;
a second pixel electrode;
the first transistor comprising:
a gate electrode;
a gate insulating film adjacent to the gate electrode; and
a first oxide semiconductor film which is adjacent to the gate insulating film and overlaps with the gate electrode;
a first insulating film over the first oxide semiconductor film;
a second oxide semiconductor film over the first insulating film;
a second insulating film over the second oxide semiconductor film; and
a third insulating film between the first pixel electrode and the second pixel electrode,
wherein a capacitor is formed between the first pixel electrode and a first part of the second oxide semiconductor film,
wherein a second part of the second oxide semiconductor film is a back gate electrode of the first transistor,
wherein the third insulating film overlaps with an end of the first pixel electrode, and
wherein the second pixel electrode is over the third insulating film.

16. The semiconductor device according to claim 15, wherein the first insulating film comprises oxygen, and wherein the second insulating film comprises hydrogen.

17. The semiconductor device according to claim 15, wherein the first pixel electrode is electrically connected to one of a source electrode and a drain electrode of the first transistor in an opening in the first insulating film and the second insulating film.

18. The semiconductor device according to claim 15, wherein resistivity of the second oxide semiconductor film is lower than resistivity of the first oxide semiconductor film.

19. The semiconductor device according to claim 15, wherein the second pixel electrode is electrically connected to a second transistor in a pixel adjacent to a pixel including the first transistor.

20. The semiconductor device according to claim 15, further comprising:
a first coloring film over the first pixel electrode; and
a second coloring film over the second pixel electrode.

21. The semiconductor device according to claim 15, wherein the semiconductor device is a liquid crystal display device.

* * * * *